United States Patent
Huang

(10) Patent No.: US 11,195,943 B2
(45) Date of Patent: Dec. 7, 2021

(54) EPITAXIAL STRUCTURE OF GA-FACE GROUP III NITRIDE, ACTIVE DEVICE, AND GATE PROTECTION DEVICE THEREOF

(71) Applicant: Chih-Shu Huang, Taipei (TW)

(72) Inventor: Chih-Shu Huang, Taipei (TW)

( * ) Notice: Subject to any disclaimer, the term of this patent is extended or adjusted under 35 U.S.C. 154(b) by 0 days.

(21) Appl. No.: 17/017,119

(22) Filed: Sep. 10, 2020

(65) Prior Publication Data

US 2021/0083083 A1 Mar. 18, 2021

(30) Foreign Application Priority Data

Sep. 12, 2019 (TW) .................................. 108132995

(51) Int. Cl.
*H01L 29/778* (2006.01)
*H01L 27/085* (2006.01)
(Continued)

(52) U.S. Cl.
CPC ...... *H01L 29/7781* (2013.01); *H01L 27/0883* (2013.01); *H01L 29/66462* (2013.01); *H01L 29/7838* (2013.01)

(58) Field of Classification Search
CPC ........... H01L 27/0883; H01L 29/66431; H01L 29/66462; H01L 29/778–7789
See application file for complete search history.

(56) References Cited

U.S. PATENT DOCUMENTS

2008/0230784 A1* 9/2008 Murphy ............... H03K 17/567
257/76
2012/0313106 A1* 12/2012 He ....................... H01L 29/1066
257/76
(Continued)

FOREIGN PATENT DOCUMENTS

TW         I572034 B     2/2017
TW       201743450 A    12/2017

OTHER PUBLICATIONS

A. M. H. Kwan, et al.; "A Gate Overdrive Protection Technique for Improved Reliability in AlGaN/GaN Enhancement-Mode HEMTs"; IEEE Electron Device Letters, vol. 34, No. 1, Jan. 2013, pp. 30-32.

*Primary Examiner* — Eric A. Ward
(74) *Attorney, Agent, or Firm* — Rosenberg, Klein & Lee

(57) ABSTRACT

The present invention relates to an epitaxial structure of Ga-face group III nitride, its active device, and its gate protection device. The epitaxial structure of Ga-face AlGaN/GaN comprises a silicon substrate, a buffer layer (C-doped) on the silicon substrate, an i-GaN (C-doped) layer on the buffer layer (C-doped), an i-$Al_yGaN$ buffer layer on the i-GaN (C-doped) layer, an i-GaN channel layer on the i-$Al_yGaN$ buffer layer, and an i-$Al_xGaN$ layer on the i-GaN channel layer, where x=0.1~0.3 and y=0.05~0.75. By connecting a depletion-mode (D-mode) AlGaN/GaN high electron mobility transistor (HEMT) to the gate of a p-GaN gate enhancement-mode (E-mode) AlGaN/GaN HEMT in device design, the gate of the p-GaN gate E-mode AlGaN/GaN HEMT can be protected under any gate voltage.

18 Claims, 93 Drawing Sheets

(51) Int. Cl.
  *H01L 29/66* (2006.01)
  *H01L 29/78* (2006.01)
  *H01L 27/088* (2006.01)

(56) References Cited

U.S. PATENT DOCUMENTS

2014/0015591 A1    1/2014   Chen et al.
2017/0025844 A1    1/2017   Creech
2017/0358495 A1*  12/2017   Jiang .................... H01L 27/085

\* cited by examiner

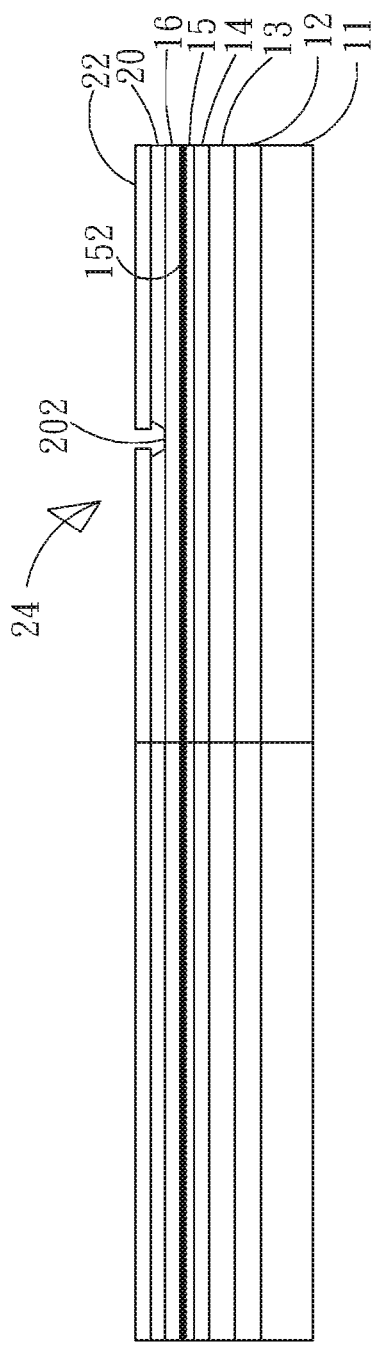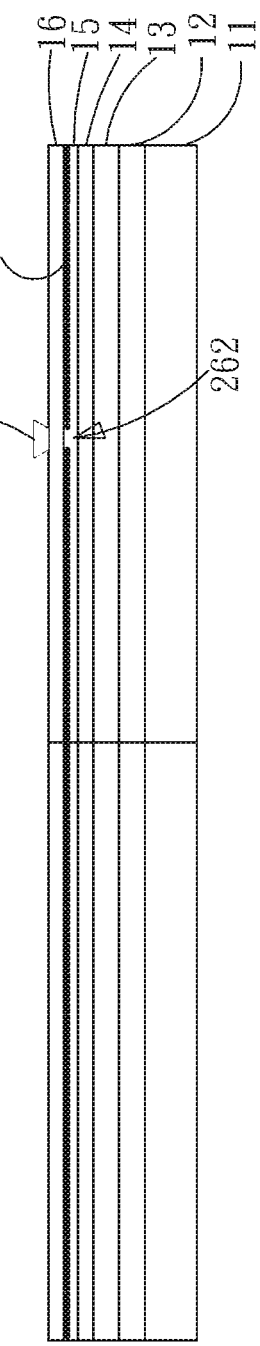
Fig. 7A-1         Fig. 7A-2

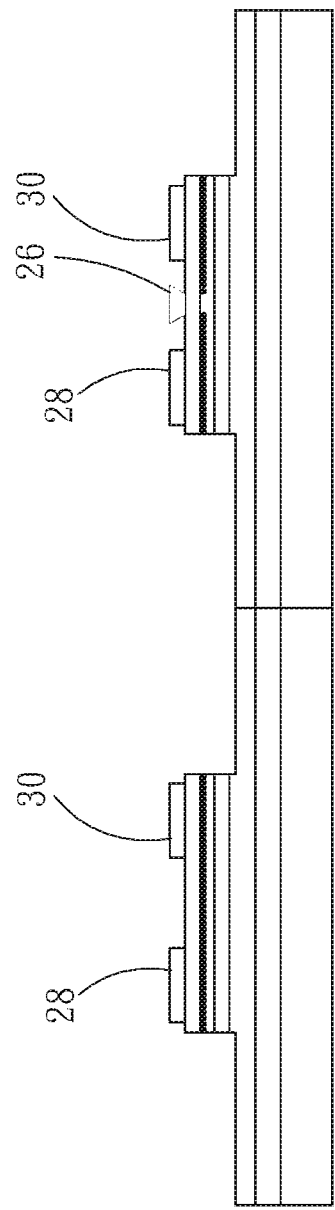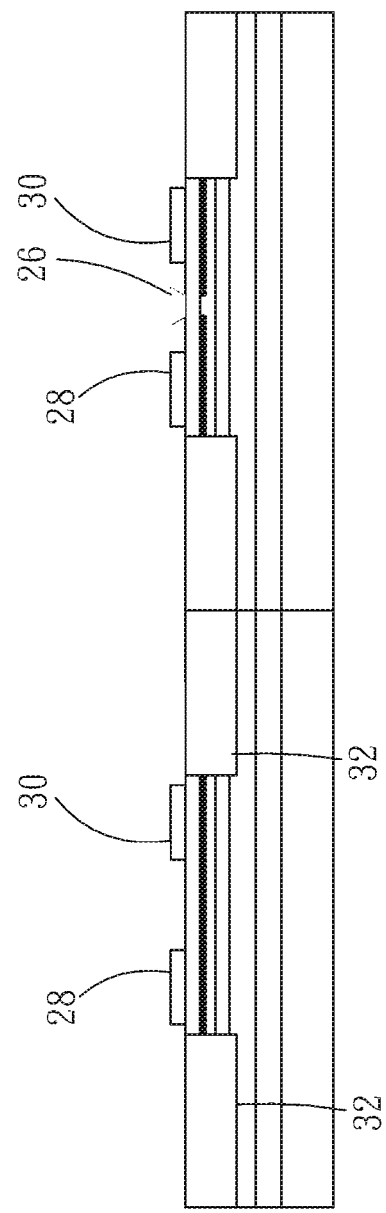

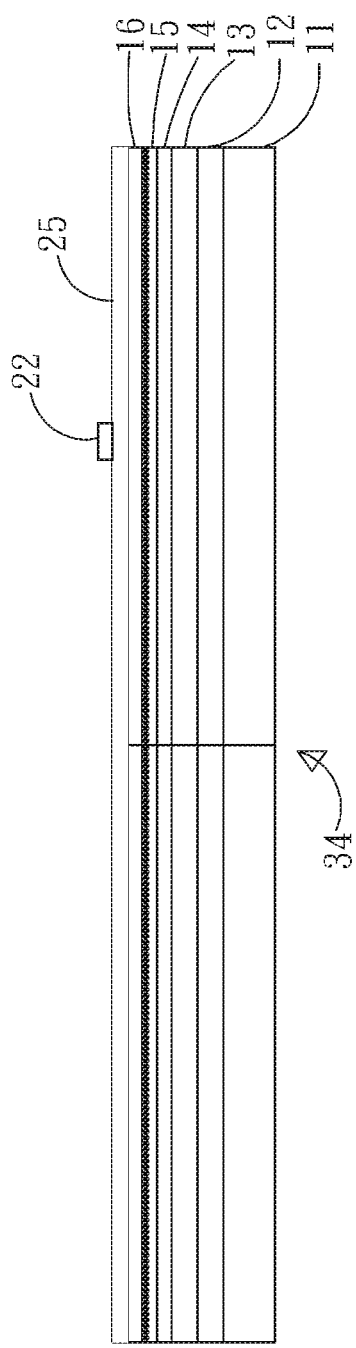
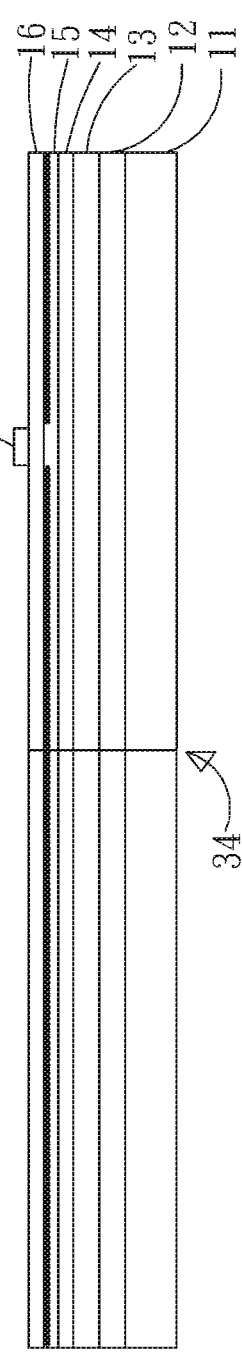
Fig. 9A-1
Fig. 9A-2

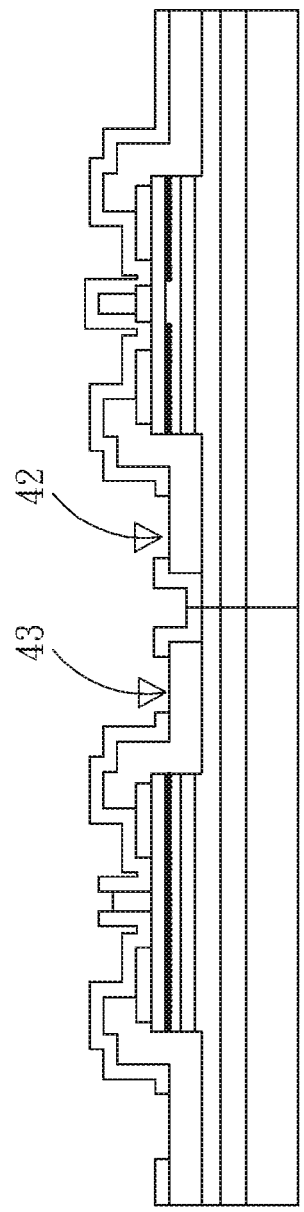
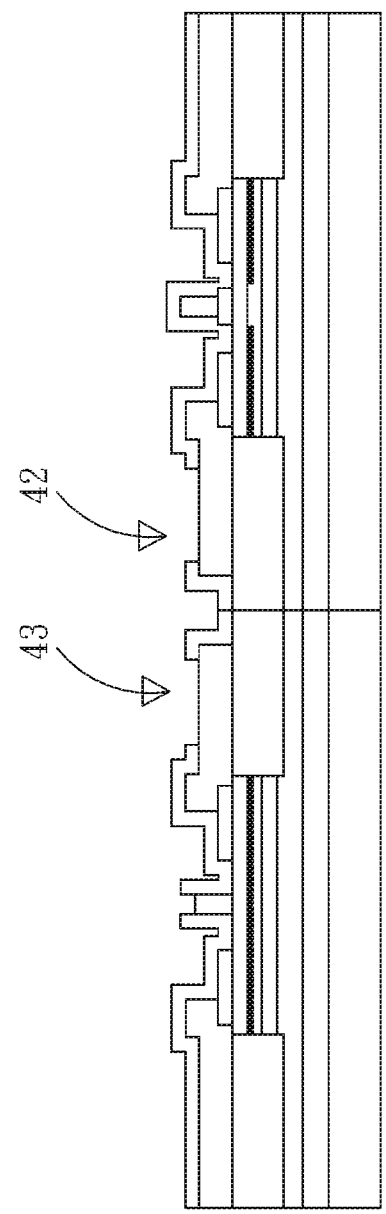
Fig. 9E-1
Fig. 9E-2

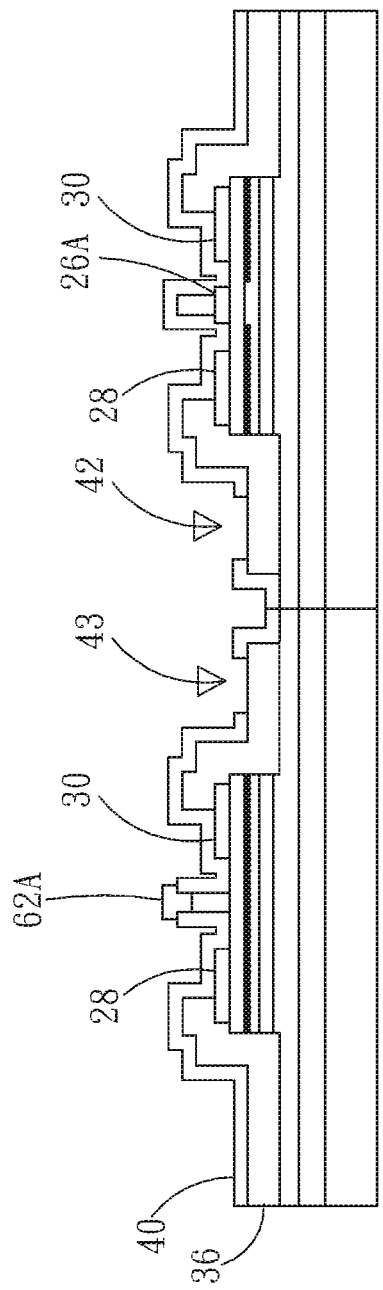
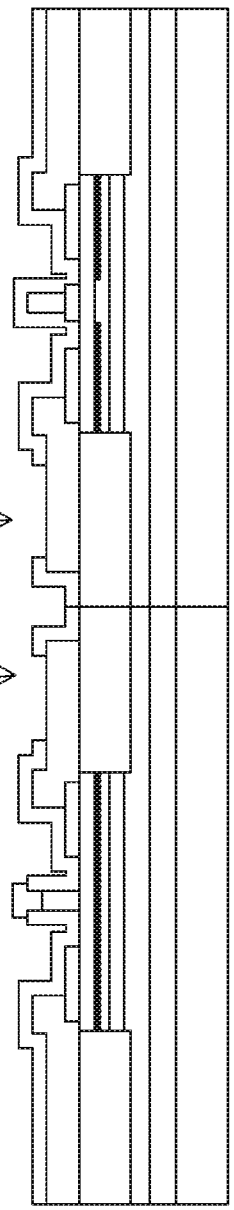
Fig. 9F-1
Fig. 9F-2

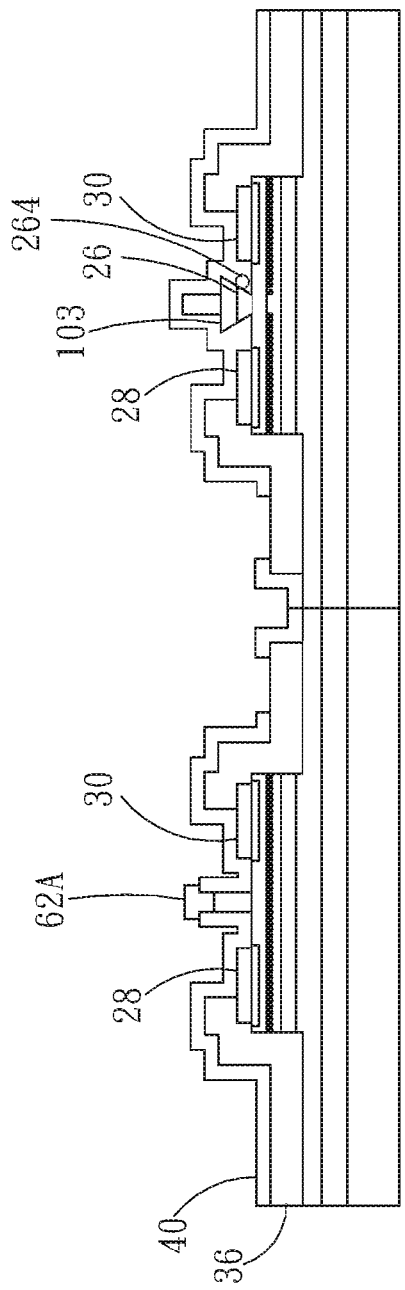
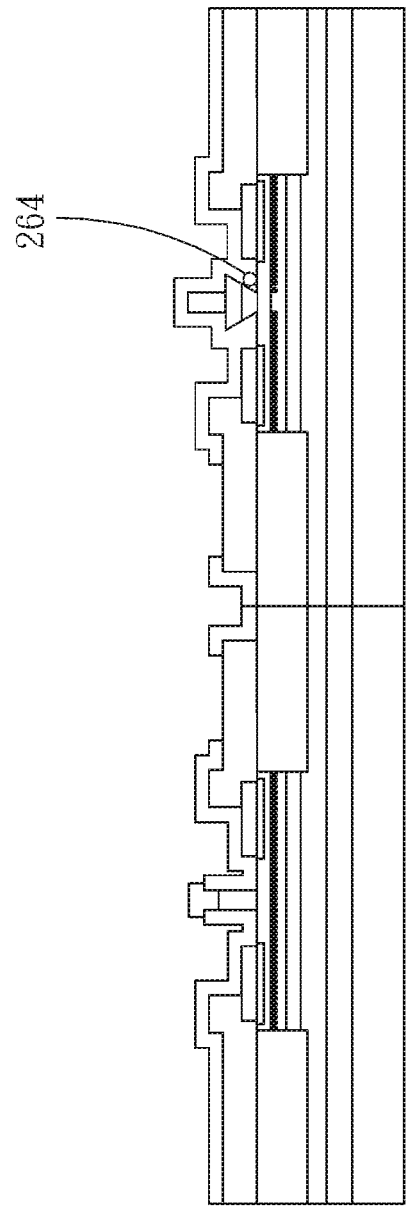
Fig. 11G-1
Fig. 11G-2

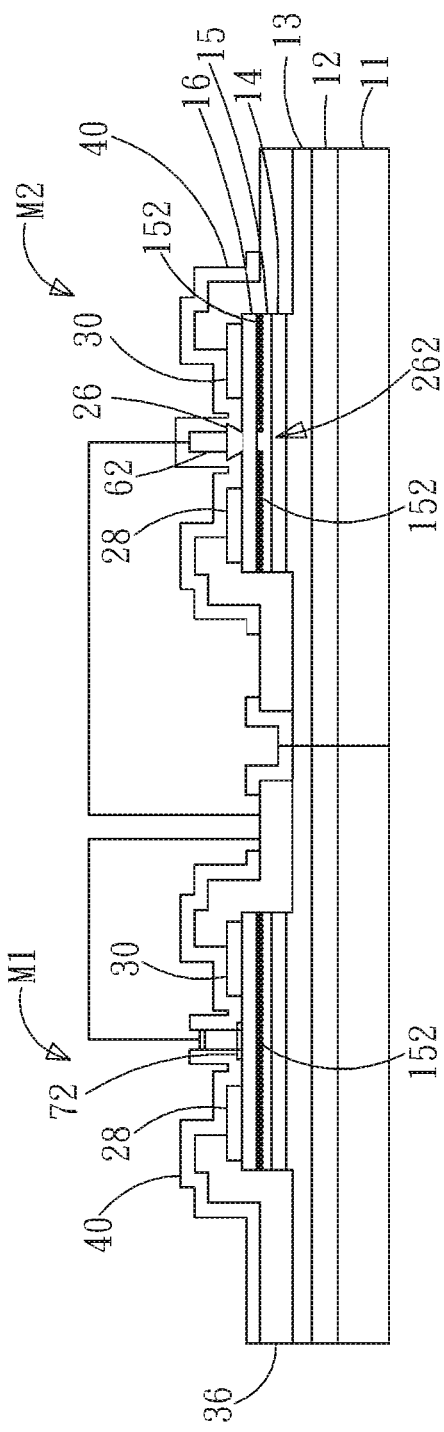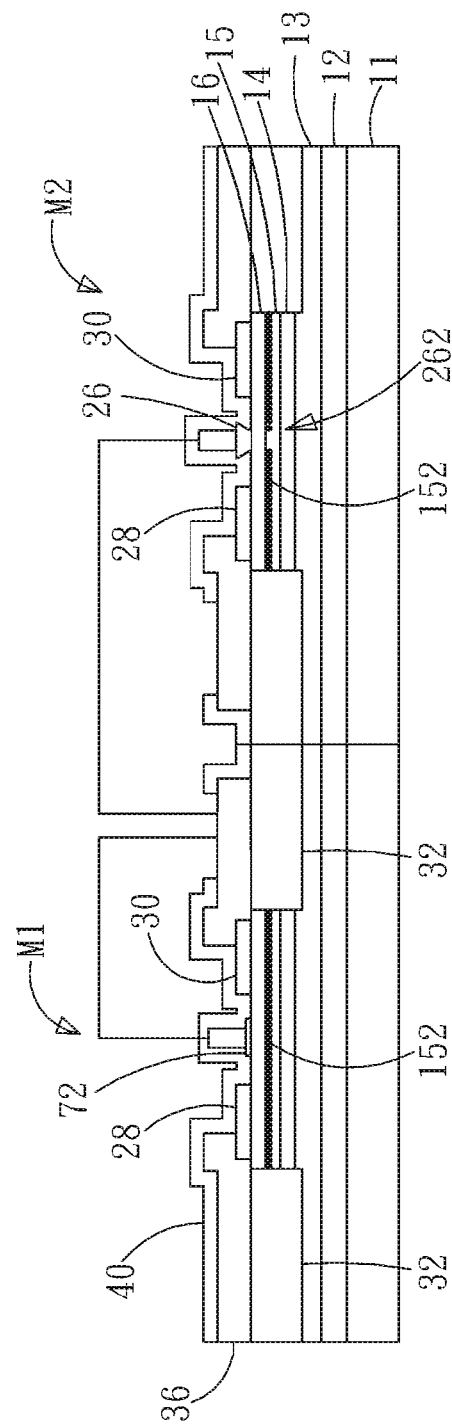

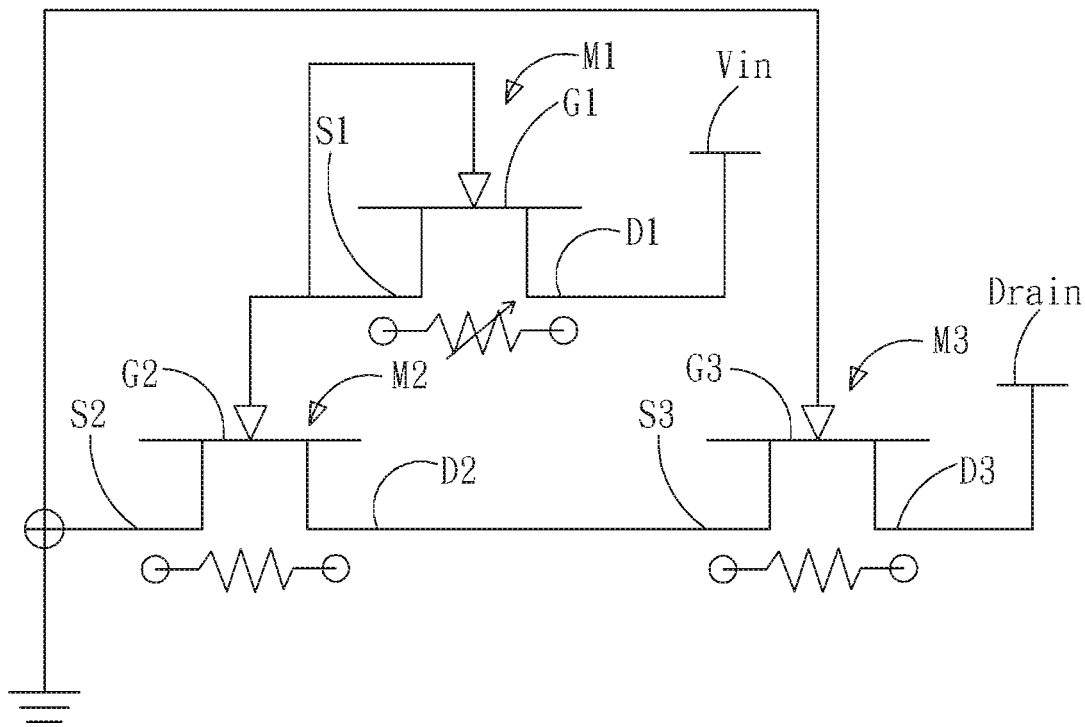
Fig. 18-A
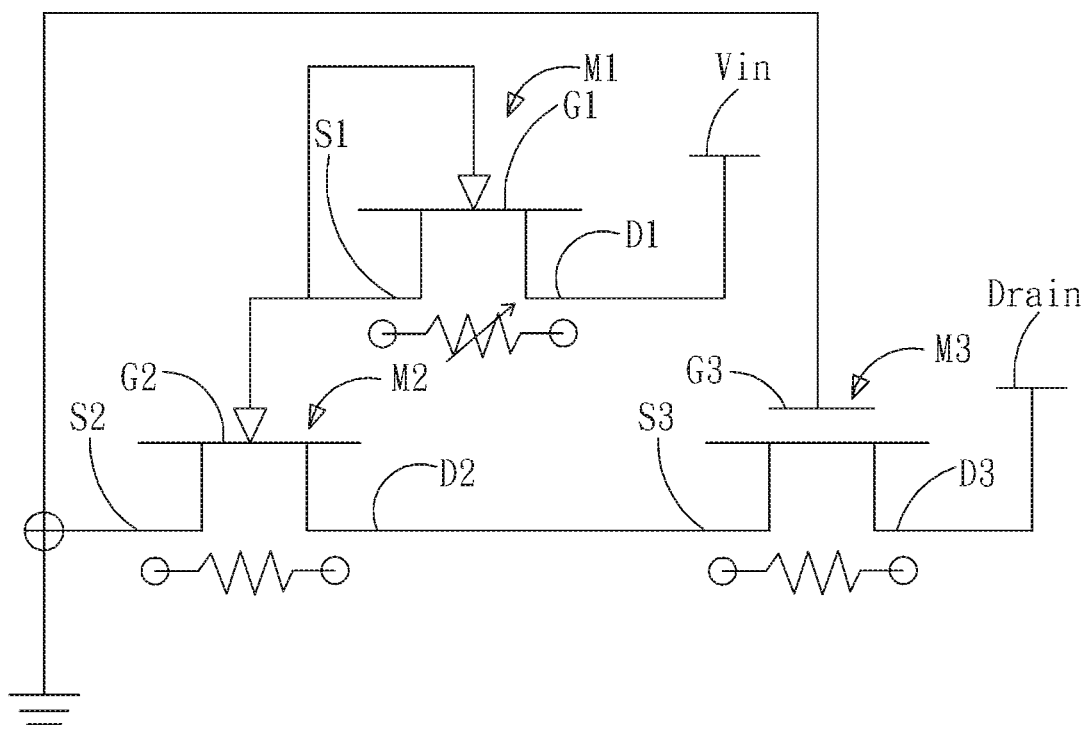
Fig. 18-B

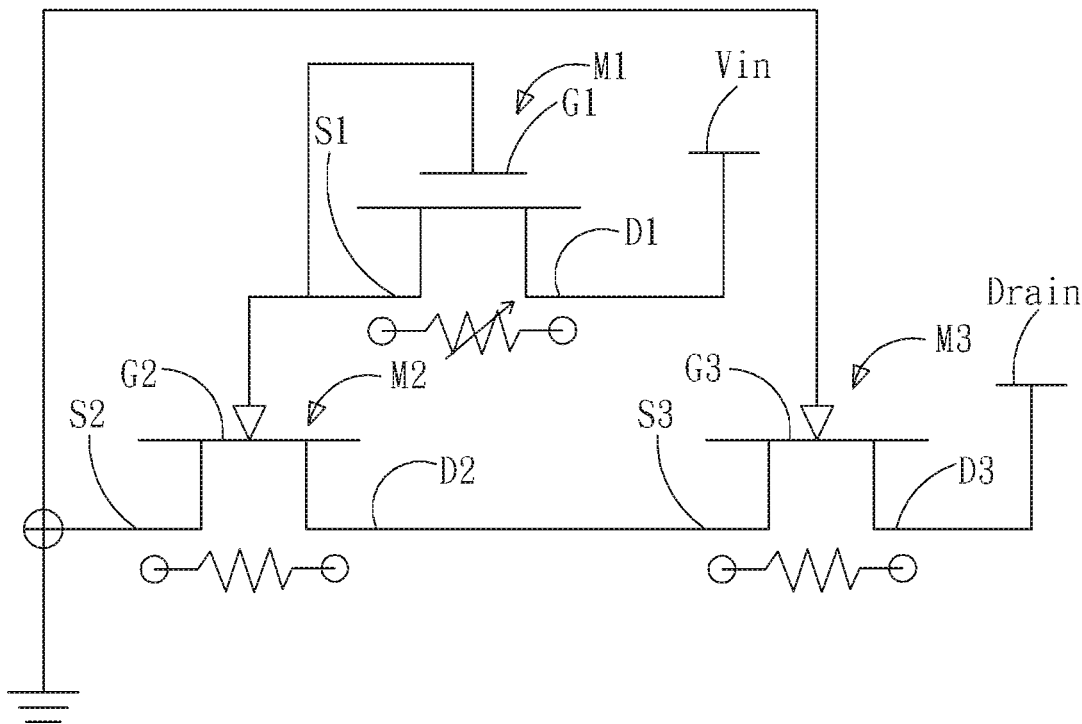
Fig. 18-C
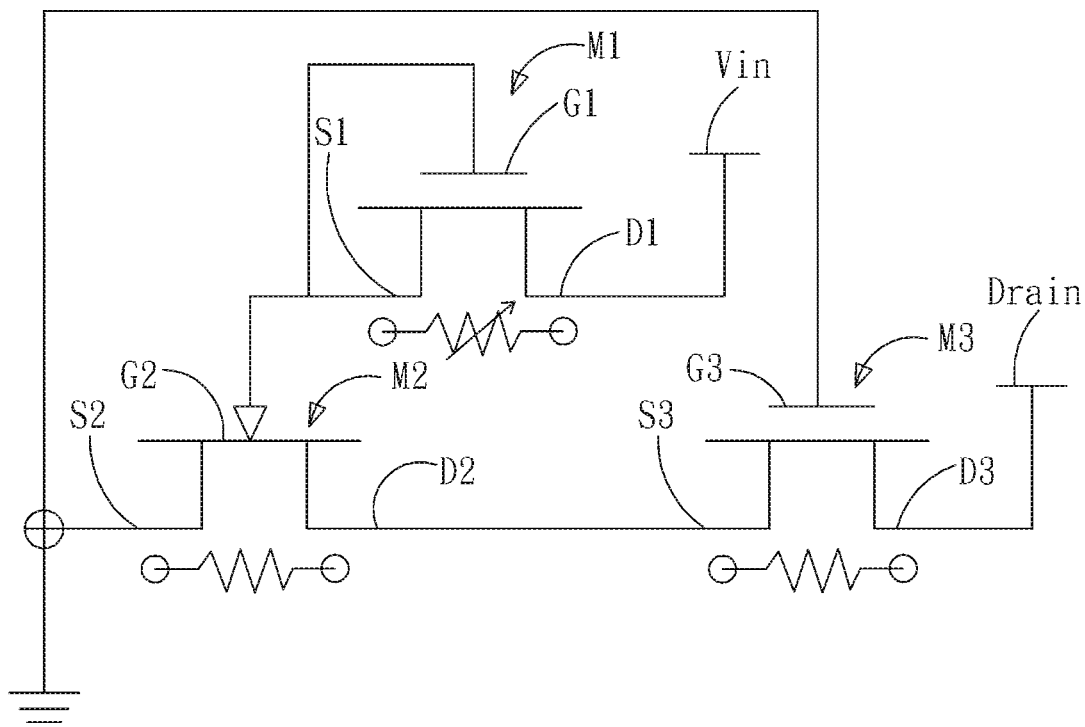
Fig. 18-D

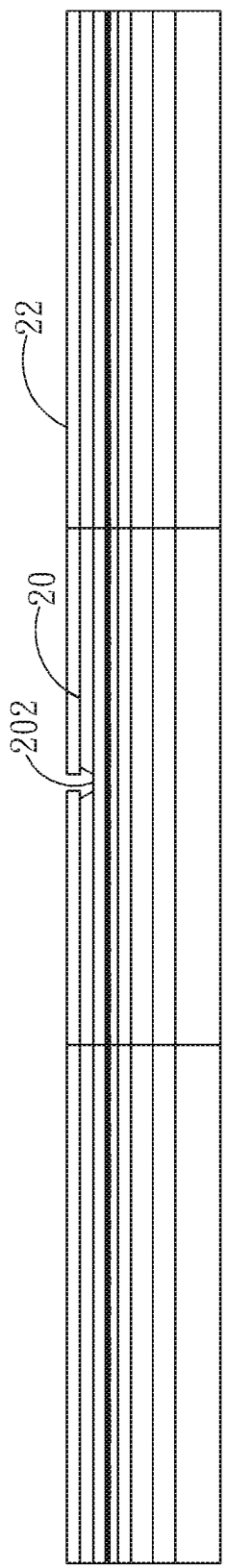
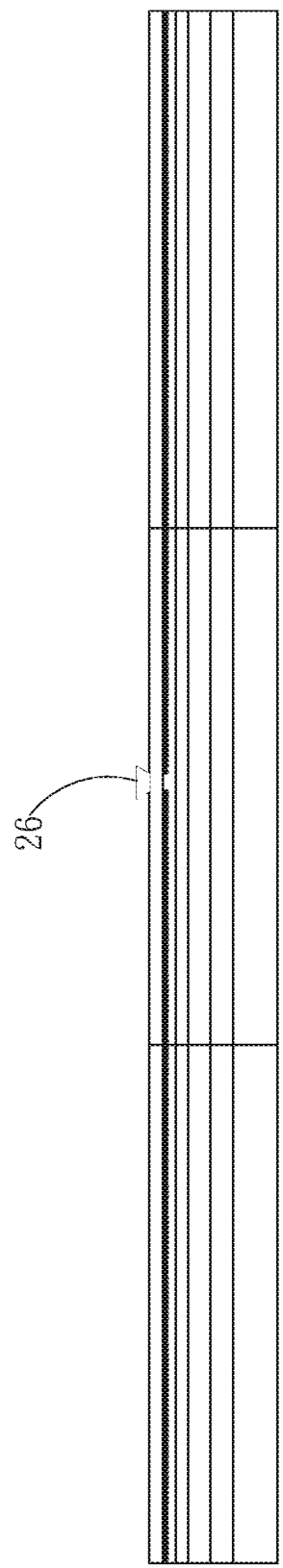
Fig. 20A-1
Fig. 20A-2

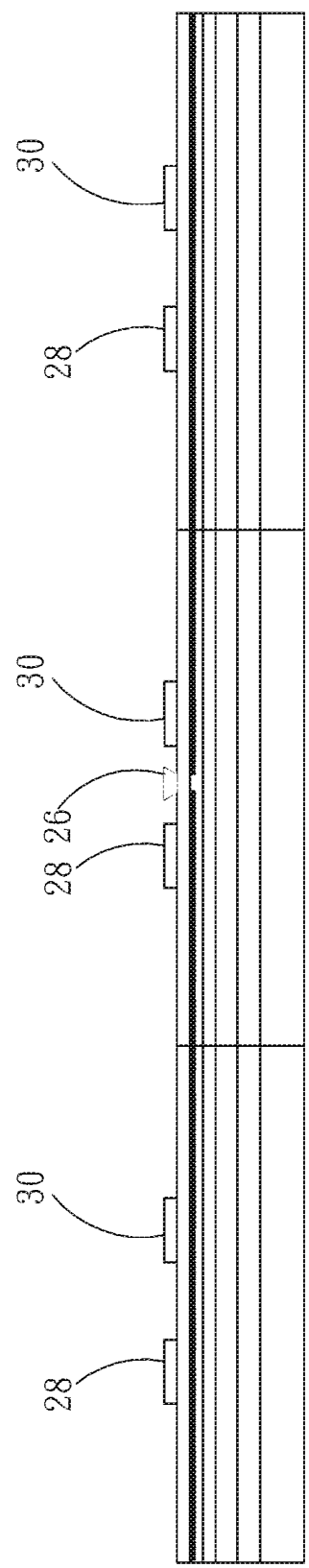

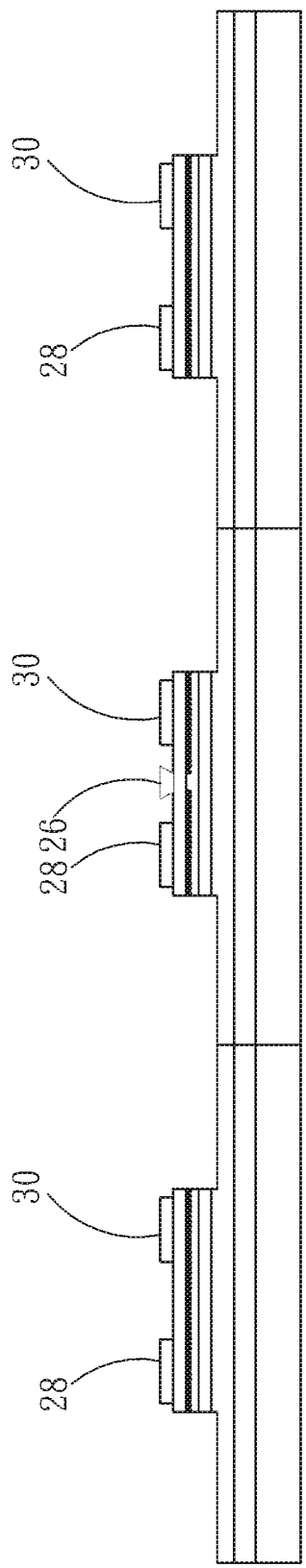
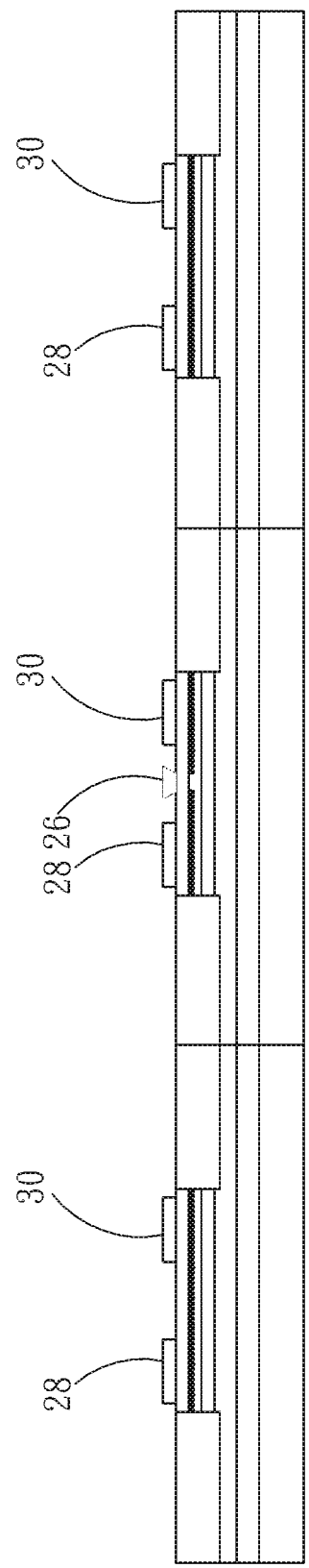
Fig. 20C-1
Fig. 20C-2

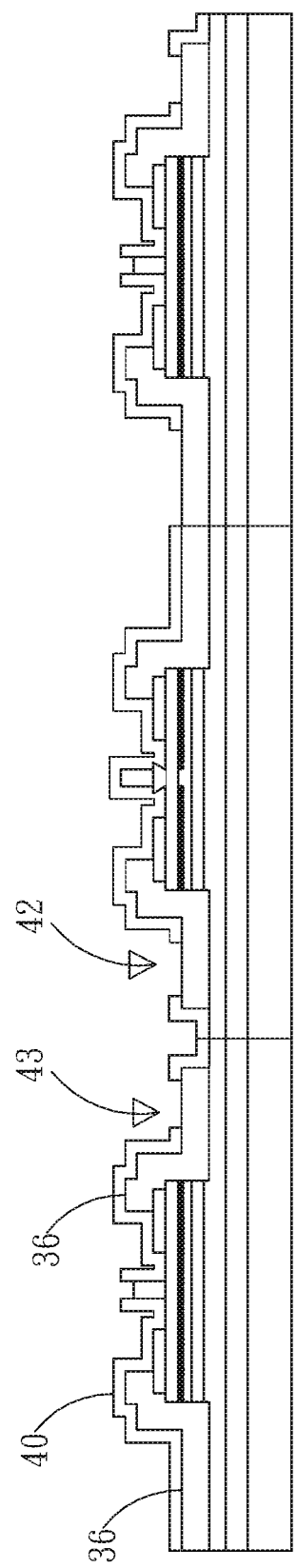
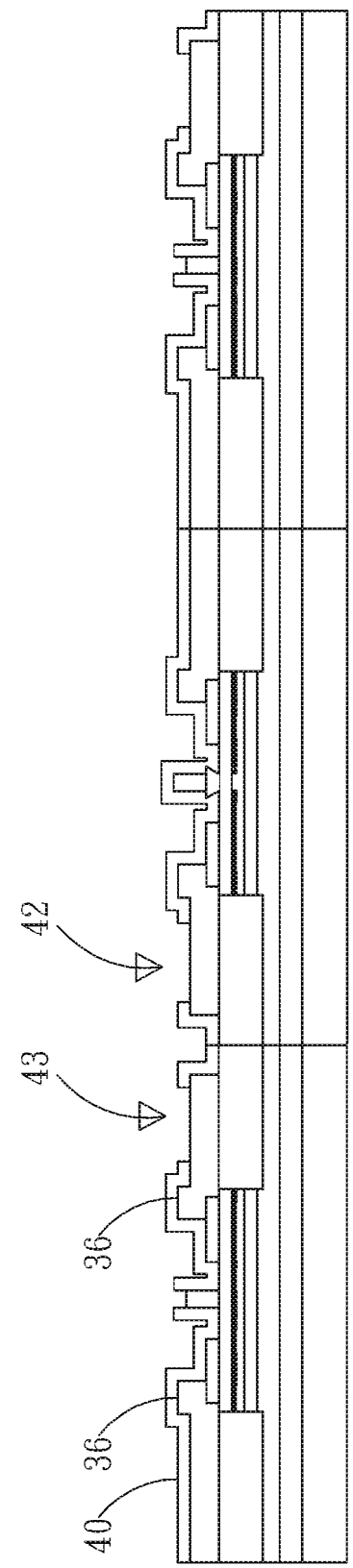
Fig. 20E-1
Fig. 20E-2

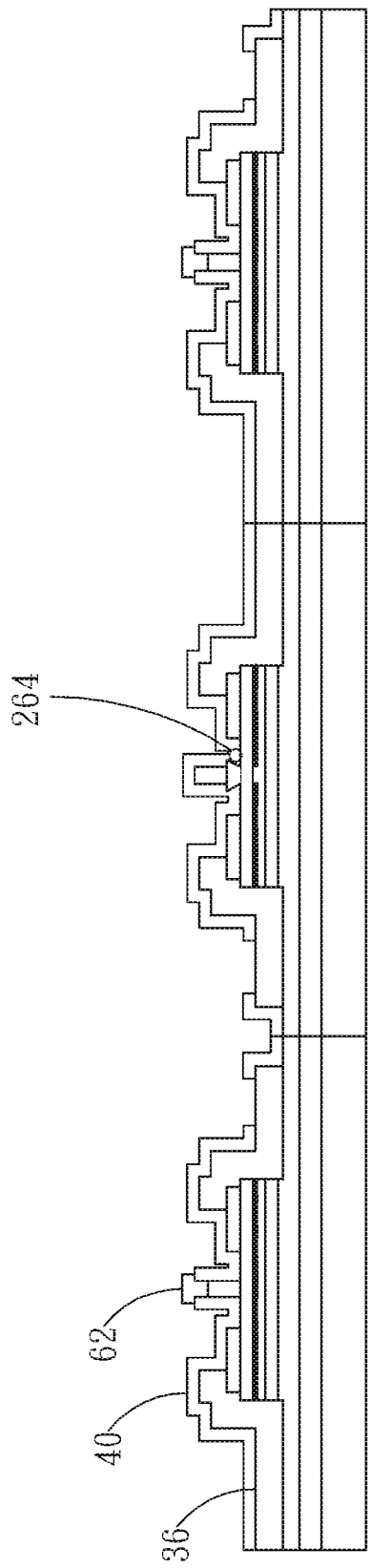
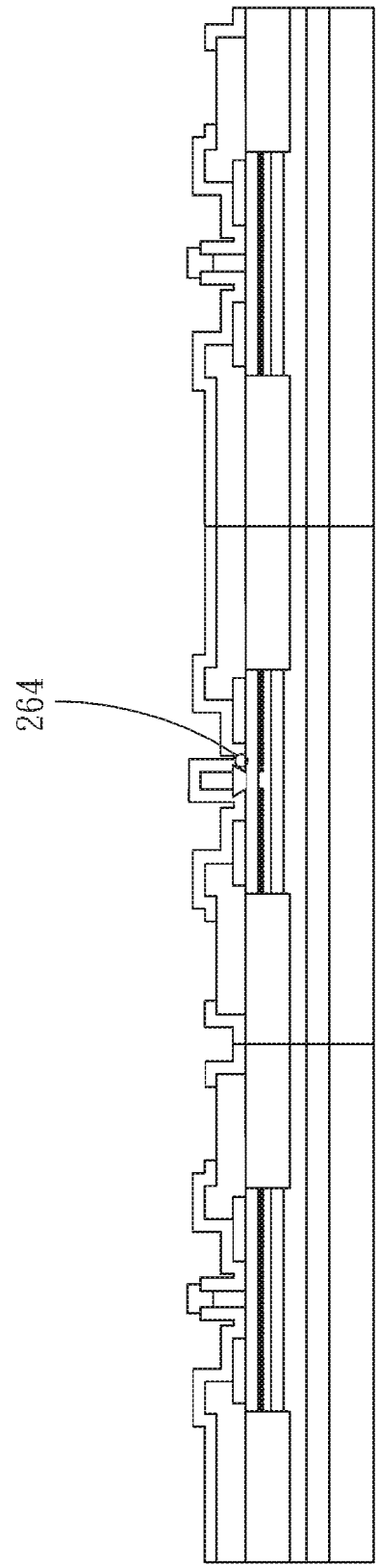
Fig. 20F-1
Fig. 20F-2

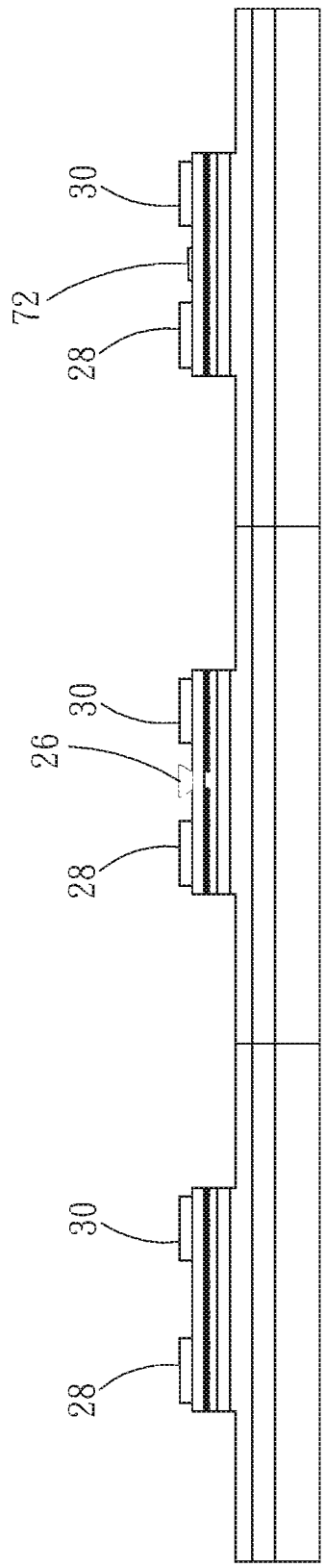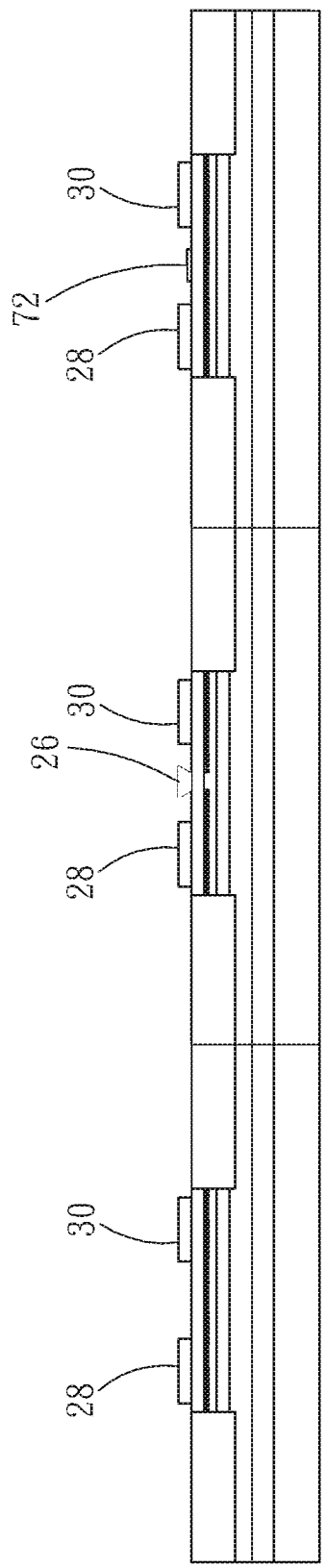
Fig. 22A-1
Fig. 22A-2

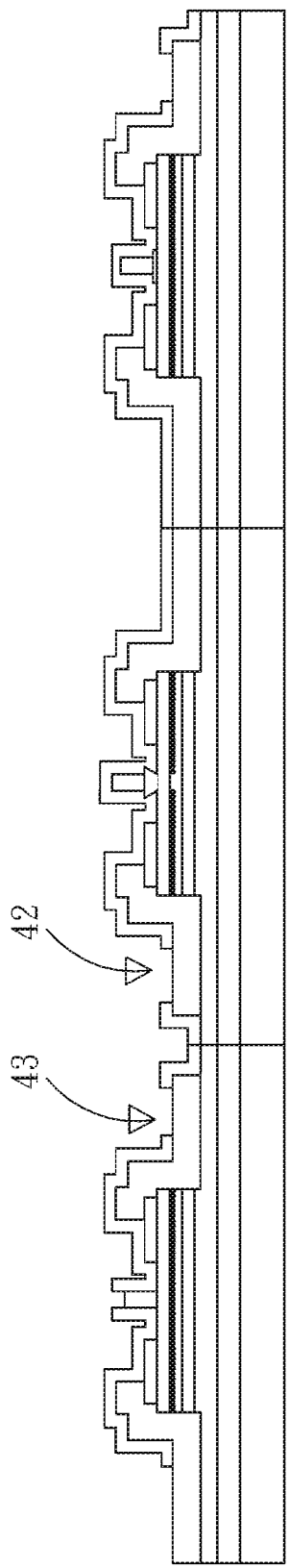
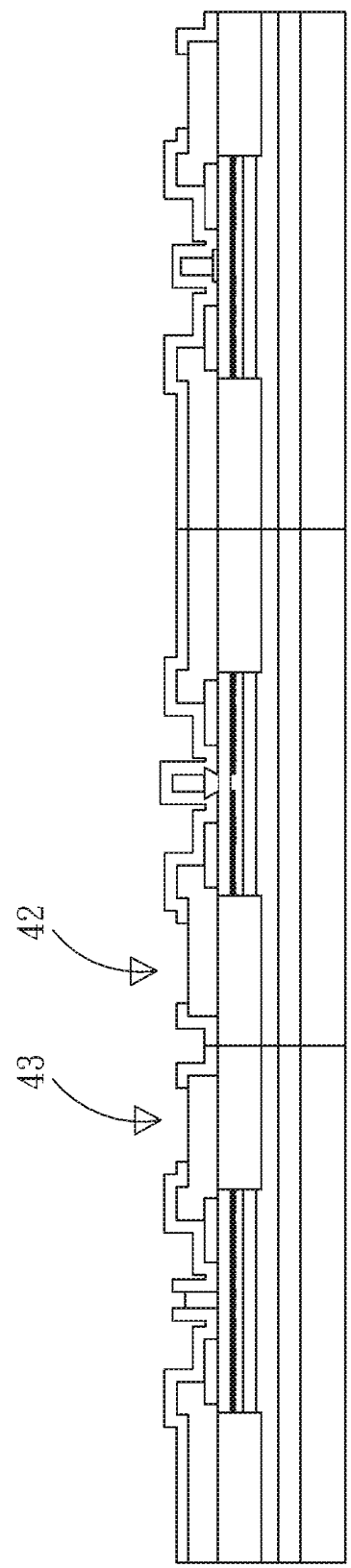
Fig. 22C-1
Fig. 22C-2

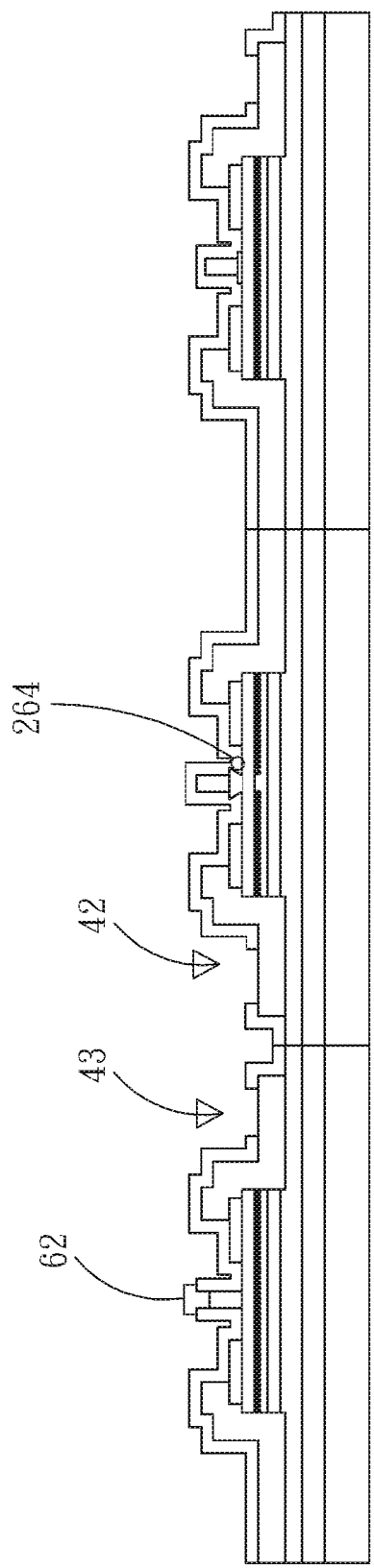
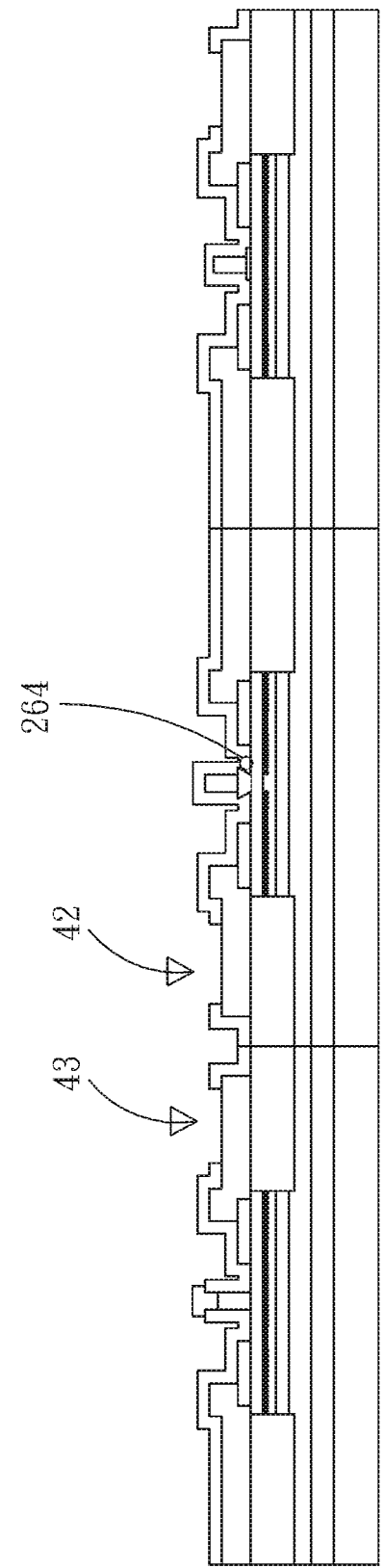

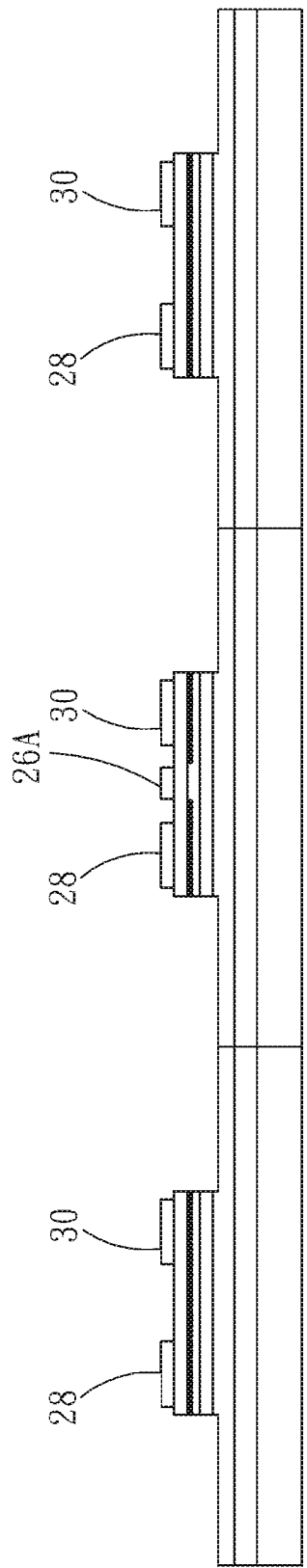
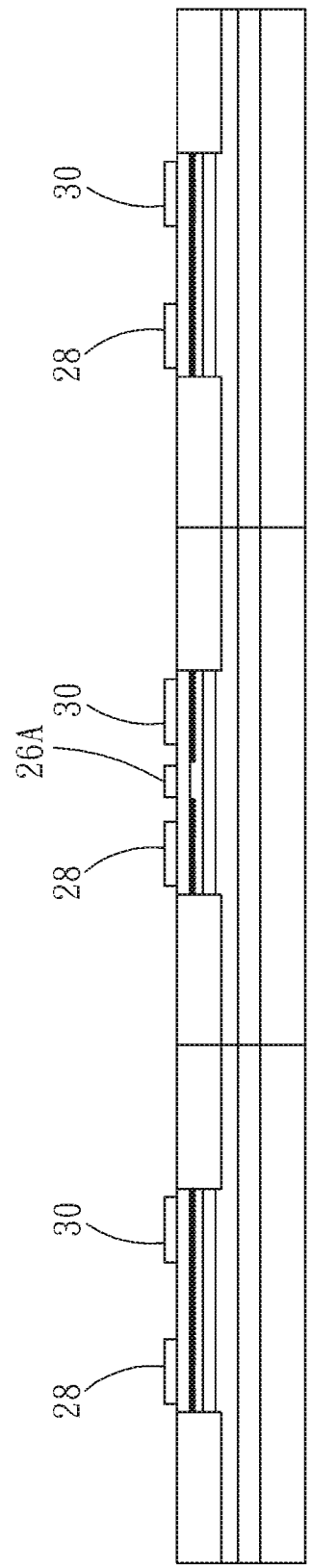
Fig. 24C-1
Fig. 24C-2

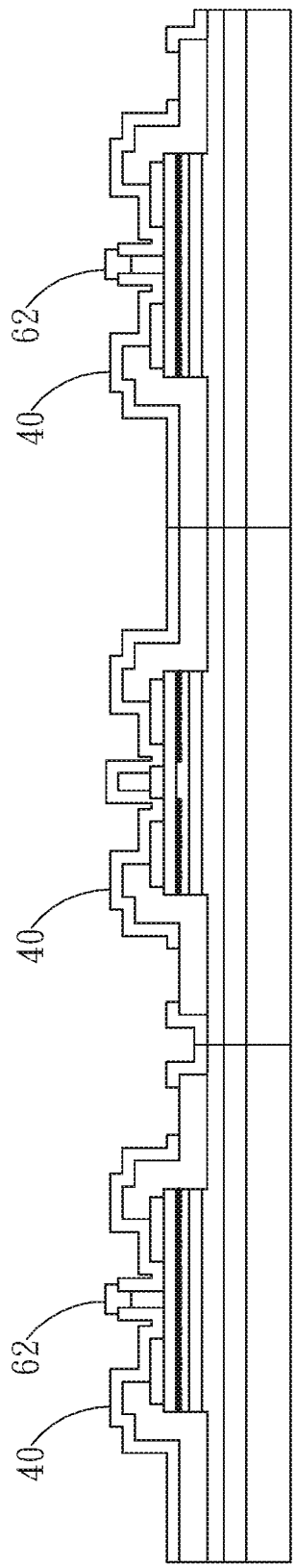
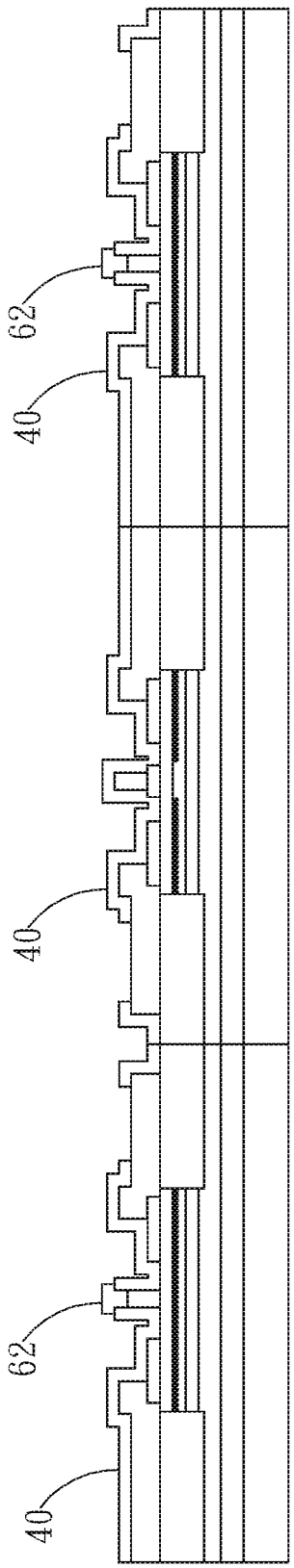
Fig. 24F-1
Fig. 24F-2

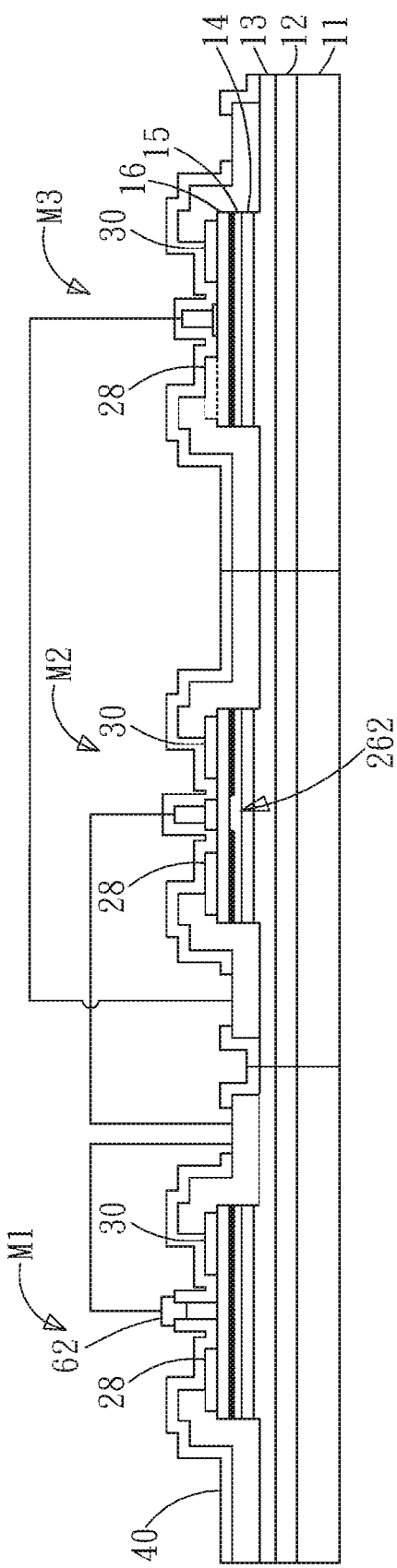
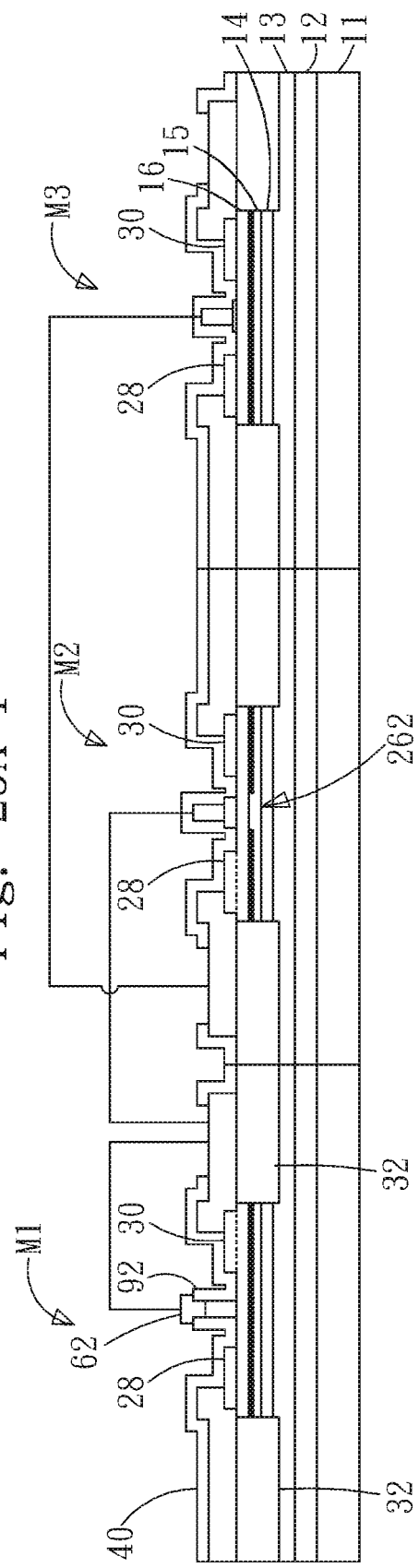
Fig. 25A-1
Fig. 25A-2

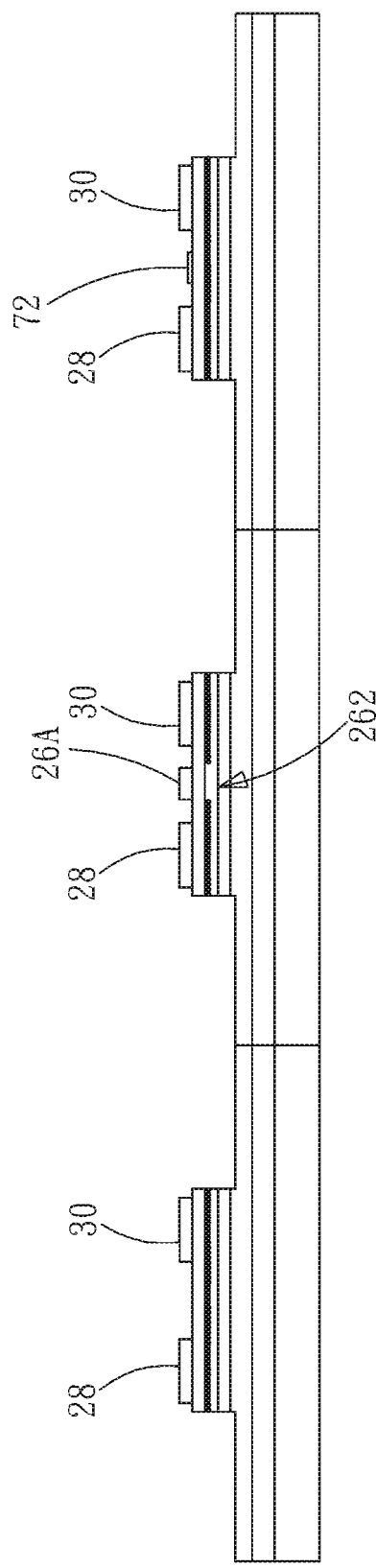
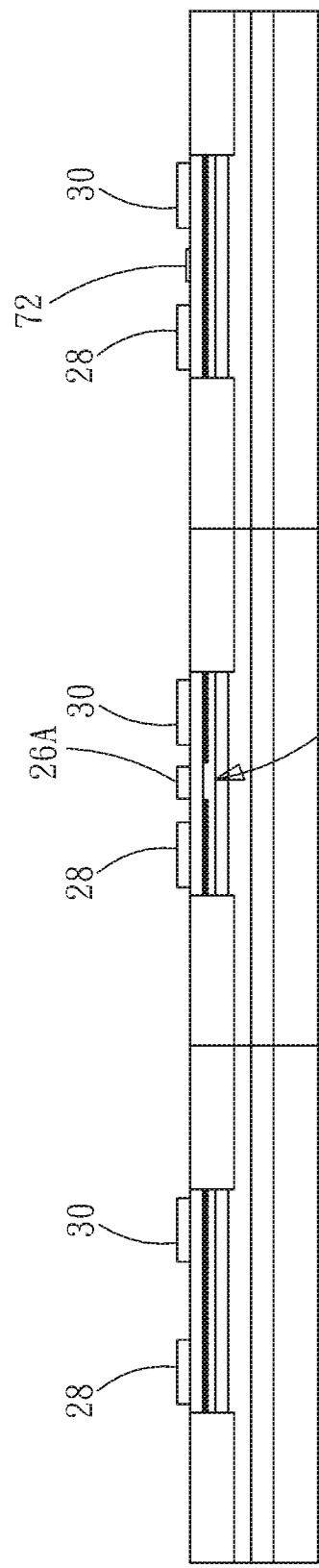

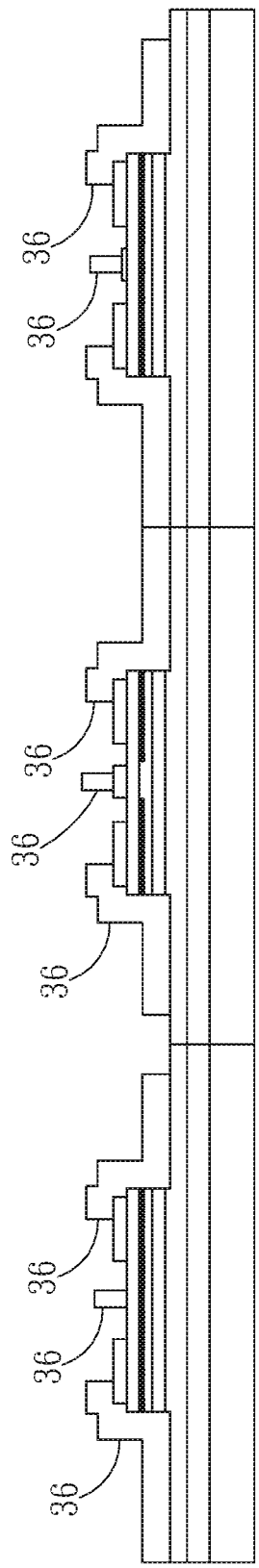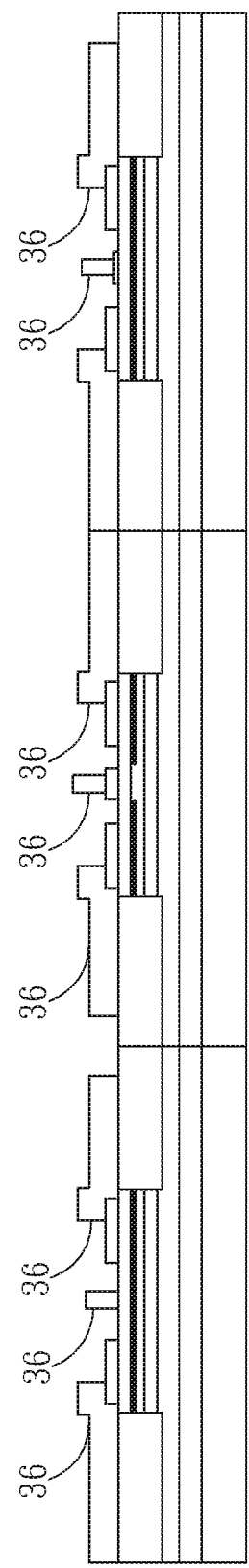

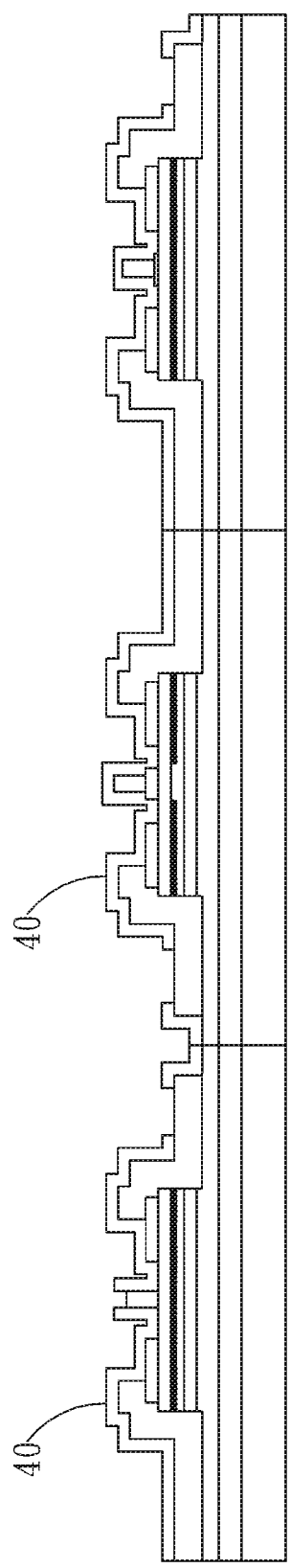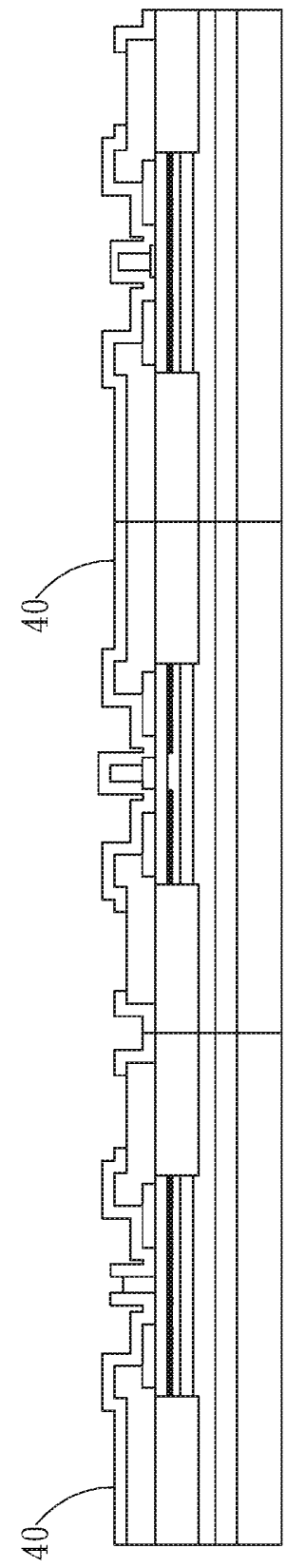

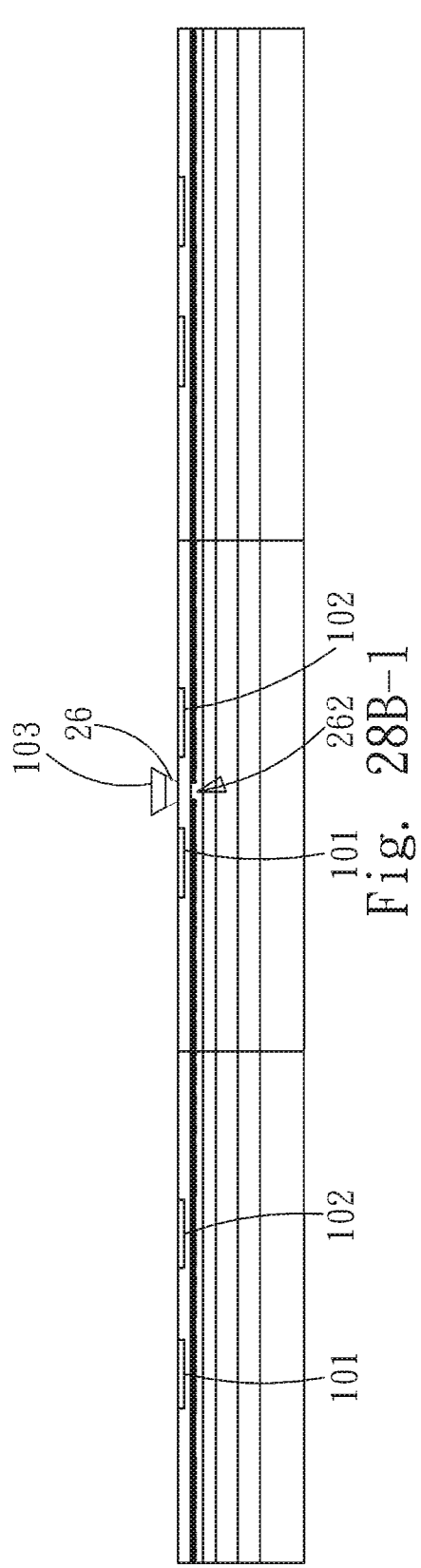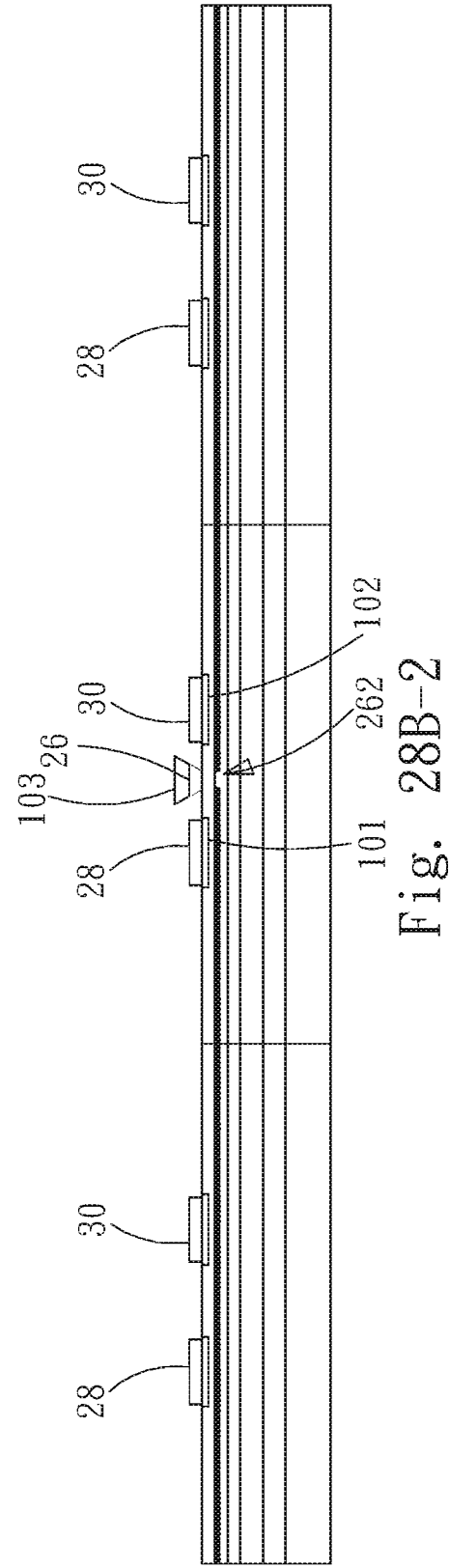

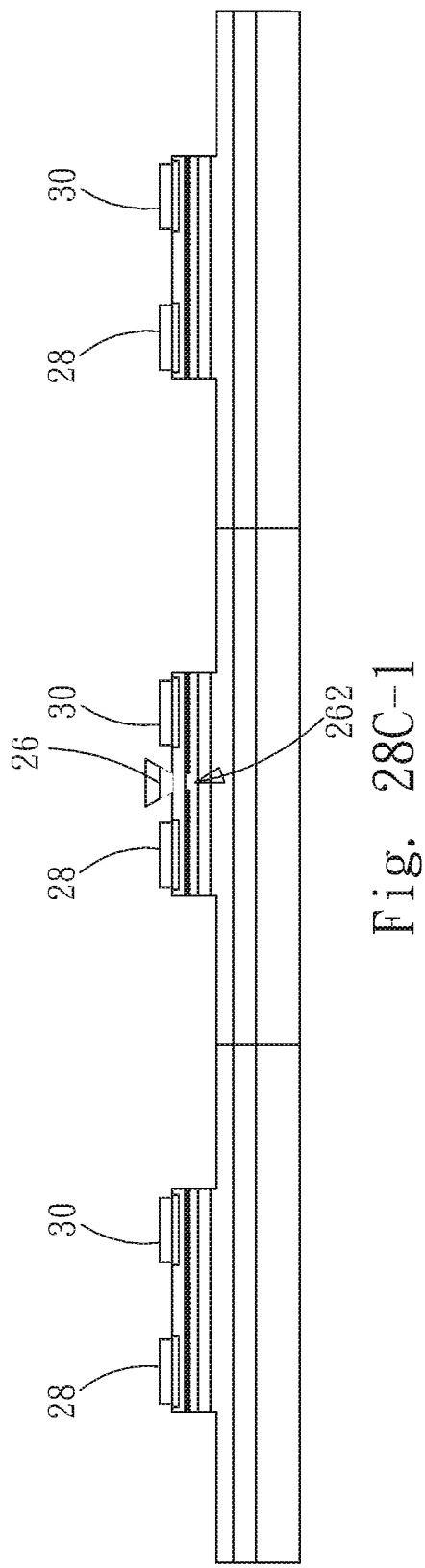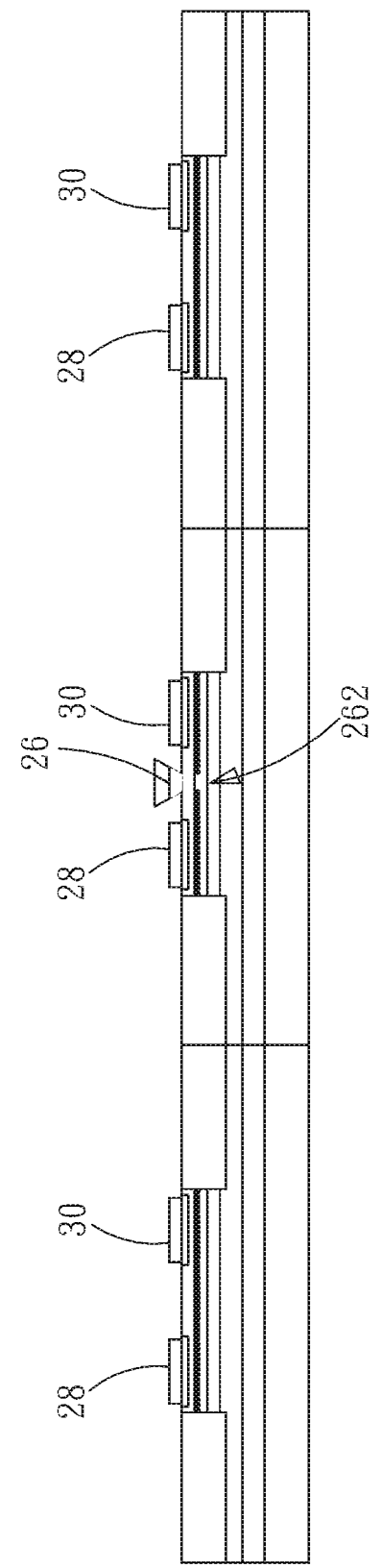
Fig. 28C-1    Fig. 28C-2

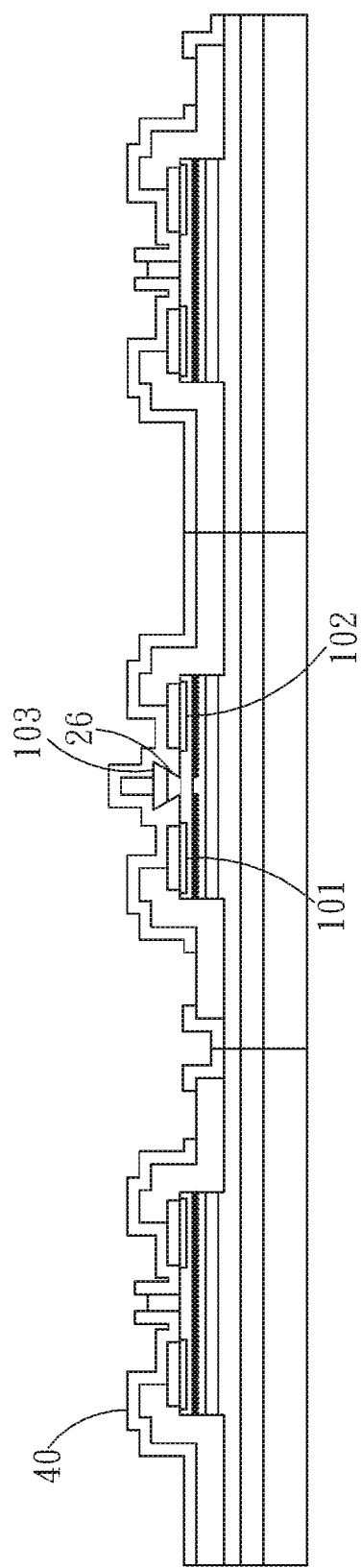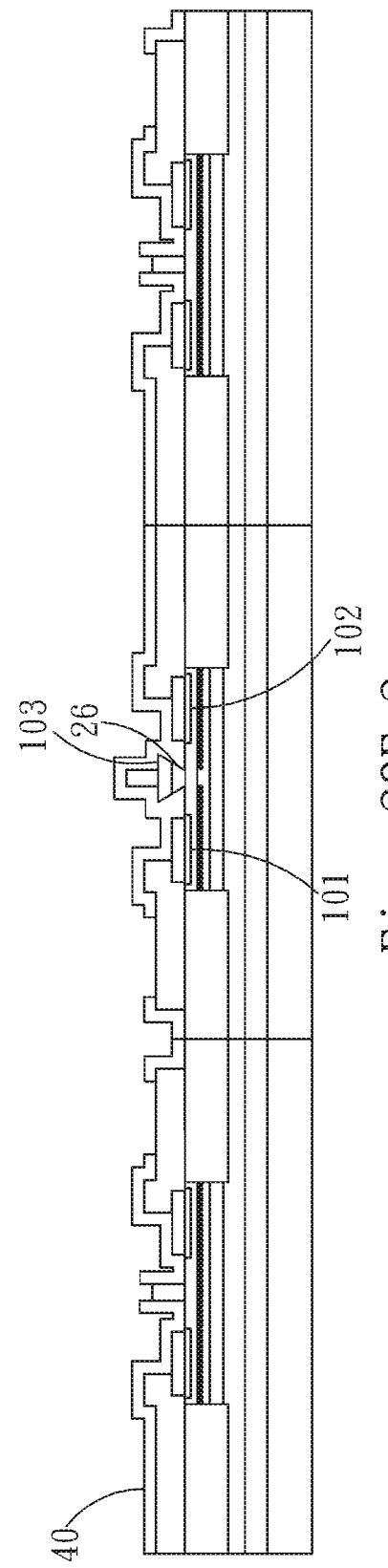

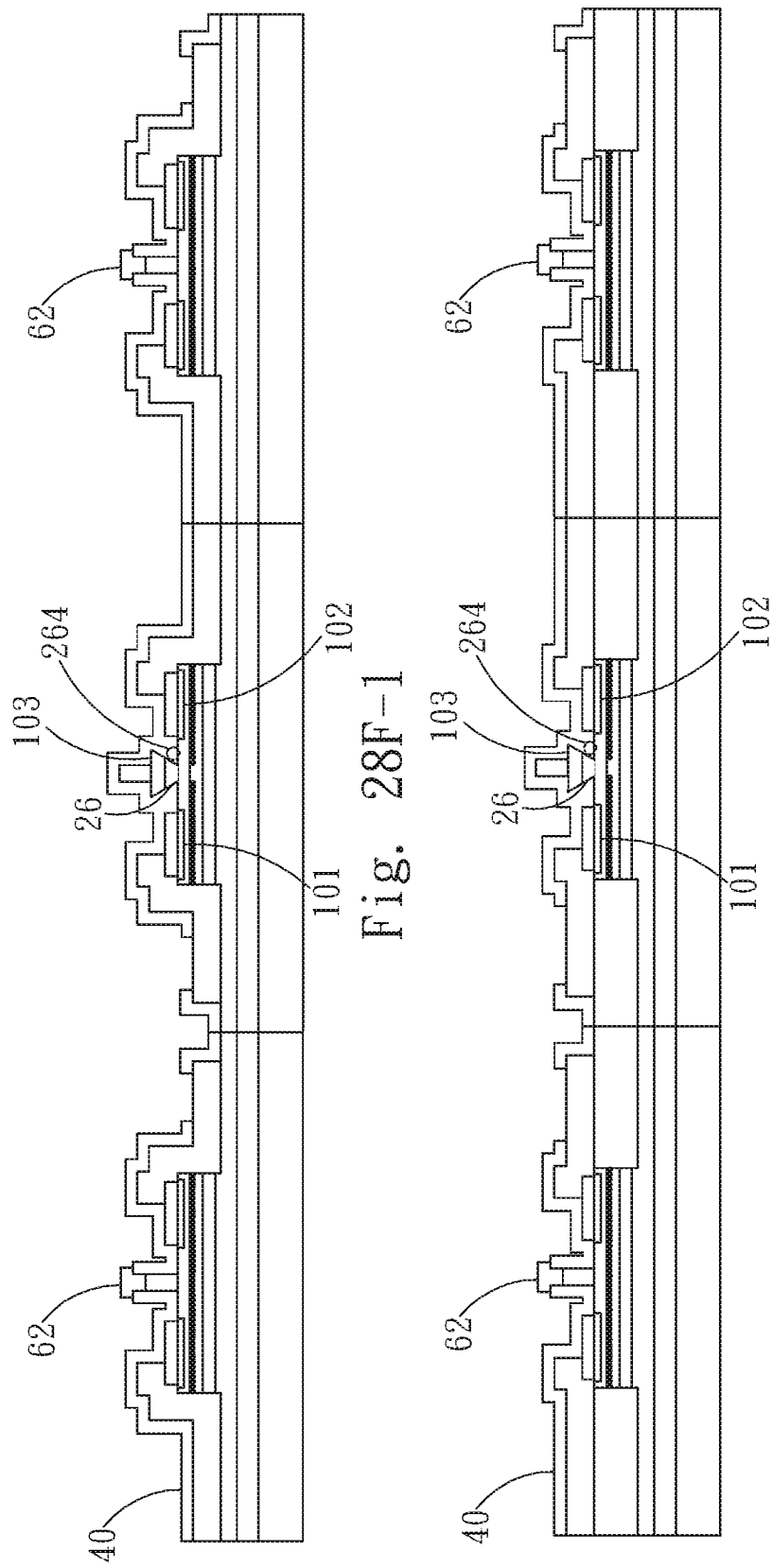

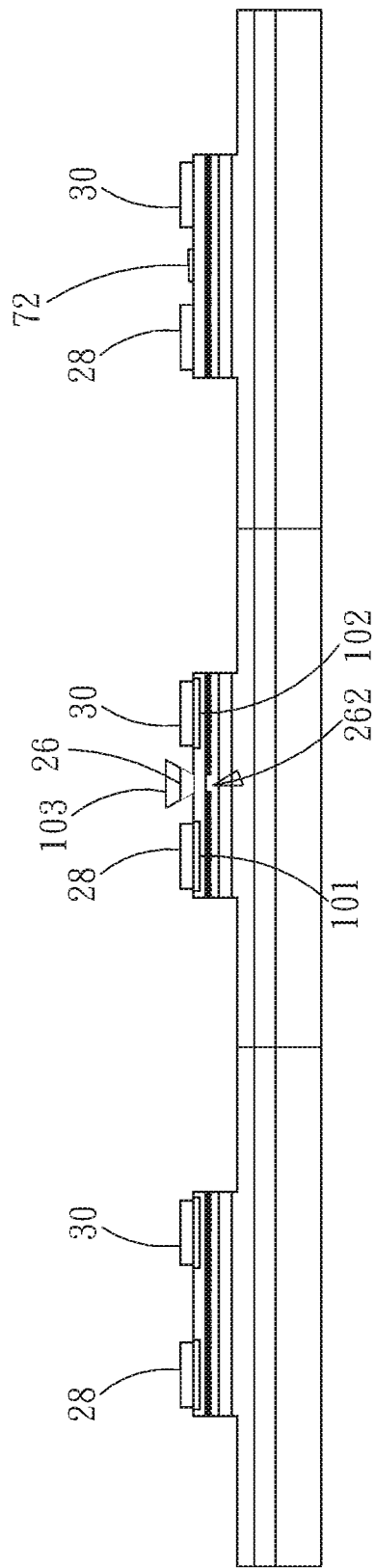
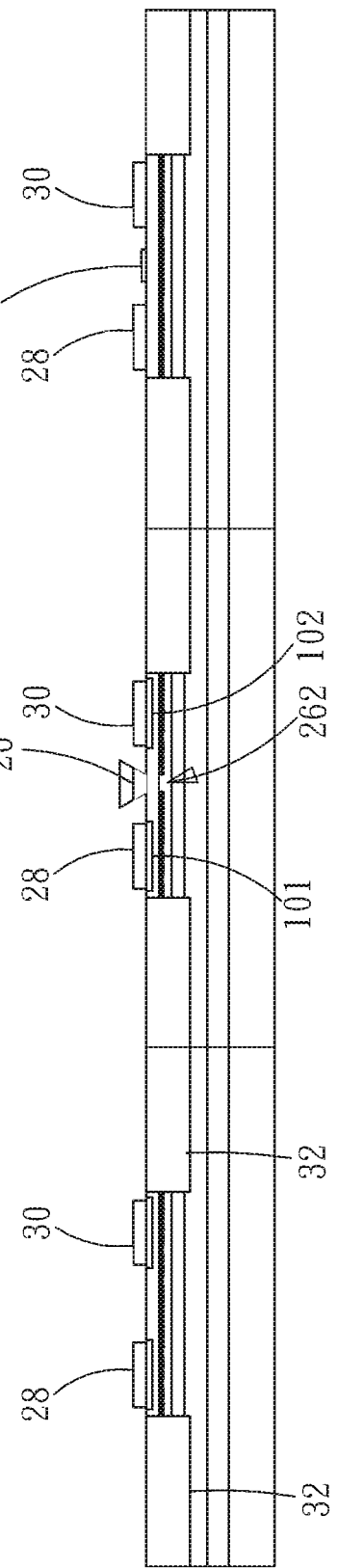
Fig. 30A-1
Fig. 30A-2

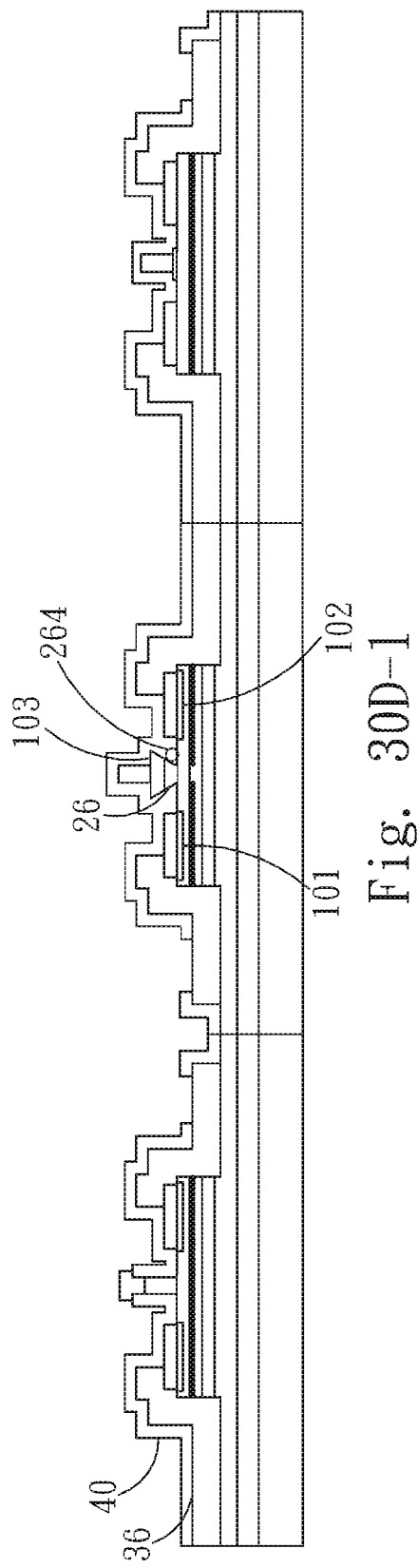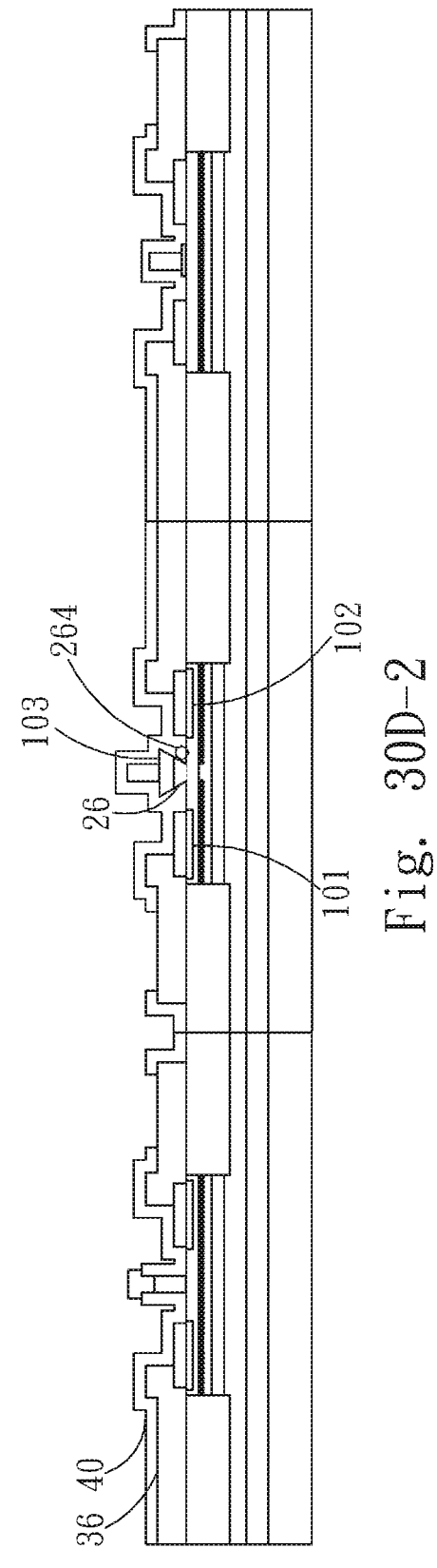

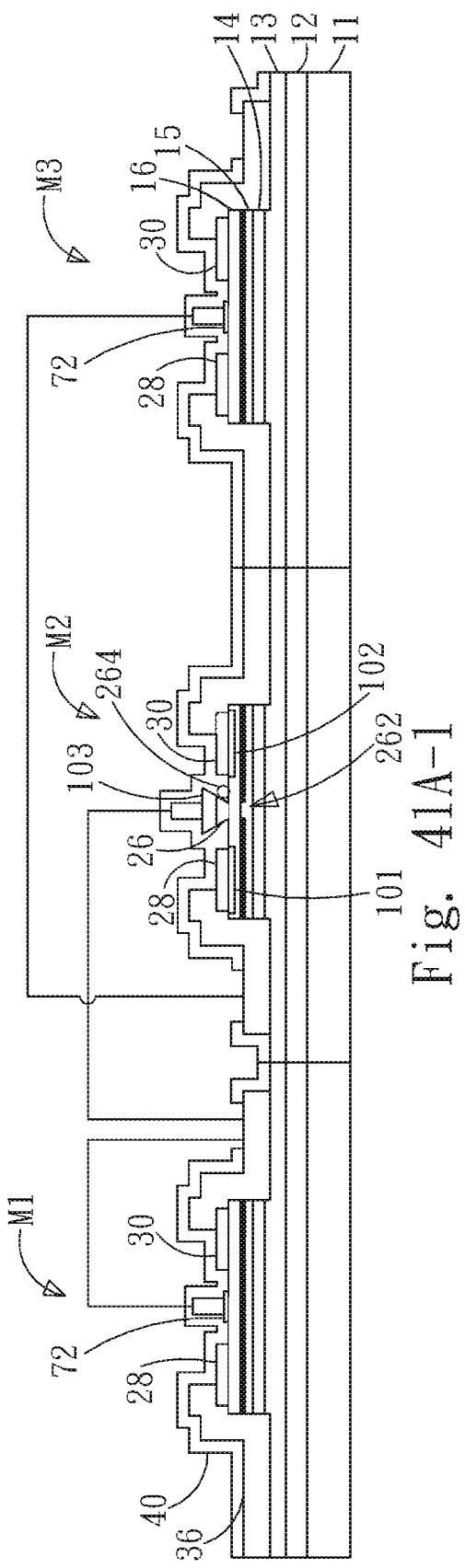
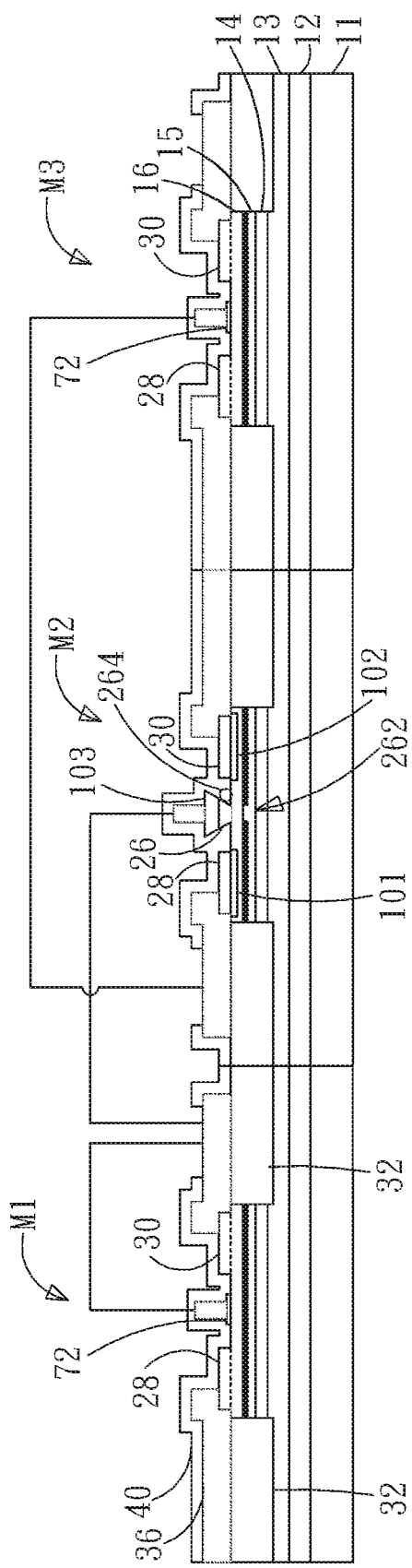
Fig. 41A-1
Fig. 41A-2

EPITAXIAL STRUCTURE OF GA-FACE GROUP III NITRIDE, ACTIVE DEVICE, AND GATE PROTECTION DEVICE THEREOF

FIELD OF THE INVENTION

The present invention relates generally to an epitaxial structure, and particularly to a novel epitaxial structure of Ga-face group III nitride series capable of blocking the electrons of buffer traps from entering the channel layer, and to the active device and the gate protection device formed by using the epitaxial structure.

BACKGROUND OF THE INVENTION

According to the prior art, the most common structures to achieve an enhancement-mode AlGaN/GaN high electron mobility transistor (E-mode AlGaN/GaN HEMT) include: 1. Ga-face p-GaN gate E-mode HEMT structure, and 2. N-face $Al_xGaN$ gate E-mode HEMT structure. Nonetheless, as implied by their names, only the gate region will be p-GaN or $Al_xGaN$.

The most common fabrication method is to use an epitaxial structure and etch p-GaN outside the gate region using dry etching while maintaining the completeness of the thickness of the underlying epitaxial layer. Because if the underlying epitaxial layer is etched too much, two-dimensional electron gas (2DEG) will not be formed at the interface AlGaN/GaN of a Ga-face p-GaN gate E-mode HEMT structure. Thereby, the using dry etching is challenging because the etching depth is hard to control and non-uniformity in thickness still occurs in every epitaxial layer of an epitaxial wafer.

Accordingly, to improve the above drawbacks, the present invention provides a novel epitaxial structure of Ga-face group III nitride, an active device, and a gate protection device formed by using the epitaxial structure.

SUMMARY

An objective of the present invention is to provide a novel epitaxial structure of Ga-face group III nitride, an active device, and a gate protection device formed by using the epitaxial structure for enabling the gate of a p-GaN gate E-mode AlGaN/GaN HEMT to be protected under any gate voltage. In addition, multiple types of high-voltage and high-speed active devices can be formed on the substrate of the epitaxial structure of Ga-face group III nitride at the same time.

To achieve the above objective, the present invention provides an epitaxial structure of AlGaN/GaN HEMT, which includes a gate protection device of D-mode AlGaN/GaN HEMT. The gate protection device is connected to: 1. the gate of a p-GaN gate E-mode AlGaN/GaN HEMT formed by selective epitaxial growth; or 2. the gate of a p-GaN gate E-mode AlGaN/GaN HEMT formed by dry etching. The epitaxial structure of Ga-face AlGaN/GaN as described above comprises a silicon substrate, a buffer layer (C-doped) on the silicon substrate, an i-GaN (C-doped) layer on the buffer layer (C-doped), an $i-Al_yGaN$ buffer layer on the i-GaN (C-doped) layer, an i-GaN channel layer on the $i-Al_yGaN$ buffer layer, and an $i-Al_xGaN$ layer on the i-GaN channel layer, where $x=0.1\sim0.3$ and $y=0.05\sim0.75$.

BRIEF DESCRIPTION OF THE DRAWINGS

FIG. 4E-1 and FIG. 4E-2 show the equivalent circuits of the source of a D-mode AlGaN/GaN HEMT connected to the gate of a p-GaN gate E-mode AlGaN/GaN HEMT.

FIG. 6A-1 and FIG. 6A-2 show cross-sectional views of the SEG p-GaN gate E-mode AlGaN/GaN HEMT using a D-mode AlGaN/GaN HEMT without gate dielectric layer as the gate protection device;

FIG. 7A-1 and FIG. 7A-2 show cross-sectional views of the inverted trapezoidal gate structure for the SEG p-GaN gate;

FIG. 7C-1 shows a cross-sectional view of dry-etching to the high-resistivity i-GaN buffer layer (C-doped) for isolating devices;

FIG. 7C-2 shows a cross-sectional view of adopting multiple-energy destructive ion implantation to the high-resistivity i-GaN buffer layer (C-doped) for isolating devices;

FIG. 7D-1 and FIG. 7D-2 show cross-sectional views of forming the gate metal and the bonding pads or interconnection metals for drain and source corresponding to FIG. 7C-1 and FIG. 7C-2;

FIG. 7E-1 and FIG. 7E-2 show cross-sectional views of forming and patterning a passivation layer for exposing the drain and source bonding pad regions corresponding to FIG. 7D-1 and FIG. 7D-2;

FIG. 7F-1 and FIG. 7F-2 show cross-sectional views of the D-mode AlGaN/GaN HEMT after the gate field-plate metal is fabricated corresponding to FIG. 7E-1 and FIG. 7E-2;

FIG. 8A-1 and FIG. 8A-2 show cross-sectional views of the etched p-GaN gate E-mode AlGaN/GaN HEMT using a D-mode AlGaN/GaN HEMT without gate dielectric layer as the gate protection device;

FIG. 9A-1 and FIG. 9A-2 show cross-sectional views of fabricating the gate structure for the etched p-GaN gate;

FIG. 9B to FIG. 9F-2 show cross-sectional views of fabricating the etched p-GaN gate E-mode AlGaN/GaN HEMT using a D-mode AlGaN/GaN HEMT without gate dielectric layer as the gate protection device;

FIG. 10A-1 and FIG. 10A-2 show cross-sectional views of the SEG p-GaN gate and self-aligned gate metal E-mode AlGaN/GaN HEMT using a D-mode AlGaN/GaN HEMT without gate dielectric layer as the gate protection device;

FIG. 11B-1 and FIG. 11B-2 show cross-sectional views for fabricating the SEG p-GaN gate and self-aligned gate metal;

FIG. 11D-1 shows a cross-sectional view of dry-etching to the high-resistivity i-GaN buffer layer (C-doped) for isolating devices;

FIG. 11D-2 shows a cross-sectional view of adopting multiple-energy destructive ion implantation to the high-resistivity i-GaN buffer layer (C-doped) for isolating devices;

FIG. 11E-1 and FIG. 11E-2 show cross-sectional views of forming the gate metal and the bonding pads or interconnection metals for drain and source corresponding to FIG. 11D-1 and FIG. 11D-2;

FIG. 11F-1 and FIG. 11F-2 show cross-sectional views of forming and patterning a passivation layer for exposing the drain and source bonding pad regions corresponding to FIG. 11E-1 and FIG. 11E-2;

FIG. 11G-1 and FIG. 11G-2 show cross-sectional views of the D-mode AlGaN/GaN HEMT after the gate field-plate metal is fabricated corresponding to FIG. 11F-1 and FIG. 11F-2;

FIG. 12A-1 and FIG. 12A-2 show cross-sectional views of the SEG p-GaN gate E-mode AlGaN/GaN HEMT using a D-mode AlGaN/GaN HEMT with gate dielectric layer as the gate protection device;

FIG. 14A-1 and FIG. 14A-2 show cross-sectional views of the etched p-GaN gate E-mode AlGaN/GaN HEMT using a D-mode AlGaN/GaN HEMT with gate dielectric layer as the gate protection device;

FIG. 16A-1 to FIG. 16A-2 show cross-sectional views of the SEG p-GaN gate and self-aligned gate metal E-mode AlGaN/GaN HEMT using a D-mode AlGaN/GaN HEMT with gate dielectric layer as the gate protection device;

FIG. 18-A shows an equivalent circuit of the source of a D-mode AlGaN/GaN HEMT without gate dielectric layer connecting to a p-GaN gate E-mode AlGaN/GaN HEMT and cascoding to a D-mode AlGaN/GaN HEMT without gate dielectric layer;

FIG. 18-B shows an equivalent circuit of the source of a D-mode AlGaN/GaN HEMT without gate dielectric layer connecting to a p-GaN gate E-mode AlGaN/GaN HEMT and cascoding to a D-mode AlGaN/GaN HEMT with gate dielectric layer;

FIG. 18-C shows an equivalent circuit of the source of a D-mode AlGaN/GaN HEMT with gate dielectric layer connecting to a p-GaN gate E-mode AlGaN/GaN HEMT and cascoding to a D-mode AlGaN/GaN HEMT without gate dielectric layer;

FIG. 18-D shows an equivalent circuit of the source of a D-mode AlGaN/GaN HEMT with gate dielectric layer connecting to a p-GaN gate E-mode AlGaN/GaN HEMT and cascoding to a D-mode AlGaN/GaN HEMT with gate dielectric layer;

FIG. 19A-1 and FIG. 19A-2 show cross-sectional views of the SEG p-GaN gate E-mode AlGaN/GaN HEMT using a D-mode AlGaN/GaN HEMT without gate dielectric layer as the gate protection device cascoding to a D-mode AlGaN/GaN HEMT without gate dielectric layer;

FIG. 20A-1 and FIG. 20A-2 show cross-sectional views of the inverted trapezoidal gate structure for the SEG p-GaN gate;

FIG. 20B shows a cross-sectional view after the drain and source metals corresponding to FIG. 20A-1 and FIG. 20A-2 are fabricated;

FIG. 20C-1 shows a cross-sectional view of dry-etching to the high-resistivity i-GaN buffer layer (C-doped) for isolating devices;

FIG. 20C-2 shows a cross-sectional view of adopting multiple-energy destructive ion implantation to the high-resistivity i-GaN buffer layer (C-doped) for isolating devices;

FIG. 20D-1 and FIG. 20D-2 show cross-sectional views of forming the gate metal and the bonding pads or interconnection metals for drain and source corresponding to FIG. 20C-1 and FIG. 20C-2;

FIG. 20E-1 and FIG. 20E-2 show cross-sectional views of forming and patterning a passivation layer for exposing the drain and source bonding pad regions corresponding to FIG. 20D-1 and FIG. 20D-2;

FIG. 20F-1 and FIG. 20F-2 show cross-sectional views after the gate field-plate metal is fabricated corresponding to FIG. 20E-1 and FIG. 20E-2;

FIG. 21A-1 and FIG. 21A-2 show cross-sectional views of the SEG p-GaN gate E-mode AlGaN/GaN HEMT using a D-mode AlGaN/GaN HEMT without gate dielectric layer as the gate protection device cascoding to a D-mode AlGaN/GaN HEMT with gate dielectric layer;

FIG. 22A-1 shows a cross-sectional view of dry-etching to the high-resistivity i-GaN buffer layer (C-doped) for isolating devices and forming the inverted trapezoidal gate structure for the SEG p-GaN gate and the drain and source metals;

FIG. 22A-2 shows a cross-sectional view of adopting multiple-energy destructive ion implantation to the high-resistivity i-GaN buffer layer (C-doped) for isolating devices and forming the inverted trapezoidal gate structure for the SEG p-GaN gate and the drain and source metals;

FIG. 22B-1 and FIG. 22B-2 show cross-sectional views of forming the gate metal and the bonding pads or interconnection metals for drain and source corresponding to FIG. 22A-1 and FIG. 22A-2;

FIG. 22C-1 and FIG. 22C-2 show cross-sectional views of forming and patterning a passivation layer for exposing the drain and source bonding pad regions corresponding to FIG. 22B-1 and FIG. 22B-2;

FIG. 22D-1 and FIG. 22D-2 show cross-sectional views after the gate field-plate metal is fabricated corresponding to FIG. 22C-1 and FIG. 22C-2;

FIG. 20E shows a top view corresponding to FIG. 21A-1 and FIG. 21A-2;

FIG. 23A-1 and FIG. 23A-2 show cross-sectional views of the hybrid E-mode AlGaN/GaN HEMT formed by the etched p-GaN gate E-mode AlGaN/GaN HEMT using a D-mode AlGaN/GaN HEMT without gate dielectric layer as the gate protection device cascoding to a D-mode AlGaN/GaN HEMT without gate dielectric layer;

FIG. 24A-1 shows a cross-sectional view of the SEG region with photoresist;

FIG. 24A-2 shows a cross-sectional view after the etched p-GaN gate is fabricated in the SEG region;

FIG. 24C-1 shows a cross-sectional view of dry-etching to the high-resistivity i-GaN buffer layer (C-doped) for isolating devices;

FIG. 24C-2 shows a cross-sectional view of adopting multiple-energy destructive ion implantation to the high-resistivity i-GaN buffer layer (C-doped) for isolating devices;

FIG. 24D-1 and FIG. 24D-2 show cross-sectional views of forming the gate metal and the bonding pads or interconnection metals for drain and source corresponding to FIG. 24C-1 and FIG. 24C-2;

FIG. 24E-1 and FIG. 24E-2 show cross-sectional views of forming and patterning a passivation layer for exposing the drain and source bonding pad regions corresponding to FIG. 24D-1 and FIG. 24D-2;

FIG. 24F-1 and FIG. 24F-2 show cross-sectional views after the gate field-plate metal is fabricated corresponding to FIG. 24E-1 and FIG. 24E-2;

FIG. 25A-1 and FIG. 25A-2 show cross-sectional views of the etched p-GaN gate E-mode AlGaN/GaN HEMT using a D-mode AlGaN/GaN HEMT without gate dielectric layer as the gate protection device cascoding to a D-mode AlGaN/GaN HEMT with gate dielectric layer;

FIG. 26A-1 shows a cross-sectional view of dry-etching to the high-resistivity i-GaN buffer layer (C-doped) for isolating devices and forming the inverted trapezoidal gate structure for the SEG p-GaN gate and the drain and source metals;

FIG. 26A-2 shows a cross-sectional view of adopting multiple-energy destructive ion implantation to the high-resistivity i-GaN buffer layer (C-doped) for isolating devices and forming the inverted trapezoidal gate structure for the SEG p-GaN gate and the drain and source metals;

FIG. 26B-1 and FIG. 26B-2 show cross-sectional views of forming the gate metal and the bonding pads or interconnection metals for drain and source corresponding to FIG. 26A-1 and FIG. 26A-2;

FIG. 26C-1 and FIG. 26C-2 show cross-sectional views of forming and patterning a passivation layer for exposing the drain and source bonding pad regions corresponding to FIG. 26B-1 and FIG. 26B-2;

FIG. 26D-1 and FIG. 26D-2 show cross-sectional views after the gate field-plate metal is fabricated corresponding to FIG. 26C-1 and FIG. 26C-2;

FIG. 27A-1 and FIG. 27A-2 show cross-sectional views of the SEG p-GaN gate and self-aligned gate metal E-mode AlGaN/GaN HEMT using a D-mode AlGaN/GaN HEMT without gate dielectric layer as the gate protection device cascoding to a D-mode AlGaN/GaN HEMT without gate dielectric layer;

FIG. 28A-1 shows a cross-sectional view of the source and drain ion implantation regions;

FIG. 28A-2 shows a cross-sectional view of defining the SEG p-GaN gate region and the self-aligned gate metal region;

FIG. 28B-1 shows a cross-sectional view of the inverted trapezoidal gate structure for the SEG p-GaN gate;

FIG. 28B-2 shows a cross-sectional view after the drain and source metals corresponding to FIG. 27A-1 and FIG. 27A-2 are fabricated FIG. 28C-1 shows a cross-sectional view of dry-etching to the high-resistivity i-GaN buffer layer (C-doped) for isolating devices and forming the inverted trapezoidal gate structure for the SEG p-GaN gate and the drain and source metals;

FIG. 28C-2 shows a cross-sectional view of adopting multiple-energy destructive ion implantation to the high-resistivity i-GaN buffer layer (C-doped) for isolating devices and forming the inverted trapezoidal gate structure for the SEG p-GaN gate and the drain and source metals;

FIG. 28D-1 and FIG. 28D-2 show cross-sectional views of forming the gate metal and the bonding pads or interconnection metals for drain and source corresponding to FIG. 28C-1 and FIG. 28C-2;

FIG. 28E-1 and FIG. 28E-2 show cross-sectional views of forming and patterning a passivation layer for exposing the drain and source bonding pad regions corresponding to FIG. 28D-1 and FIG. 28D-2;

FIG. 28F-1 and FIG. 28F-2 show cross-sectional views after the gate field-plate metal is fabricated corresponding to FIG. 28E-1 and FIG. 28E-2;

FIG. 29A-1 and FIG. 29A-2 show cross-sectional views of the SEG p-GaN gate and self-aligned gate metal E-mode AlGaN/GaN HEMT using a D-mode AlGaN/GaN HEMT without gate dielectric layer as the gate protection device cascoding to a D-mode AlGaN/GaN HEMT with gate dielectric layer;

FIG. 30A-1 shows a cross-sectional view of dry-etching to the high-resistivity i-GaN buffer layer (C-doped) for isolating devices and forming the inverted trapezoidal gate structure for the SEG p-GaN gate and the drain and source metals;

FIG. 30A-2 shows a cross-sectional view of adopting multiple-energy destructive ion implantation to the high-resistivity i-GaN buffer layer (C-doped) for isolating devices and forming the inverted trapezoidal gate structure for the SEG p-GaN gate and the drain and source metals;

FIG. 30B-1 and FIG. 30B-2 show cross-sectional views of forming the gate metal and the bonding pads or interconnection metals for drain and source corresponding to FIG. 26A-1 and FIG. 26A-2;

FIG. 30C-1 and FIG. 30C-2 show cross-sectional views of forming and patterning a passivation layer for exposing the drain and source bonding pad regions corresponding to FIG. 30B-1 and FIG. 30B-2;

FIG. 30D-1 and FIG. 30D-2 show cross-sectional views after the gate field-plate metal is fabricated corresponding to FIG. 30C-1 and FIG. 30C-2;

FIG. 31A-1 and FIG. 31A-2 show cross-sectional views of the SEG p-GaN gate E-mode AlGaN/GaN HEMT using a D-mode AlGaN/GaN HEMT with gate dielectric layer as the gate protection device cascoding to a D-mode AlGaN/GaN HEMT without gate dielectric layer;

FIG. 33A-1 and FIG. 33A-2 show cross-sectional views of the SEG p-GaN gate E-mode AlGaN/GaN HEMT using a D-mode AlGaN/GaN HEMT with gate dielectric layer as the gate protection device cascoding to a D-mode AlGaN/GaN HEMT with gate dielectric layer;

FIG. 35A-1 and FIG. 35A-2 show cross-sectional views of the etched p-GaN gate E-mode AlGaN/GaN HEMT using a D-mode AlGaN/GaN HEMT with gate dielectric layer as the gate protection device cascoding to a D-mode AlGaN/GaN HEMT without gate dielectric layer;

FIG. 37A-1 and FIG. 37A-2 show cross-sectional views of the etched p-GaN gate E-mode AlGaN/GaN HEMT using a D-mode AlGaN/GaN HEMT with gate dielectric layer as the gate protection device cascoding to a D-mode AlGaN/GaN HEMT with gate dielectric layer;

FIG. 39A-1 and FIG. 39A-2 show cross-sectional views of the SEG p-GaN gate and self-aligned gate metal E-mode AlGaN/GaN HEMT using a D-mode AlGaN/GaN HEMT with gate dielectric layer as the gate protection device cascoding to a D-mode AlGaN/GaN HEMT without gate dielectric layer;

FIG. 41A-1 and FIG. 41A-2 show cross-sectional views of the SEG p-GaN gate and self-aligned gate metal E-mode AlGaN/GaN HEMT using a D-mode AlGaN/GaN HEMT with gate dielectric layer as the gate protection device cascoding to a D-mode AlGaN/GaN HEMT with gate dielectric layer.

DETAILED DESCRIPTION

Figure 1:
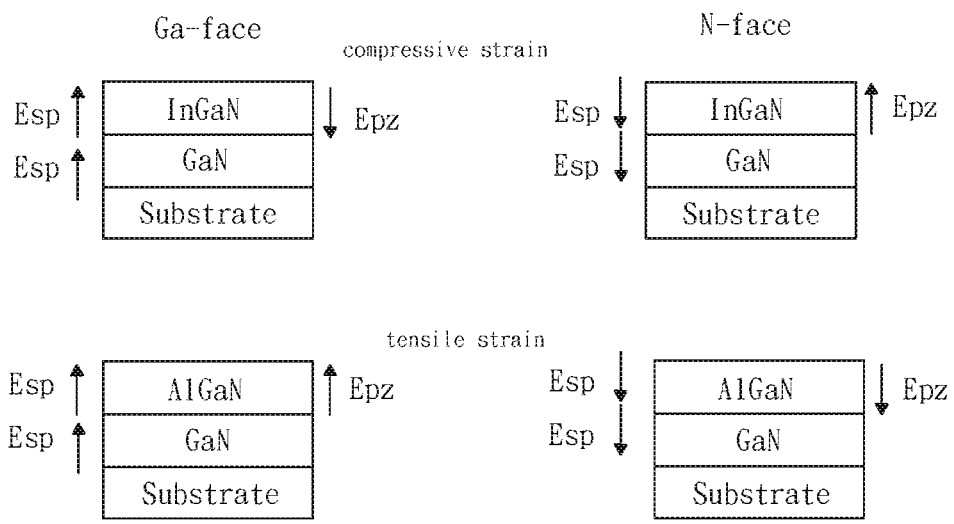
FIG. 1 shows distributions of $E_{PS}$ and $E_{PZ}$ in Ga-face and N-face AlGaN/GaN and GaN/InGaN systems in different stains according to the present invention.

FIG. 1 shows distributions of $E_{PS}$ and $E_{PZ}$ in Ga-face and N-face AlGaN/GaN and GaN/InGaN systems in different stains according to the present invention, where $E_{PS}$ is the spontaneous polarization (the polarization of the material) while $E_{PZ}$ is the piezoelectric polarization (the polarization formed by the piezoelectric effect of strain). Thereby, $E_{PS}$ is determined by the epitaxial layers while $E_{PZ}$ is determined by the piezoelectric effect of strain.

In the AlGaN/GaN system, the value of $E_{PZ}$ is negative when AlGaN is under tensile strain and is positive when AlGaN is under compressive strain. Contrarily, in the GaN/InGaN system, the signs for the values of $E_{PZ}$ are opposite. In addition, according to Reference [2], it is known that, firstly, in the AlGaN/GaN system, the polarization is determined by $E_{SP}$, and secondly, in the GaN/InGaN system, the polarization is determined by $E_{PZ}$.

Figure 2:
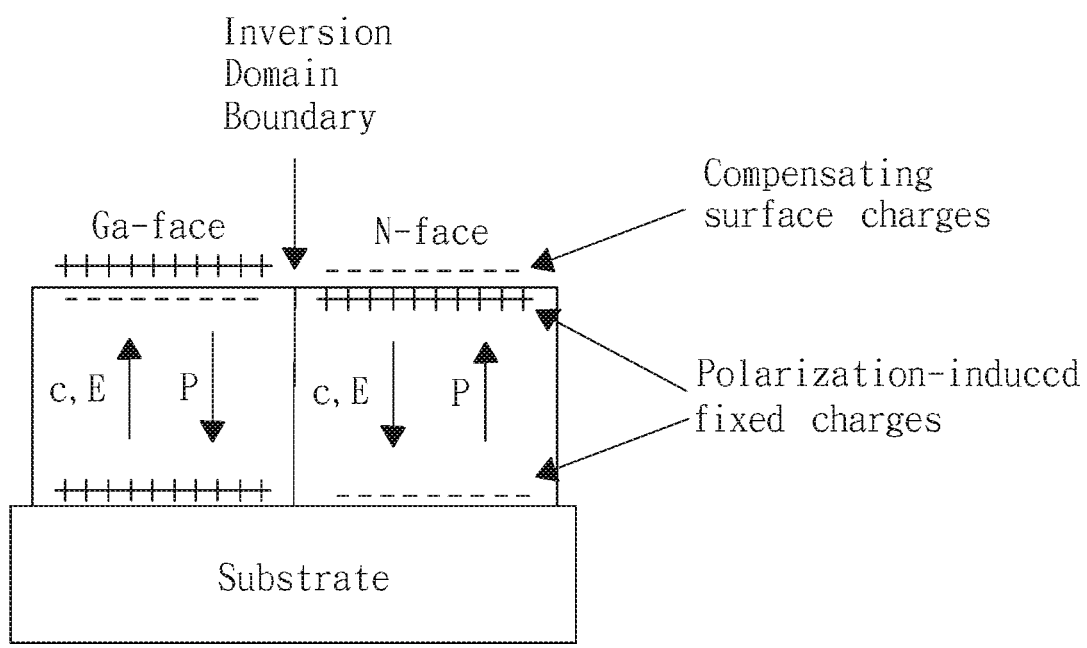
FIG. 2 shows a schematic diagram of Ga-face and N-face GaN grown on a substrate.

As shown in FIG. 2, P is spontaneous polarization and E is the corresponding electric field. In GaN, the Ga-face (N-face) polarization is determined when the Ga atom (N atom) layer of the Ga—N dual-layer faces the surface of epitaxy. As shown in the figure, a schematic diagram of Ga-face and N-face GaN grown on a substrate is illustrated. If it is Ga-face polarization, the internal electric field is away from the substrate and pointing to the surface. Thereby, the polarization is opposite to the direction of the internal electric field. Consequently, the polarization will cause negative charges to accumulate on the surface of lattice and positive charges to accumulate at the junction with the substrate. On the contrary, if it is N-face polarization, the locations of charge accumulation are swapped and the direction of internal electric field is opposite.

Figure 3:
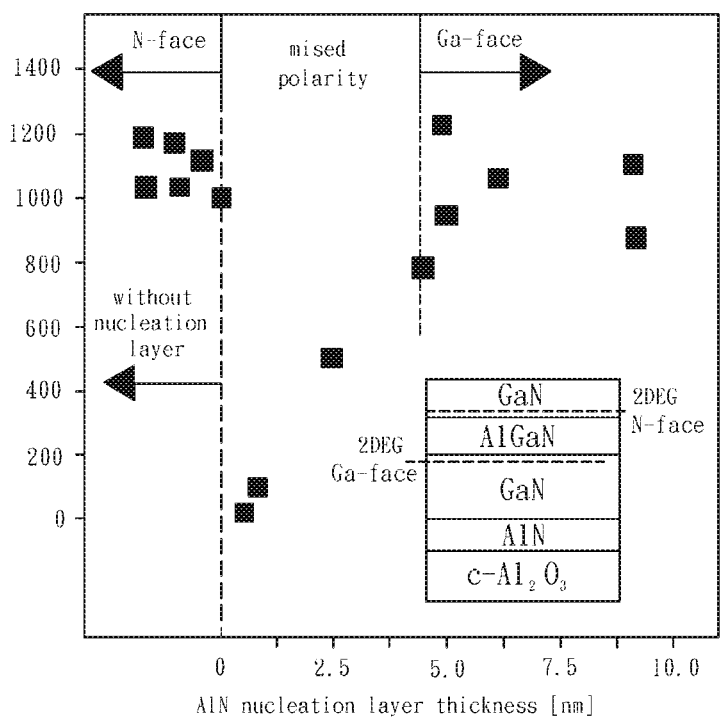
FIG. 3 shows a schematic diagram of the different locations of 2DEG generated at the junctions between AlGaN and GaN due to different polarization according to the present invention.

For an AlGaN/GaN HEMT, the most important thing is how the Ga- and N-face polarization influence the device characteristics. FIG. 3 shows a schematic diagram of the different locations of 2DEG generated at the junctions between AlGaN and GaN due to different polarization. In the Ga-face structure, 2DEG exists at the AlGaN/GaN interface while in the N-face structure, 2DEG exists at the GaN/AlGaN interface. The existence of 2DEG indicates accumulation of positive polarization charges at the interface and the 2DEG itself is just the accumulation of free electrons for compensating the polarization charges.

Figure 4A:
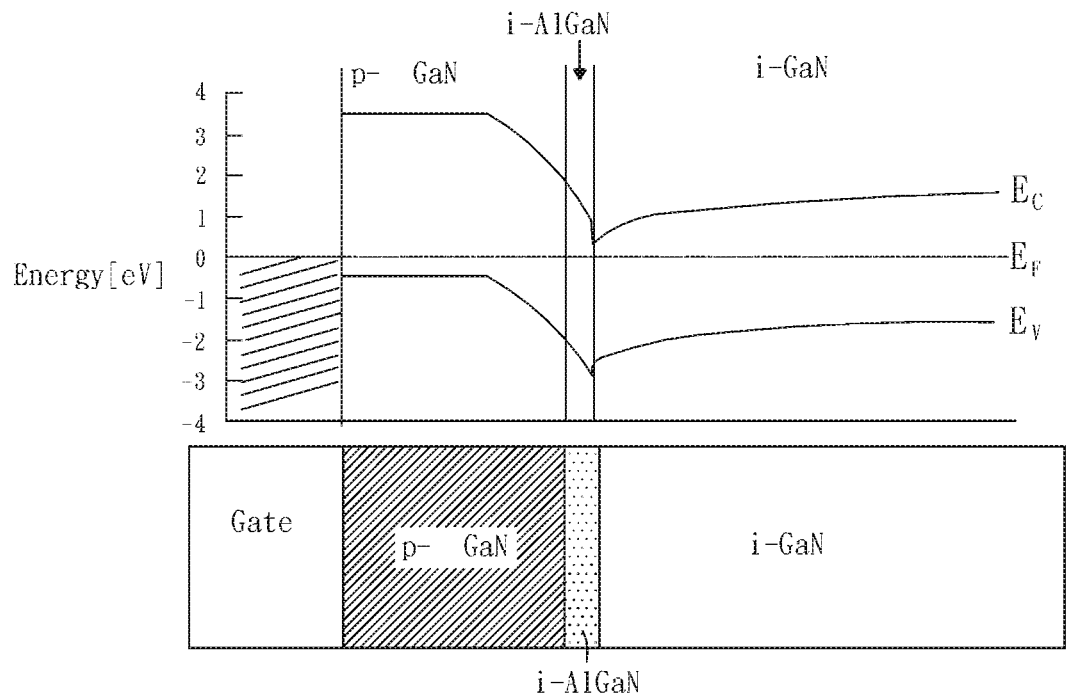
FIG. 4A shows a band diagram of a p-GaN layer grown on the epitaxial structure of AlGaN/GaN HEMT according to the present invention.
Figure 4B:
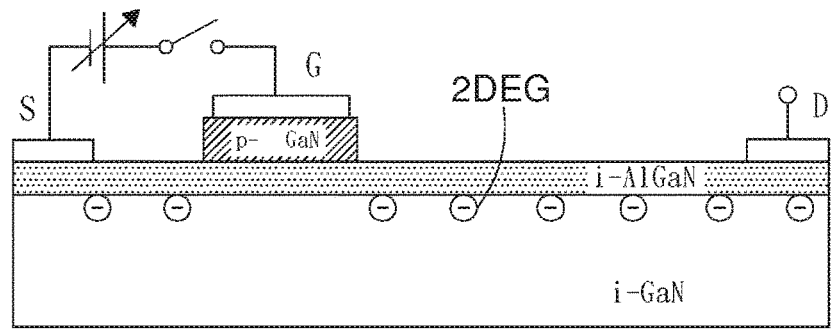
FIG. 4B to FIG. 4D show the operations of the p-GaN gate E-mode AlGaN/GaN HEMT at a fixed Vd and varying gate voltages Vg according to the present invention.
Figure 4C:
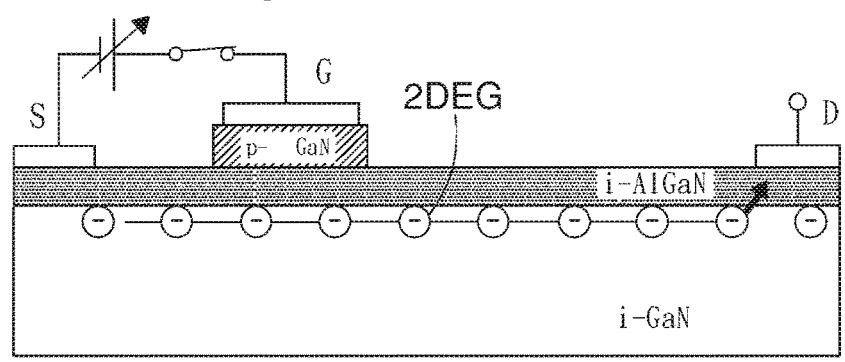
Figure 4D:
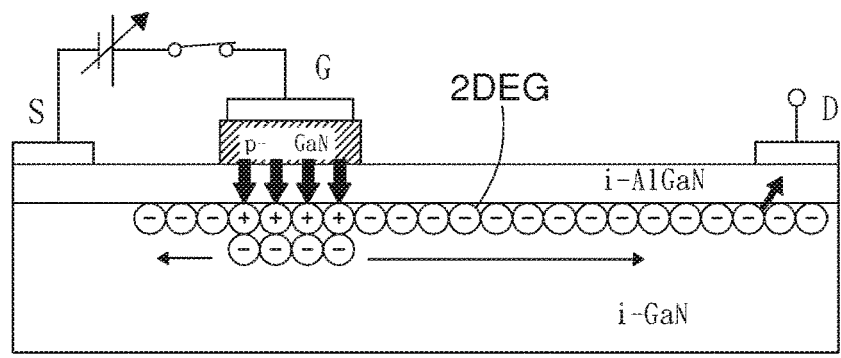

As shown in FIG. 4A to FIG. 4D, the principle of p-GaN gate E-mode AlGaN/GaN HEMT can be viewed from two perspectives. First, by viewing from the polarization electric field, after a p-GaN layer is grown on the epitaxial structure of AlGaN/GaN HEMT, this p-GaN layer will generate a polarization electric field to deplete the 2DEG in the i-GaN channel layer. Secondly, by viewing from the energy band, as shown in FIG. 4A, after a p-GaN layer is grown on the epitaxial structure of AlGaN/GaN HEMT, this p-GaN layer will raise the energy band of the barrier layer i-AlGaN. Thereby, the original potential well at the i-AGaN/i-GaN junction will be raised above the Fermi energy level, and hence disabling 2DEG from forming. As shown in FIG. 4B, as the voltage of the p-type gate G is less than or equal to 0, the 2DEG below is completely depleted. Thereby, the current from the drain D cannot pass the channel to reach the source S. As shown in FIG. 4C, as the voltage of the p-type gate G is greater than 0, the potential well at the i-AGaN/i-GaN junction is suppressed below the Fermi energy level. Thereby, electrons will refill the potential well below and forming 2DEG. When the 2DEG is recovered completely, this positive voltage is defined as the threshold voltage Vth. At this moment, the channel is turned on again and the current from the drain D can pass the channel to reach the source S. In addition, as shown in the equivalent circuit diagram of FIG. 4D, the gate G of the p-GaN gate E-mode AlGaN/GaN HEMT versus the drain D and the gate G versus the source S can be viewed as two SBDs connected back-to-back. Thereby, when Vgs is greater than VF, the SBD between the gate G and the drain D will be turned on. At this time, the holes (positive charges) from the p-GaN gate will be injected into the 2DEG. Consequently, to maintain electrical neutrality of the channel layer, the number of electrons in the channel will be increased, leading to an increase of the concentration of the 2DEG. At this moment, to enable electrons to compensate the injected holes rapidly for maintaining electrical neutrality of the channel layer, the electron mobility will be increased. Once the electron mobility is increased, the drain current will be increased accordingly, resulting in an increase in the operating current of the whole device. Besides, because the hole mobility is lower than at least a half of the electron mobility, holes will be confined and accumulated in the channel below the gate G. Thereby, the leakage current of the gate G can be reduced effectively. The gate G electrode, which is an electrode formed by Ni/Au, Pt/Au, Mo, TiN for forming Schottky contacts, of the p-GaN gate HEMT contacts the p-GaN directly and holes will be confined and accumulated in the channel below the gate G. Unfortunately, when Vgs is much greater than VF, the conduction current of the SBD between the gate G and the drain D is so large that holes cannot be confined and accumulated in the channel below the gate G. Massive holes will be injected into the channel layer and making the gate leakage current increase rapidly. Hence, the transistor can no longer operate in the desired condition. Accordingly, the limited value of Vgs is always the shortcoming of a p-GaN gate E-mode AlGaN/GaN HEMT. In general, due to different epitaxy and process conditions, Vgs(max) is around 5~10V. Since the gate trigger voltage of a commercial power control IC is 9~18V, the gate of the p-GaN gate E-mode AlGaN/GaN HEMT will be punched through directly by the massive gate leakage current Ig generated by the gate trigger voltage and leading to malfunction of the p-GaN gate E-mode AlGaN/GaN HEMT.

Figures 1, 4E:
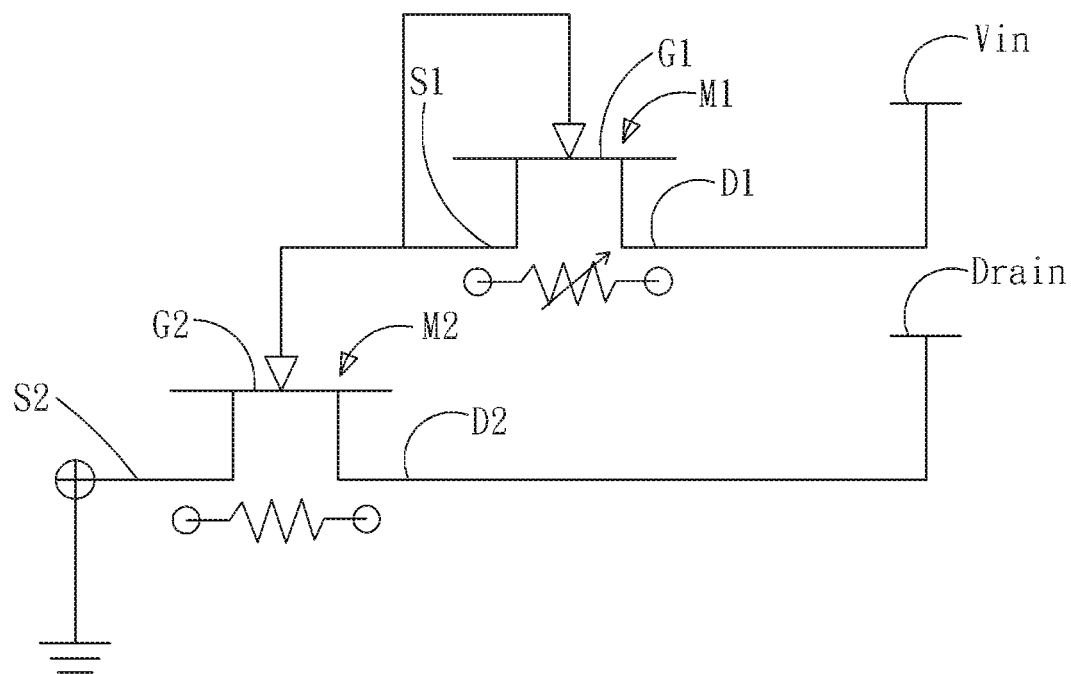
Figures 2, 4E:
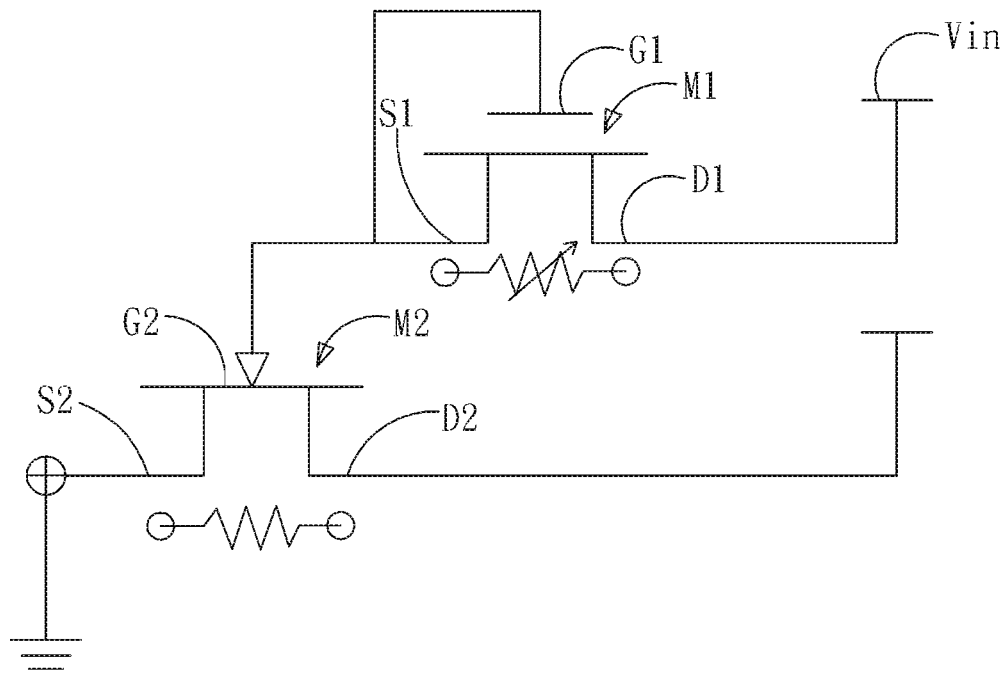

To solve the above problem, as shown in the equivalent circuits in FIG. 4E-1 and FIG. 4E-2, the source of a D-mode AlGaN/GaN HEMT is connected to the gate of a p-GaN gate E-mode AlGaN/GaN HEMT. The source and the gate of the D-mode AlGaN/GaN HEMT M1 are connected electrically using a fabrication method. In other words, the gate G and the source S are shorted (Vgs=0V). Then the D-mode AlGaN/GaN HEMT M1 with Vgs=0V acts as the gate protection device for the p-GaN gate E-mode AlGaN/GaN HEMT M2.

Figure 4F:
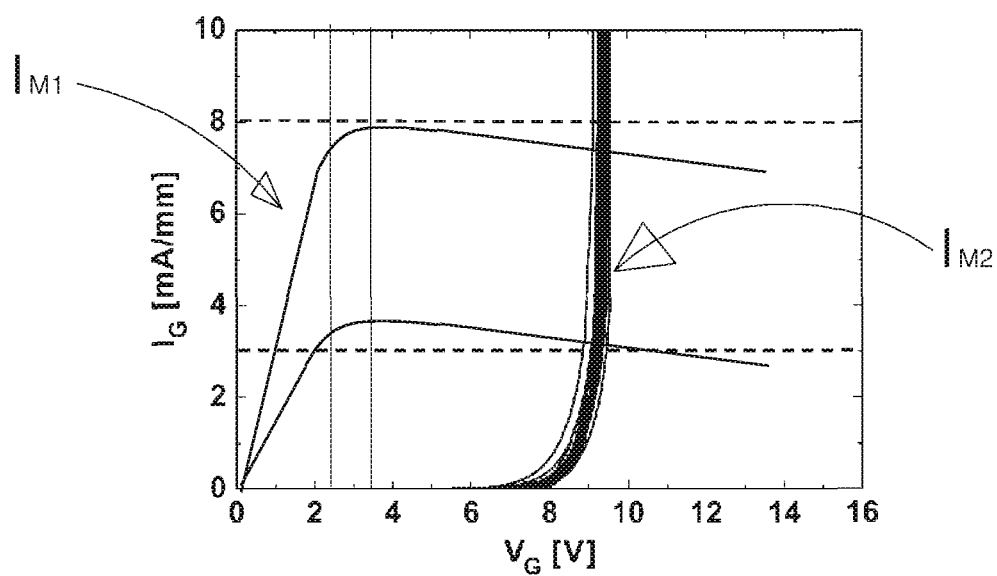
FIG. 4F shows the voltage and current operating curves of the devices shown in the equivalent circuits in FIG. 4E-1 and FIG. 4E-2.

FIG. 4F corresponds to the operating principle and steps of the devices in FIG. 4E-1. First (Step 1), the p-GaN gate E-mode AlGaN/GaN HEMT M2 must be operated in the condition of Vgs>Vf because only in this condition, there is sufficient Ig (the p-GaN gate leakage current) to turn on the D-mode AlGaN/GaN HEMT M1 at Vgs=0V. Thereby, the Ids of the D-mode AlGaN/GaN HEMT M1 will start to rise (Step 2). When the Ids of the D-mode AlGaN/GaN HEMT M1 has risen to the saturation current Idsat (Step 3), the Ig of the p-GaN gate E-mode AlGaN/GaN HEMT M2 will be fixed to Ig(M2)=Idsat(M1). Thereby, the Vgs of the p-GaN gate E-mode AlGaN/GaN HEMT M2 will be locked to the Vgs when Ig(M2)=Idsat(M1). When the Vin of the D-mode AlGaN/GaN HEMT M1 continues to increase (Step 4), since the Vgs of the p-GaN gate E-mode AlGaN/GaN HEMT M2 is locked, Vin=Vds(M1)+Vgs(M2). Thereby, the p-GaN gate E-mode AlGaN/GaN HEMT M2 will be protected.

Figure 5A:
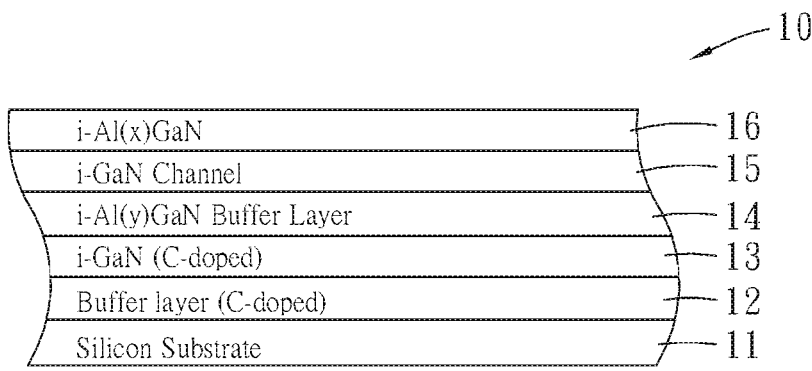
FIG. 5A shows an epitaxial structure diagram of the Ga-face AlGaN/GaN HEMT according to the present invention.
Figure 5B:
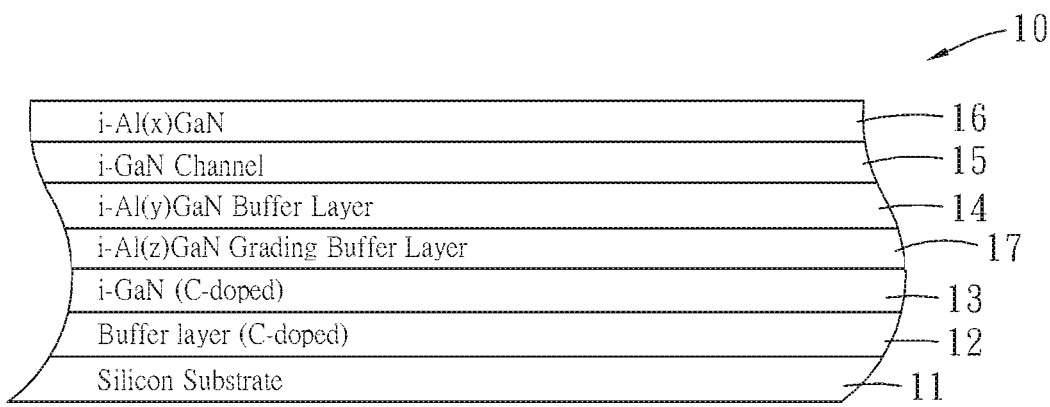
FIG. 5B shows an epitaxial structure diagram of the improved Ga-face AlGaN/GaN HEMT according to the present invention.

FIG. 5A shows an epitaxial structure diagram of the Ga-face AlGaN/GaN HEMT according to the present invention. This epitaxial structure comprises, in order, a silicon substrate 11, a buffer layer (C-doped) 12, an i-GaN layer (C-doped) 13, an i-Al$_y$GaN buffer layer 14, an i-GaN channel layer 15, and an i-Al$_x$GaN layer 16. The buffer layer (C-doped) 12 is disposed on the silicon substrate 11. This epitaxial structure includes the i-Al$_y$GaN buffer layer 14, which is mainly used for blocking the electrons of the buffer traps from entering the channel layer and thus avoiding current collapse of the device. FIG. 5B shows another epitaxial structure diagram of the Ga-face AlGaN/GaN HEMT according to the present invention. To avoid the lattice mismatch problem if the i-Al$_y$GaN buffer layer 14 is grown directly on the i-GaN layer (C-doped) 13 as shown in FIG. 5A, an i-Al$_z$GaN grading buffer layer 17 is added.

Figures 1, 6A:
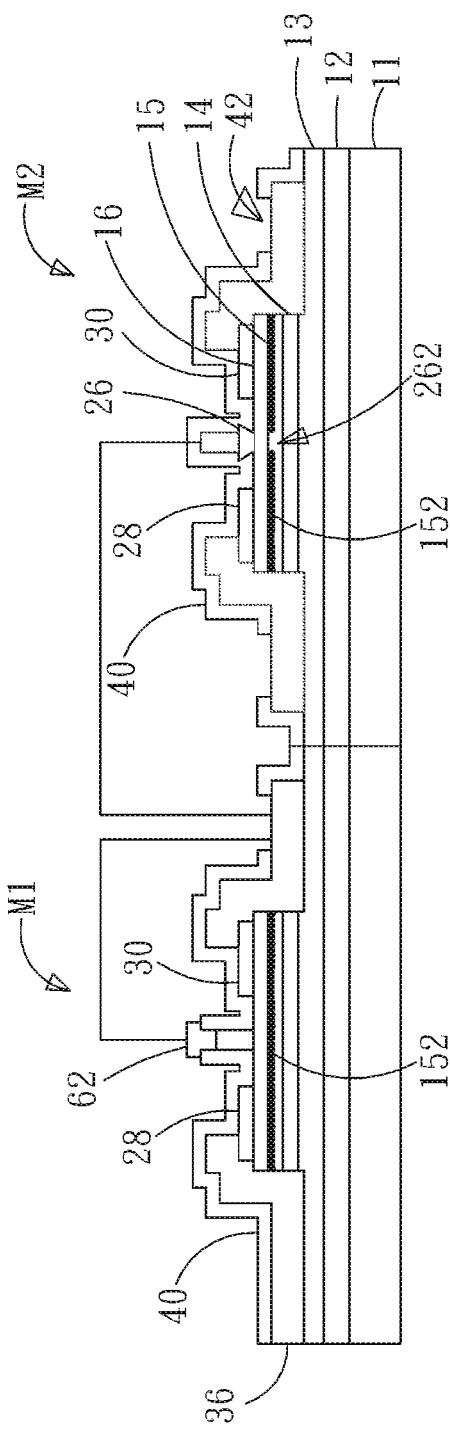
Figures 2, 6A:
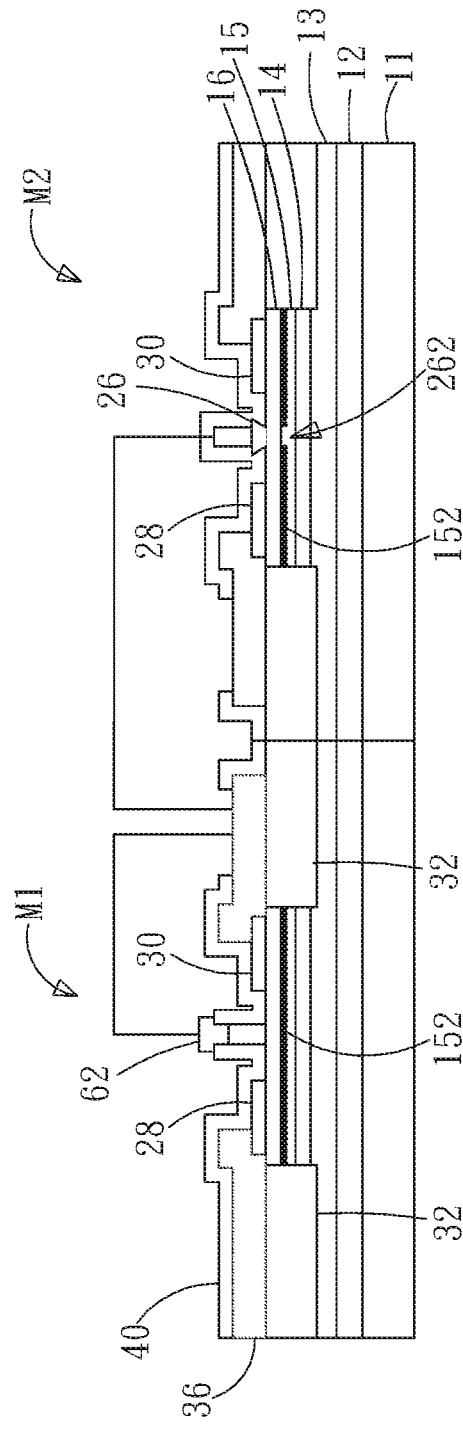

The present invention uses the D-mode AlGaN/GaN HEMT M1 at Vgs=0V as the gate protection device for the p-GaN gate E-mode AlGaN/GaN HEMT M2. Thereby, a selective epitaxial growth (SEG) p-GaN gate is formed on the epitaxial structure according to the present invention for forming an SEG p-GaN gate E-mode AlGaN/GaN HEMT. The present invention adopts an inverted trapezoidal gate structure 26 (as shown in FIG. 6A-1) and uses SEG for growing p-type GaN for the gate of an AlGaN/GaN D-Mode HEMT and the anode of an AlGaN/GaN SBD. Thanks to the region of p-type GaN (the inverted trapezoidal gate structure 26), the 2DEG below the region will be depleted. Thereby, a p-GaN gate E-mode AlGaN/GaN HEMT can be fabricated. The p-type GaN inverted trapezoidal gate structure 26 is a gate structure. Alternatively, after a p-type epitaxial layer is grown on the epitaxial structure according to the present invention, the dry etching method is adopted to etch and form the p-GaN gate (etched p-GaN gate E-mode AlGaN/GaN HEMT). Accordingly, there are two types of p-GaN gate E-mode AlGaN/GaN HEMT, including the SEG p-GaN gate E-mode AlGaN/GaN HEMT and the etched p-GaN gate E-mode AlGaN/GaN HEMT.

Embodiment 1: An SEG p-GaN Gate E-Mode AlGaN/GaN HEMT Using a D-Mode AlGaN/GaN HEMT without Gate Dielectric Layer as the Gate Protection Device As shown in FIG. 6A-1 and FIG. 6A-2, the characteristics of the SEG p-GaN gate E-mode AlGaN/GaN HEMT using a D-mode AlGaN/GaN HEMT without gate dielectric layer as the gate protection device according to the present invention include the epitaxial structure of AlGaN/GaN designed according to the present invention and a p-GaN inverted trapezoidal gate structure 26 located on a first i-Al$_x$GaN layer. Although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted. FIG. 6A-1 and FIG. 6A-2 are schematic diagrams after device fabrication using different device isolation processes. In FIG. 6A-2, multiple-energy destructive ion implantation is adopted. In general, heavy atoms such as boron or oxygen atoms are used for isolating devices. In FIG. 6A-1, dry etching to the highly resistive i-GaN buffer layer (C-doped) can be adopted for isolating devices.

The SEG p-GaN gate E-mode AlGaN/GaN HEMT using a D-mode AlGaN/GaN HEMT without gate dielectric layer as the gate protection device according to the present invention comprises the epitaxial structure of AlGaN/GaN designed according to the present invention and is divided into a left region and a right region. In the left region, a D-mode AlGaN/GaN HEMT without gate dielectric layer M1 is formed. In the right region, an SEG p-GaN gate E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG.

In the following, the fabrication method for the present embodiment will be described. Nonetheless, a person having ordinary skill in the art should know that the present embodiment and its metal layout is not limited to the fabrication method.

Step S11: Pattern the silicon dioxide mask layer 20. First, as shown in FIG. 7A-1, deposit a silicon dioxide mask layer 20 on the epitaxial structure of Ga-face AlGaN/GaN according to the present invention using plasma-enhanced chemical vapor deposition (PECVD) with a thickness of around 100~200 nm. Next, define the gate SEG region 24 by using photoresist and exposure method. Finally, the silicon dioxide mask layer 20 in the region 24 is etched by a wet etching method using buffered oxide etchant (BOE) to expose the surface of the epitaxy. Then, the photoresist 22 is stripped using stripper. Because the wet etching is isotropic, in addition to etching downward, lateral etching will occur concurrently. Thereby, the opening of the silicon dioxide mask layer 20 in the region 24 will form an inverted trapezoidal structure.

Step S12: Form the p-GaN inverted trapezoidal gate structure 26 using SEG.

First, p-GaN SEG is performed using metal-organic chemical vapor deposition (MOCVD) and only the exposed surface of the epitaxy can grow p-GaN. Because the growth of p-GaN in MOCVD is also isotropic, in addition to growing upward, lateral growth will occur concurrently and thus forming an inverted trapezoidal structure of p-GaN, which is just the p-GaN inverted trapezoidal gate structure 26. Finally, the silicon dioxide mask layer 20 is etched by a wet etching method using BOE and forming the structure shown in FIG. 7A-2.

Then, because the p-GaN SEG region 24 occupies only a small portion of the whole epitaxy wafer, the loading effect will occur easily. Namely, the growth rate on the defined region for p-GaN is three to four times the growth rate on the general surface. Thereby, the p-type doping concentration in p-GaN will be equal to ⅓ to ¼ of the expected.

Figure 7B:
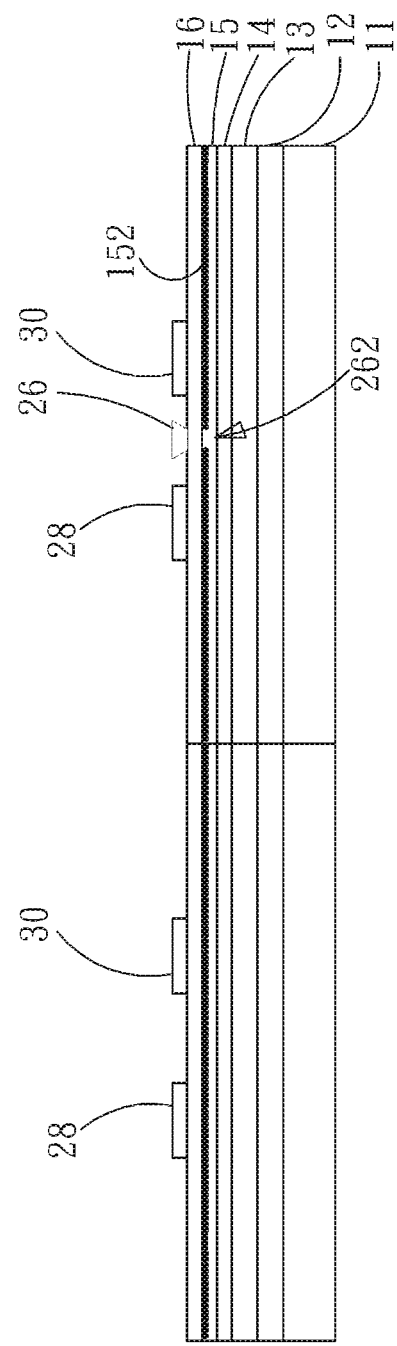
FIG. 7B shows a cross-sectional view after the drain and source metals corresponding to FIG. 7A-1 and FIG. 7A-2 are fabricated.

Step S13: Form the drain ohmic contact 30 and the source ohmic contact 28. A metal layer, for example, a general Ti/Al/Ti/Au or Ti/Al/Ni/Au metal layer, is deposited on the epitaxy wafer using metal vapor deposition. Then a metal lift-off method is adopted to pattern the deposited metal layer for forming the drain and source electrodes on the epitaxy wafer. Afterwards, a thermal treatment is performed at 700~900° C. for 30 seconds to make the drain and source electrodes become ohmic contacts 30, 28, as shown in FIG. 7B.

Step S14: Perform device isolation process. In this step, multiple-energy destructive ion implantation is adopted. In general, heavy atoms such as boron or oxygen atoms are used for isolating devices, as shown in FIG. 7C-2. Alternatively, dry etching to the highly resistive i-GaN buffer layer (C-doped) can be adopted for isolating devices, as shown in FIG. 7C-1.

Figures 1, 7D:
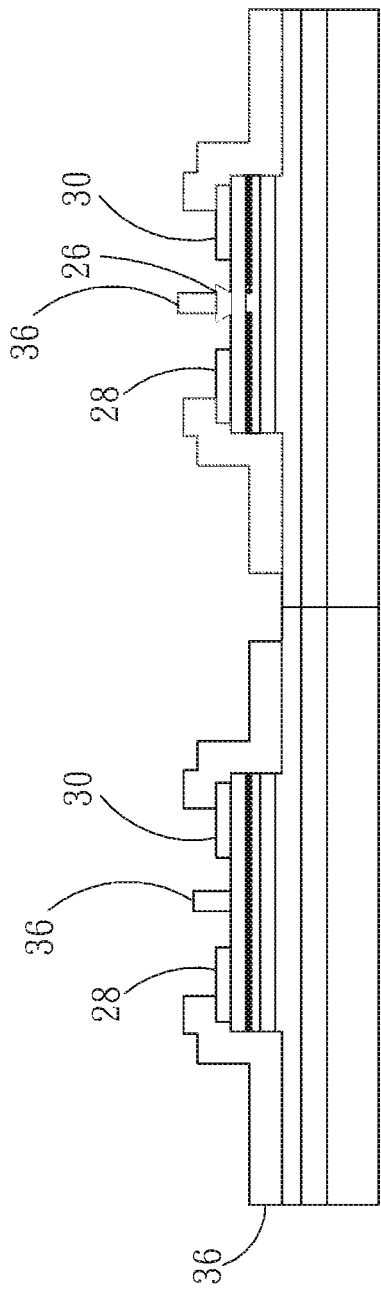
Figures 2, 7D:
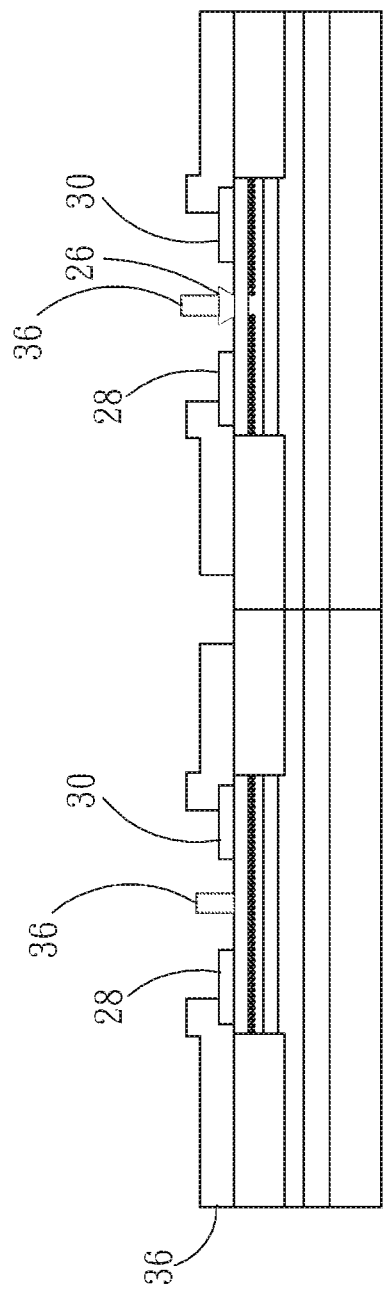

Step S15: Perform the metal wiring process. In this step, metal deposition is performed. Metal vapor deposition and lift-off methods are used for patterning the Ni/Au metal layer and forming bonding pads for the gate, drain, and source electrodes as well as the interconnection metal 35, as shown in FIG. 7D-1 and FIG. 7D-2. Alternatively, in this step, the gate bonding pad region connected electrically with the gate electrode can be formed concurrently, as the structures shown in FIG. 7G.

Figures 1, 7E:
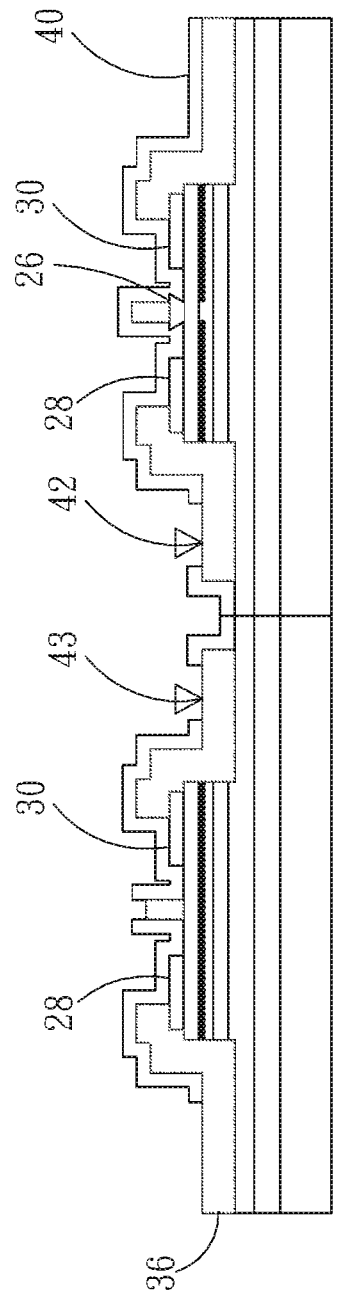
Figures 2, 7E:
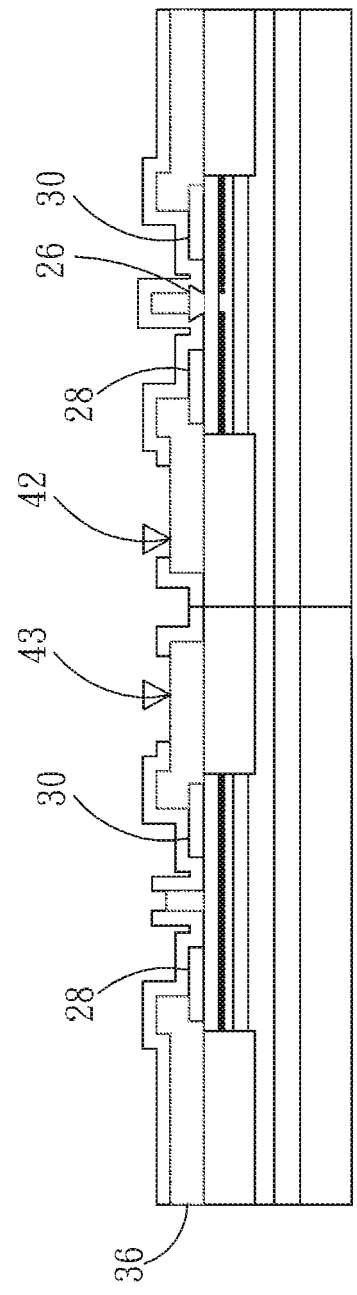

Step S16: Deposit and pattern passivation layer. As shown in FIG. 7E-1 and FIG. 7E-2, a passivation layer 40 is grown by PECVD. The material is selected from the group consisting of $SiO_x$, $SiO_xN_y$, or $SiN_x$. Finally, the passivation layer 40 is patterned for exposing the bonding pad region. For example, wet etching using BOE is adopted for exposing the drain and source bonding pad regions 42, 43 for subsequent wire bonding.

Figures 1, 7F:
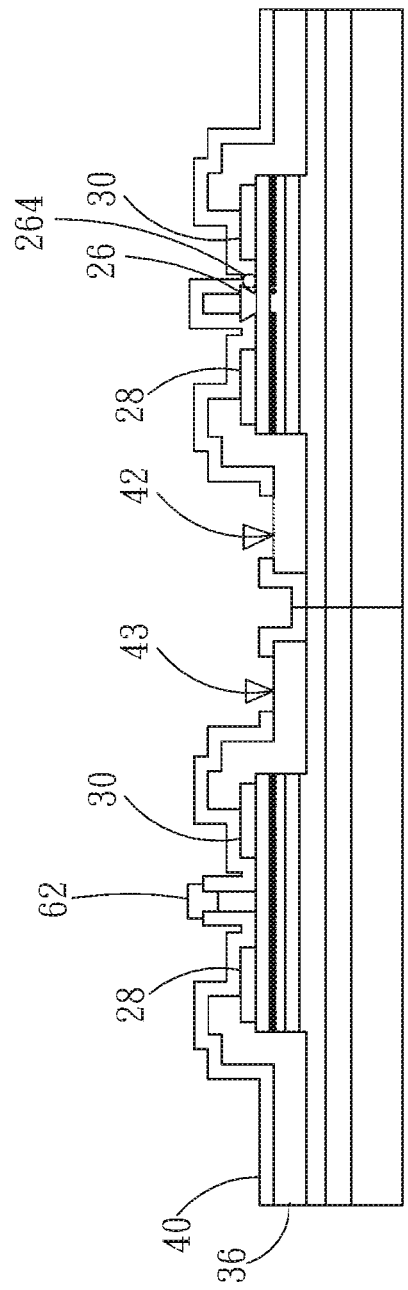
Figures 2, 7F:
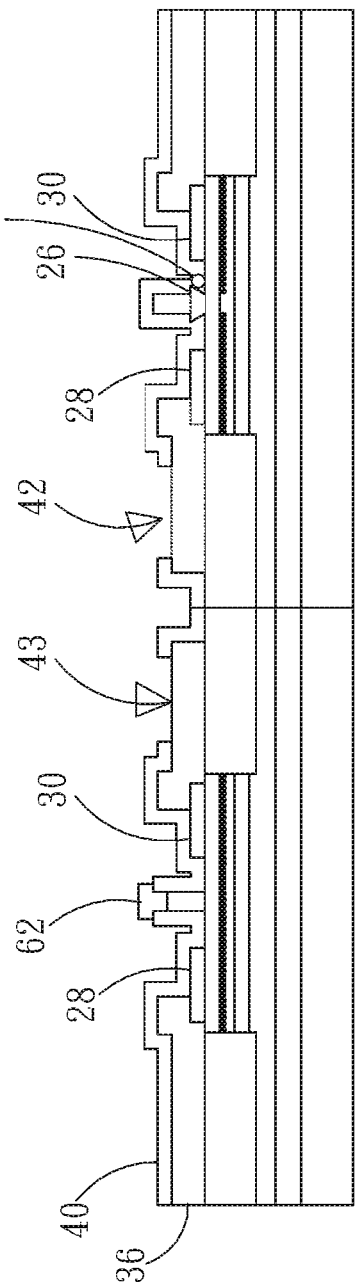

Because p-GaN is an inverted trapezoidal structure, a sloped capacitor will be formed in the field plate region 264 at the dashed circle in FIG. 7F-1 and FIG. 7F-2. This capacitor will induce the field plate effect having the main function of distributing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Figure 7G:
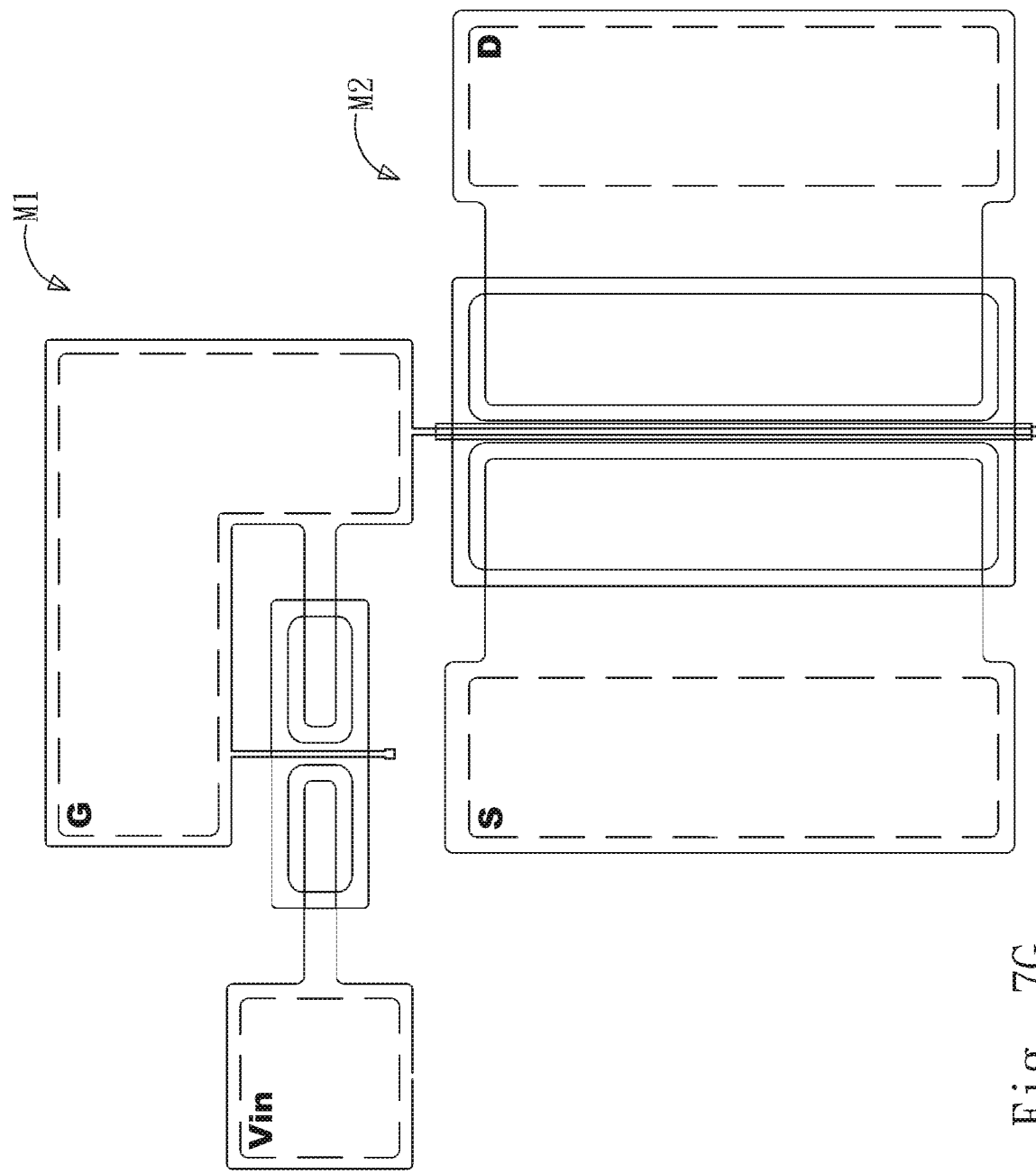
FIG. 7G shows a top view of the SEG p-GaN gate E-mode AlGaN/GaN HEMT using a D-mode AlGaN/GaN HEMT without gate dielectric layer as the gate protection device.

Step S17: Fabricate the gate field-plate metal. The metal vapor deposition and metal left-off methods are adopted to form the gate field-plate metal 62 for the D-mode HEMT, as shown in the final structures in FIG. 7F-1 and FIG. 7F-2. The gate field-plate metal 62 is adjacent to the gate field-plate dielectric layer 92. The top view of the SEG p-GaN gate E-mode AlGaN/GaN HEMT using a D-mode AlGaN/GaN HEMT without gate dielectric layer as the gate protection device is shown in FIG. 7G.

Figures 1, 8A:
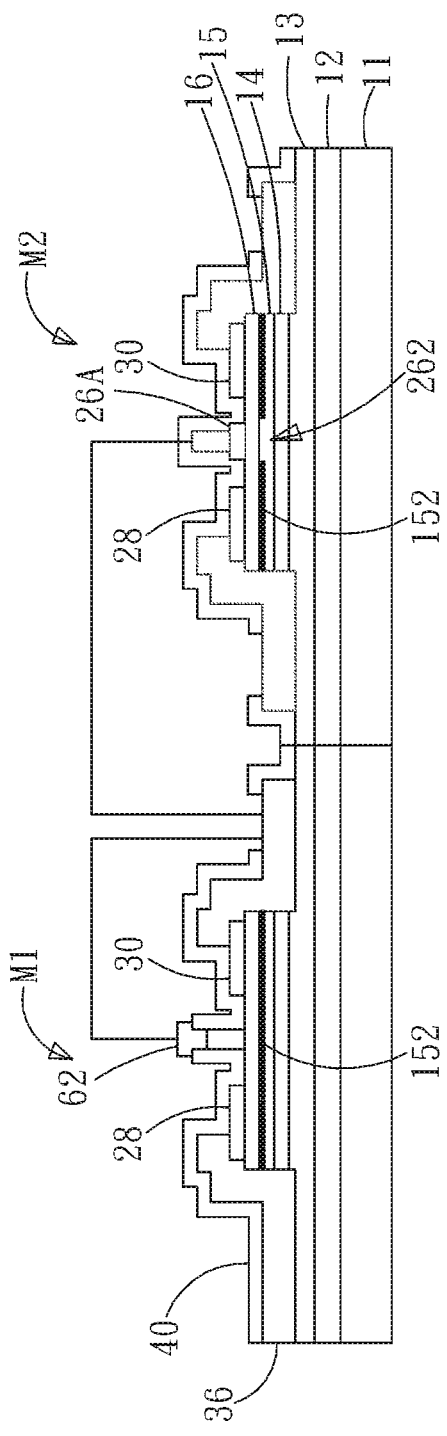
Figures 2, 8A:
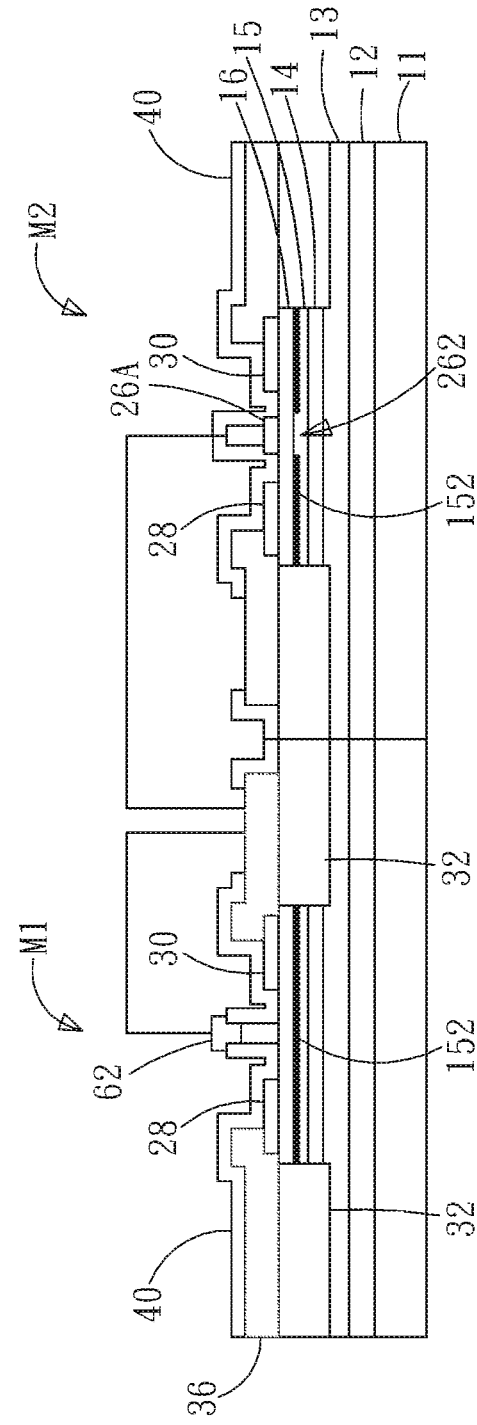

Embodiment 2: An Etched p-GaN Gate E-Mode AlGaN/GaN HEMT Using a D-Mode AlGaN/GaN HEMT without Gate Dielectric Layer as the Gate Protection Device FIG. 8A-1 and FIG. 8A-2 are schematic diagrams after device fabrication using different device isolation processes. In FIG. 8A-2, multiple-energy destructive ion implantation is adopted. In general, heavy atoms such as boron or oxygen atoms are used for isolating devices. In FIG. 8A-1, dry etching to the highly resistive i-GaN buffer layer (C-doped) can be adopted for isolating devices.

As shown in FIG. 8A-1 and FIG. 8A-2, the SEG p-GaN gate E-mode AlGaN/GaN HEMT using a D-mode AlGaN/GaN HEMT without gate dielectric layer as the gate protection device according to the present invention comprises the epitaxial structure and is divided into a left region and a right region. In the left region, a D-mode AlGaN/GaN HEMT without gate dielectric layer M1 is formed. In the right region, an SEG p-GaN gate E-mode AlGaN/GaN HEMT M2 is formed. This SEG p-GaN gate E-mode AlGaN/GaN HEMT M2 includes an etched p-GaN gate structure 26A. In addition, although the 2DEG is formed at the junction i-Al$_x$GaN/i-GaN of the i-GaN channel layer 15, due to the existence of the etched p-GaN gate structure 26A, the 2DEG below the etched p-GaN gate structure 26A in the i-GaN channel layer 15 will be depleted, giving a depletion region 262 without 2DEG.

Figure 9B:
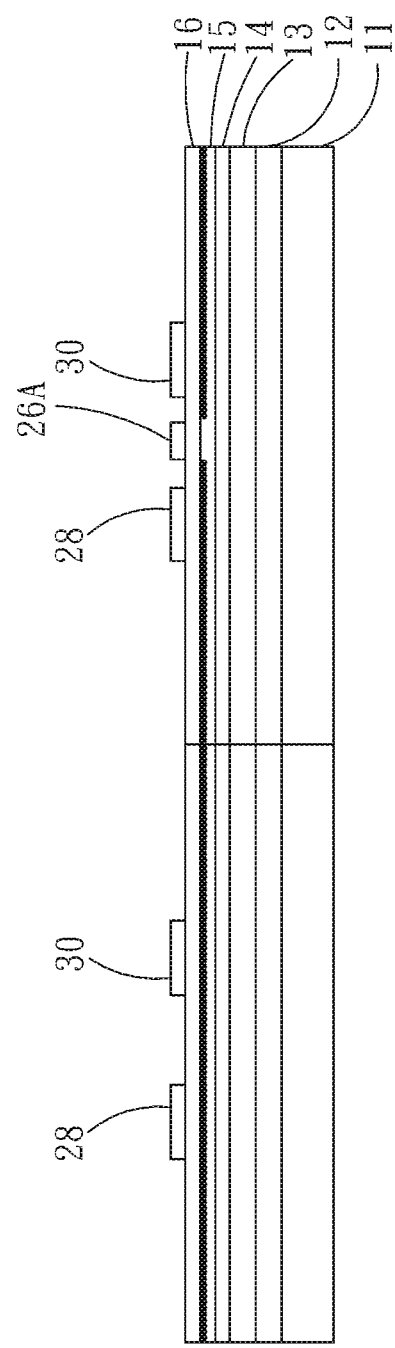
Figures 1, 9C:
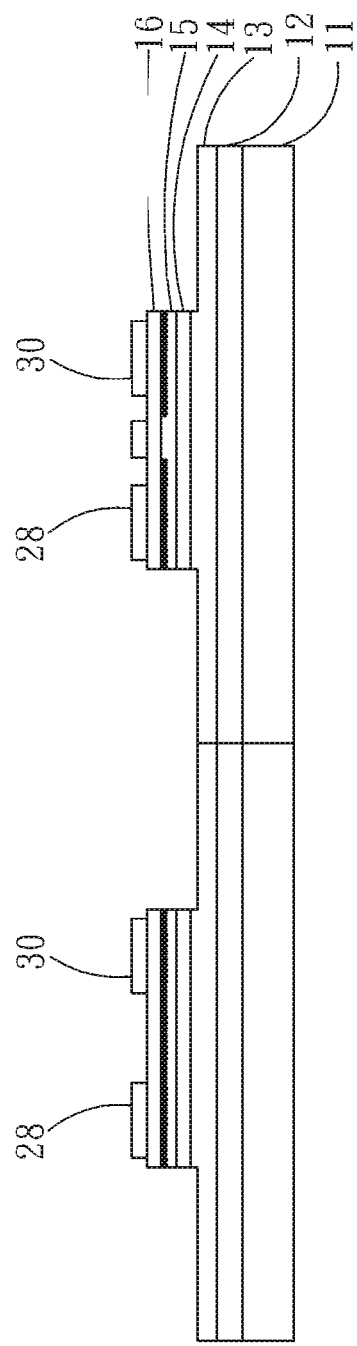
Figures 2, 9C:
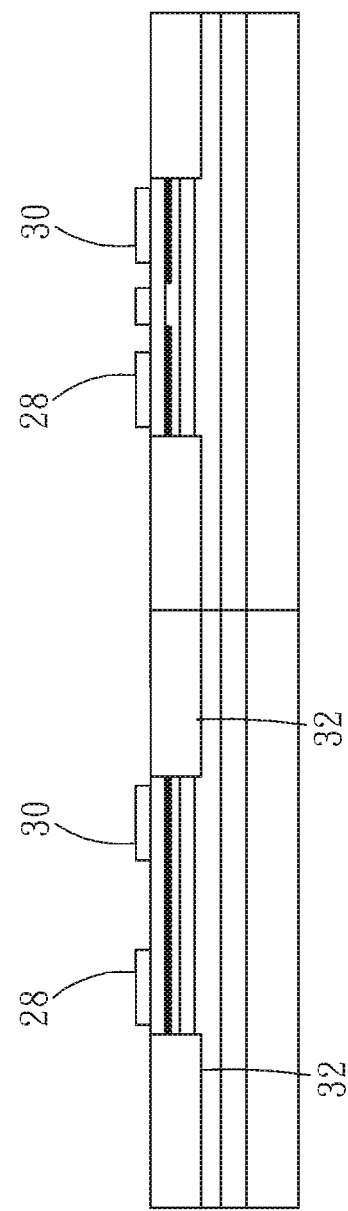
Figures 1, 9D:
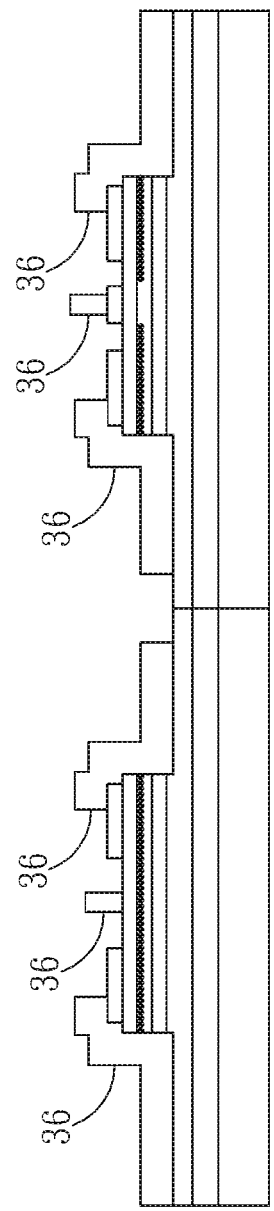
Figures 2, 9D:
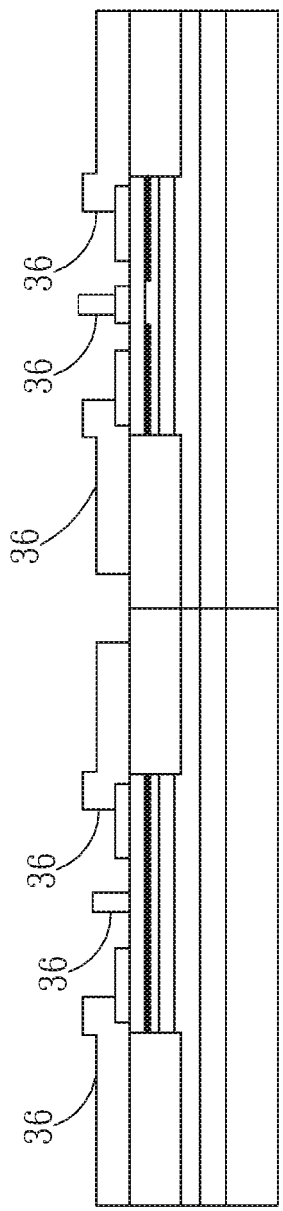
Figure 9G:
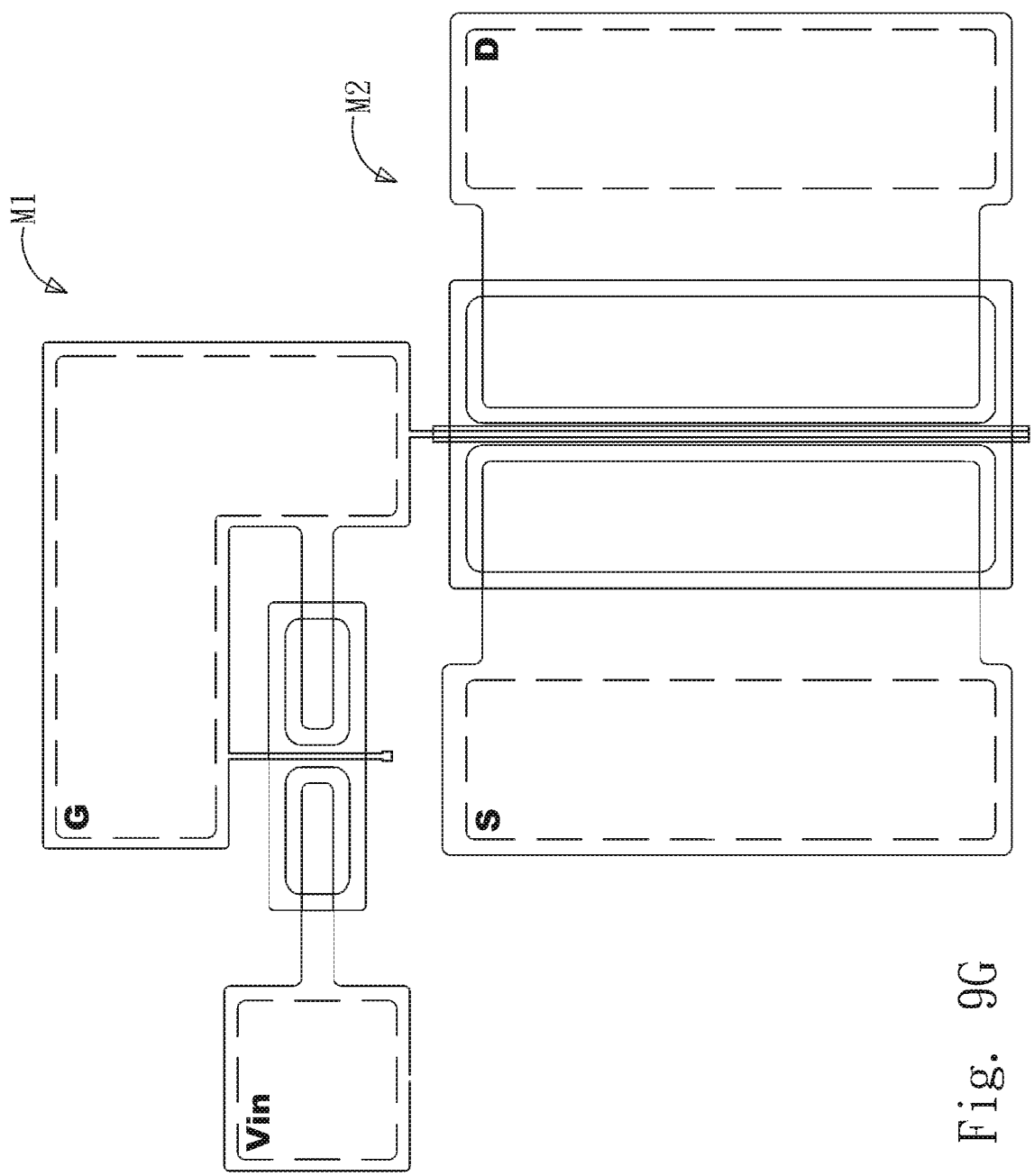
FIG. 9G shows a top view of the etched p-GaN gate E-mode AlGaN/GaN HEMT using a D-mode AlGaN/GaN HEMT without gate dielectric layer as the gate protection device.

Step S21: Fabricate the etched p-GaN gate. First, as shown in FIG. 9A, a p-GaN layer is grown on the Ga-face AlGaN/GaN epitaxial structure according to the present invention using MOCVD. Next, define the p-GaN gate region by using photoresist 22 and exposure method. Finally, dry etching is adopted to etch the p-GaN outside the region to the AlGaN blocking layer of the Ga-face AlGaN/GaN epitaxial structure according to the present invention. Then, the photoresist 22 is stripped using stripper. Thereby, the etched p-GaN gate is fabricated.

According to Embodiment 2, since the process steps as shown in FIG. 9B to FIG. 9F-1 are identical to those according to Embodiment 1 as shown in FIG. 7B to FIG. 7F-2, the details will not be repeated. The top view of the SEG p-GaN gate E-mode AlGaN/GaN HEMT using a D-mode AlGaN/GaN HEMT without gate dielectric layer as the gate protection device is shown in FIG. 7G.

Embodiment 3: An SEG p-GaN Gate and Self-Aligned Gate Metal E-Mode AlGaN/GaN HEMT Using a D-Mode AlGaN/GaN HEMT without Gate Dielectric Layer as the Gate Protection Device FIG. 10A-1 and FIG. 10A-2 are schematic diagrams after device fabrication using different device isolation processes.

Figures 1, 10A:
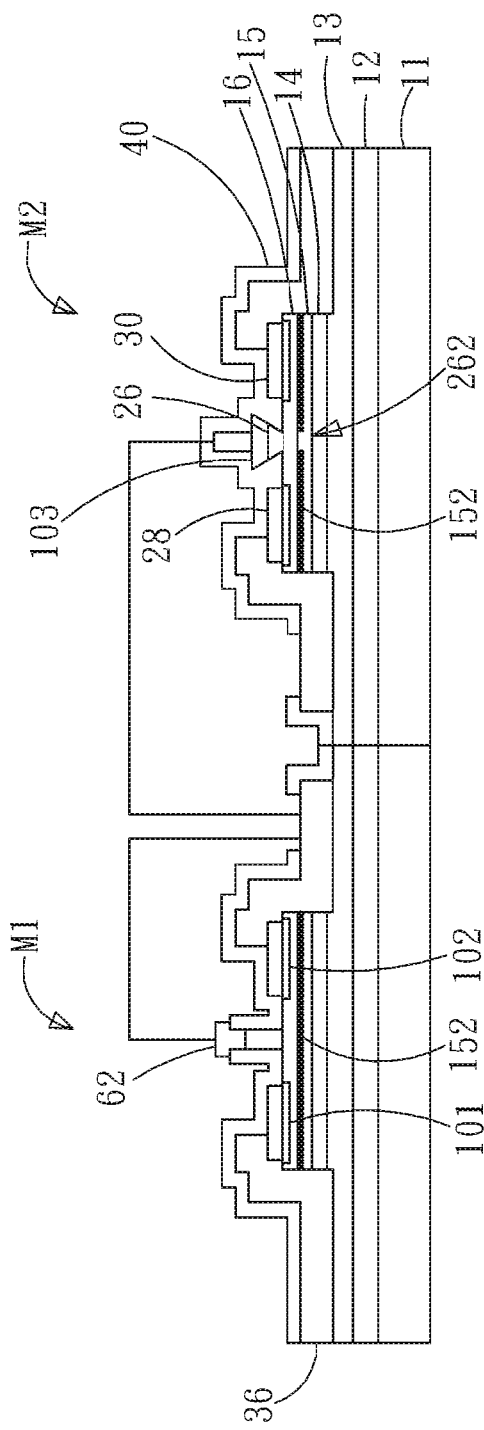
Figures 2, 10A:
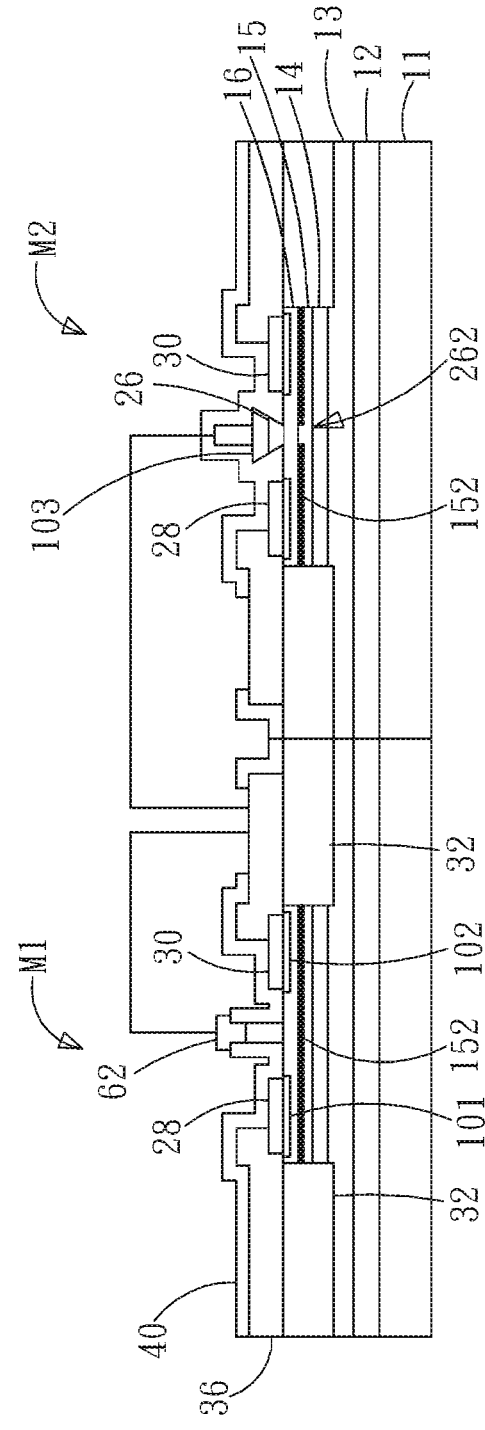

In FIG. 10A-2, multiple-energy destructive ion implantation is adopted. In general, heavy atoms such as boron or oxygen atoms are used for isolating devices. In FIG. 10A-1, dry etching to the highly resistive i-GaN buffer layer (C-doped) can be adopted for isolating devices.

As shown in FIG. 8A-1 and FIG. 8A-2, the SEG p-GaN gate and self-aligned gate metal E-mode AlGaN/GaN HEMT using a D-mode AlGaN/GaN HEMT without gate dielectric layer as the gate protection device according to the present invention comprises the epitaxial structure of AlGaN/GaN designed according to the present invention and is divided into a left region and a right region. In the left region, a D-mode AlGaN/GaN HEMT without gate dielectric layer M1 is formed. In the right region, an SEG p-GaN gate and self-aligned gate metal E-mode AlGaN/GaN HEMT M2 is formed. As shown in the FIG. 10A-1 and FIG. 10A-2, the transistor M2 according to the present embodiment comprises the epitaxial structure of AlGaN/GaN. A p-GaN inverted trapezoidal gate structure 26, a first source metal layer 28, and a first drain metal layer 30 are formed on the i-Al$_x$GaN layer of the epitaxial structure. In addition, although the 2DEG is formed at the junction i-Al$_x$GaN/i-GaN of the i-GaN channel layer, due to the existence of the p-GaN inverted trapezoidal gate structure 26, the 2DEG below the p-GaN inverted trapezoidal gate structure 26 in the i-GaN channel layer will be depleted. The i-Al$_x$GaN layer of the epitaxial structure includes a first source ion implantation region 101 and a first drain ion implantation region 102. Besides, the first source ion implantation region 101 is located below the first source metal layer 28, while the first drain ion implantation region 102 is located below the first drain metal layer 30. Moreover, a first gate metal layer 103 is disposed on the p-GaN inverted trapezoidal gate structure 26.

A thermal treatment at 700□~900□ is required for the drain and source electrodes to form ohmic contacts with i-Al$_x$GaN. In a general HEMT fabrication process, the gate metal is fabricated after the thermal treatment for the drain and source electrodes. Thereby, the Schottky contact between the gate metal and the i-Al$_x$GaN will not be damaged due to this high-temperature thermal treatment. Nonetheless, for the SEG p-GaN gate and self-aligned gate metal HEMT, the gate metal is fabricated prior to the drain and source electrodes. In order to prevent damages on the characteristics of the Schottky contact formed by the gate and the i-Al$_x$GaN by the thermal treatment, multiple ion implantation is adopted to implant n-type silicon dopants below the drain and source electrodes. Thereby, the drain and source can form ohmic contacts with the i-Al$_x$GaN without the 700□~900□ thermal treatment.

Figure 11A:
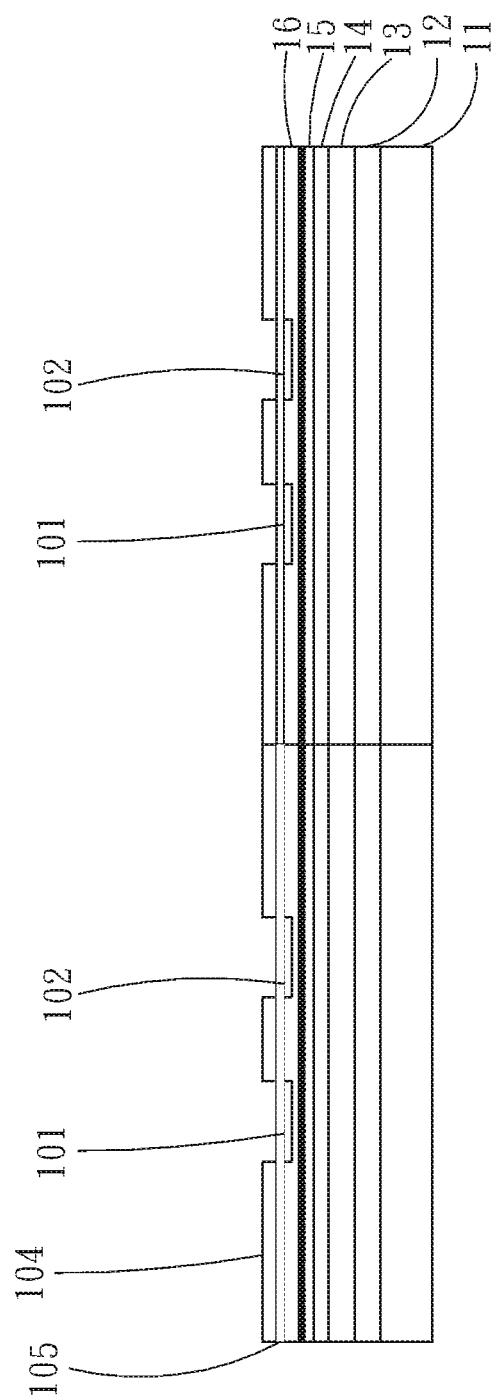
FIG. 11A shows a cross-sectional view after implanting n-type silicon dopants below the drain and source using multiple ion implantation.

Step 31: As shown in FIG. 11A, use the multiple ion implantation to implant n-type silicon dopants below the drain and source electrodes and activate by thermal treatment to form a first source ion implantation region 101 and a first drain ion implantation region 102. The ion implantation is shallow and concentration distribution of ions implanted into the i-Al$_x$GaN is Gaussian. We expect the peak value of the Gaussian distribution is as close to the surface of the i-Al$_x$GaN as possible, as shown in FIG. 11A. First, use PECVD to deposit a layer of SiO$_2$ mask 105 as a buffer layer. Thereby, in ion implantation, the peak value of the Gaussian distribution is close to the surface of the i-Al$_x$GaN. Next, use photolithography to form a patterned photoresist layer 104 and define the ion implantation regions below the drain and source electrodes. Then, the multiple ion implantation is adopted to implant n-type silicon dopants below the drain and source electrodes. Afterwards, remove the patterned photoresist layer 104 and the SiO$_2$ mask 105.

Afterwards, a thermal treatment at a temperature greater than 600□ is performed for activating the n-type silicon dopants and forming the first source ion implantation region 101 and the first drain ion implantation region 102. This thermal treatment can be performed after the step S71. In other words, after the steps of ion implantation and removal of the patterned photoresist layer 104 and the SiO$_2$ mask 105, thermal treatment at a temperature greater than 600□ is performed for activation. Alternatively, in the subsequent SEG p-GaN gate using MOCVD, the high temperature for growth can be used for activation.

Figures 1, 11B:
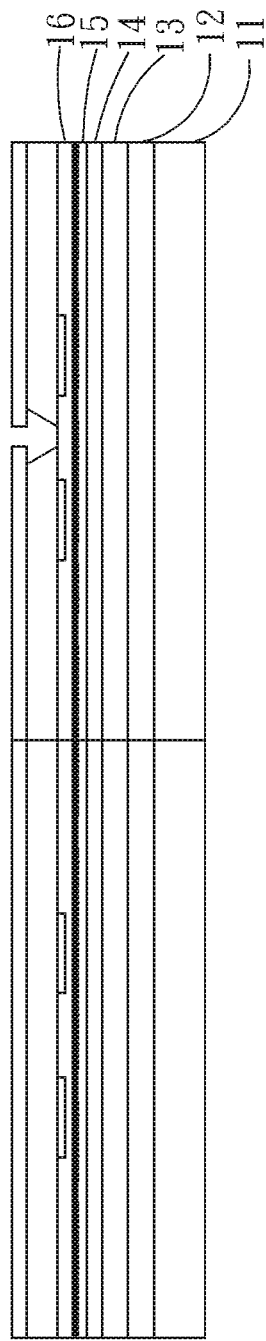
Figures 2, 11B:
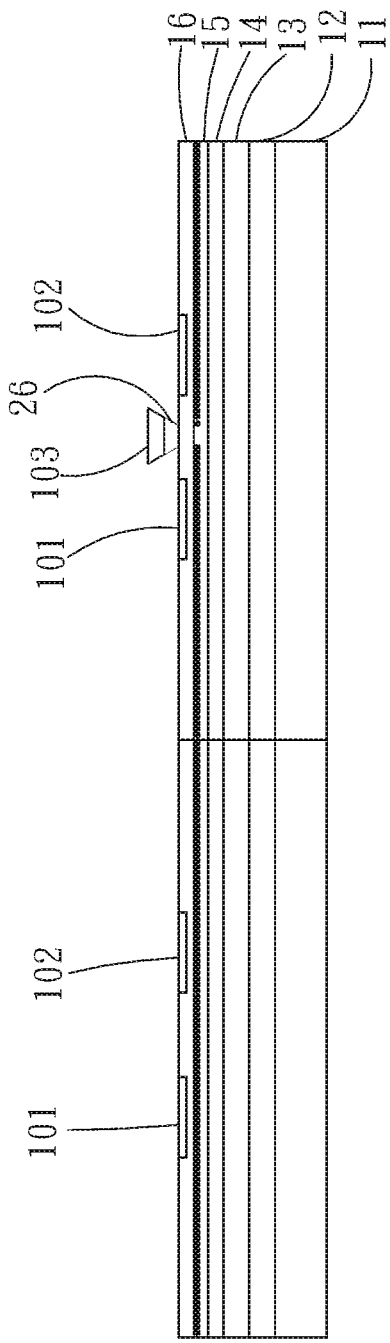

Step S32: Please refer to FIG. 11B-1 and FIG. 11B-2 as well. Define the SEG p-GaN gate and self-aligned gate metal region. Deposit a silicon dioxide mask layer 20 using PECVD with a thickness greater than 2500 nm. Next, define the gate SEG region by using photoresist and exposure method. Finally, the silicon dioxide mask layer 20 in the region is etched by a wet etching method using BOE to expose the surface of the epitaxy. Then, the photoresist is stripped using stripper. Because the wet etching is isotropic, in addition to etching downward, lateral etching will occur concurrently. Thereby, the opening of the silicon dioxide mask layer 20 will form an inverted-trapezoidal-structure opening 24.

Step S33: Form the SEG p-GaN gate and self-aligned gate metal. First, p-GaN SEG is performed using MOCVD and only the exposed surface of the epitaxy can grow p-GaN. Because the growth of p-GaN in MOCVD is also isotropic, in addition to growing upward, lateral growth will occur concurrently and thus forming an inverted trapezoidal structure of p-GaN, which is just the p-GaN inverted trapezoidal structure 26. Afterwards, gate electrode is coated using metal coating. Finally, the silicon dioxide mask layer is etched by a wet etching method and the metal outside the gate electrode region is lift off, forming the self-aligned gate metal 102 on the p-GaN inverted trapezoidal structure 26, as the structure shown in FIG. 11B-1 and FIG. 11B-2.

Figure 11C:
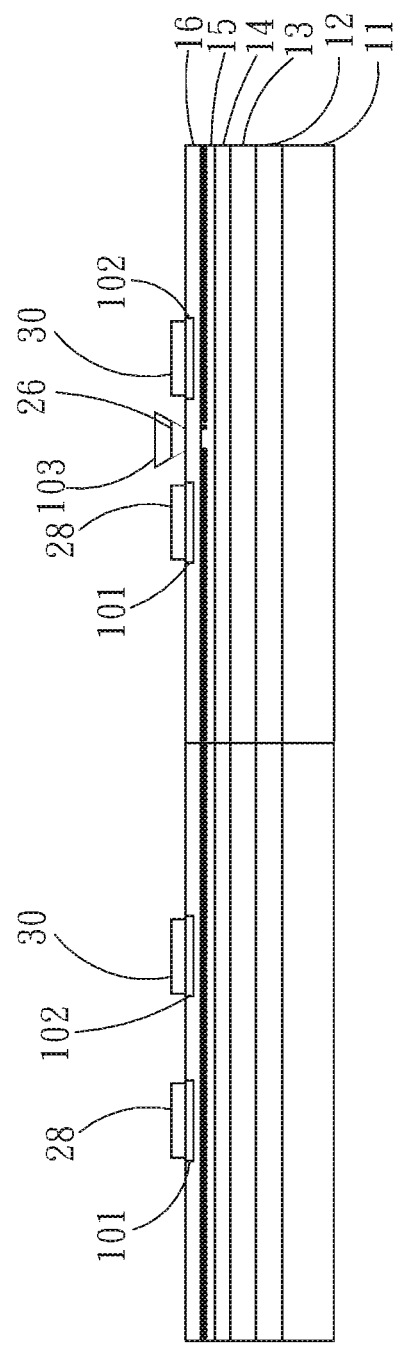
FIG. 11C shows a cross-sectional view after the drain and source metals corresponding to FIG. 11B-2 are fabricated.

Step S34: Use metal vapor deposition and lift-off methods to form drain and source electrodes 28, 30, as shown in FIG. 11C.

Figures 1, 11D:
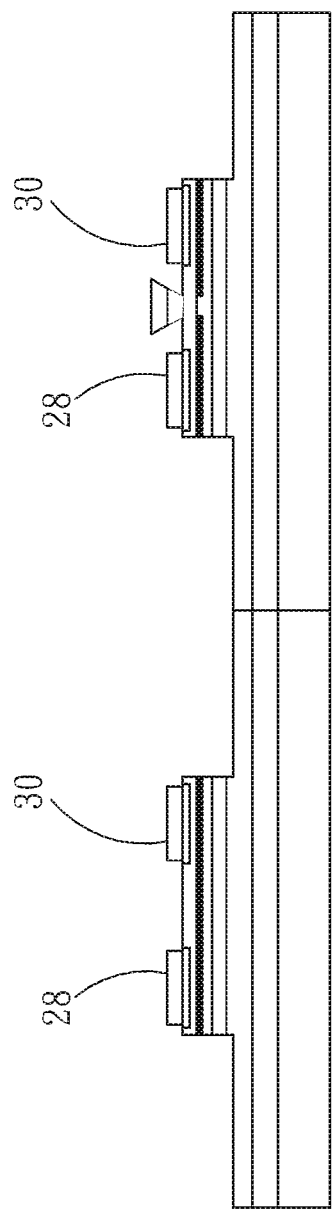
Figures 2, 11D:
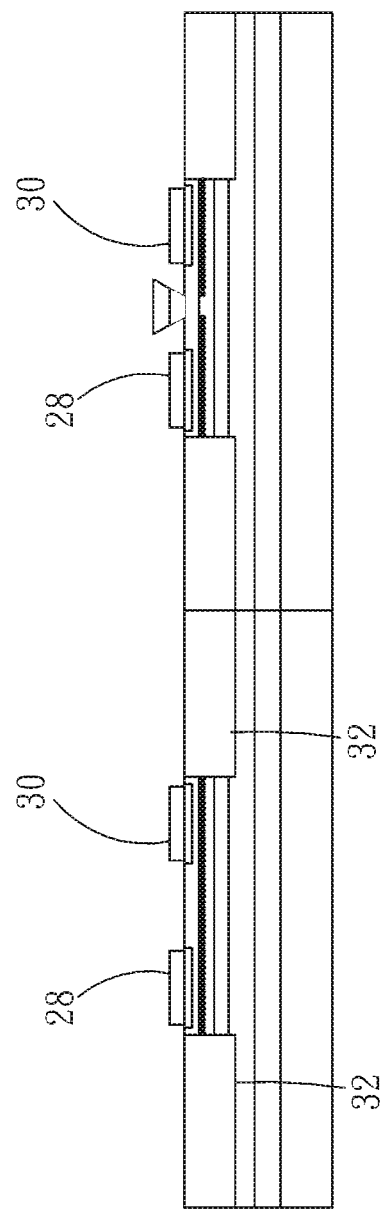

Step S35: Perform device isolation process. As shown in FIG. 11D-1 and FIG. 11D-2, multiple-energy destructive ion implantation is adopted. Alternatively, dry etching to the highly resistive i-GaN buffer layer (C-doped) can be adopted for isolating devices.

Figures 1, 11E:
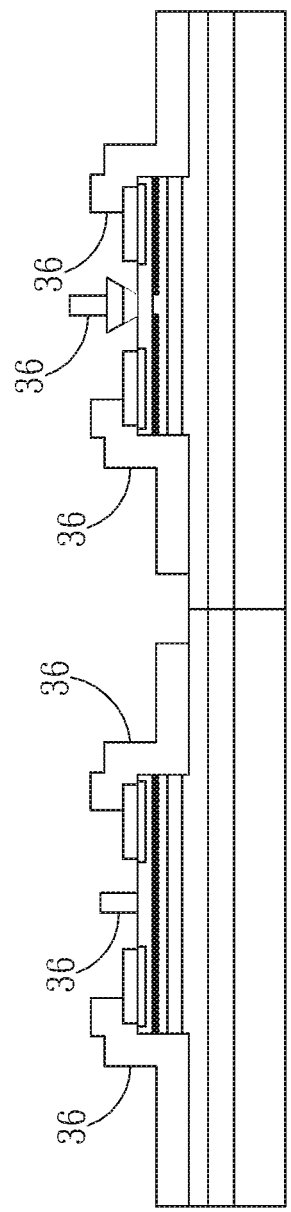
Figures 2, 11E:
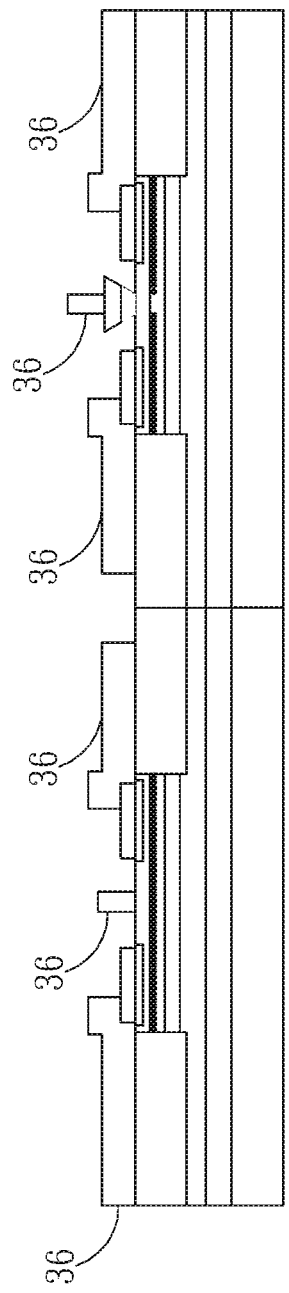

Step S36: Perform the metal wiring process. Metal vapor deposition and lift-off methods are used for forming the metal layer 36 and forming bonding pads for the drain, and source electrodes as well as the metal interconnection, as shown in FIG. 11E-1 or FIG. 11E-2.

Figures 1, 11F:
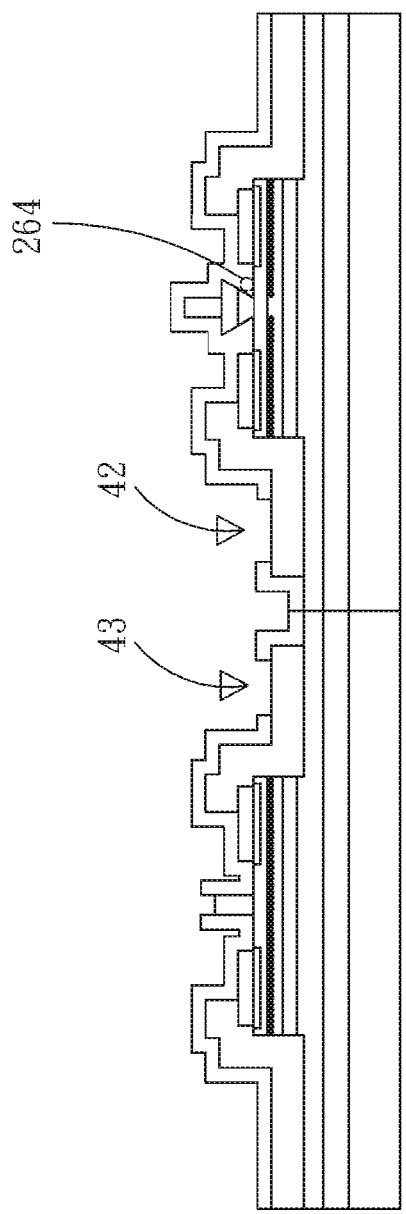
Figures 2, 11F:
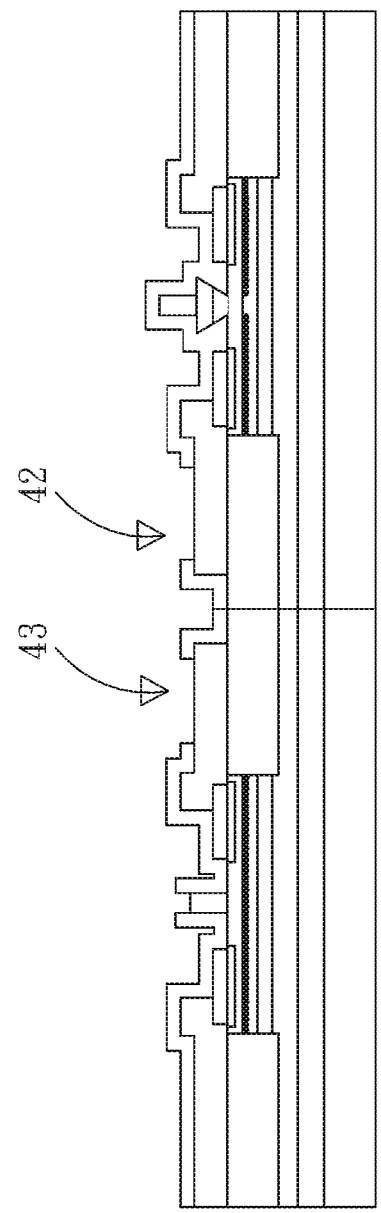
Figure 11H:
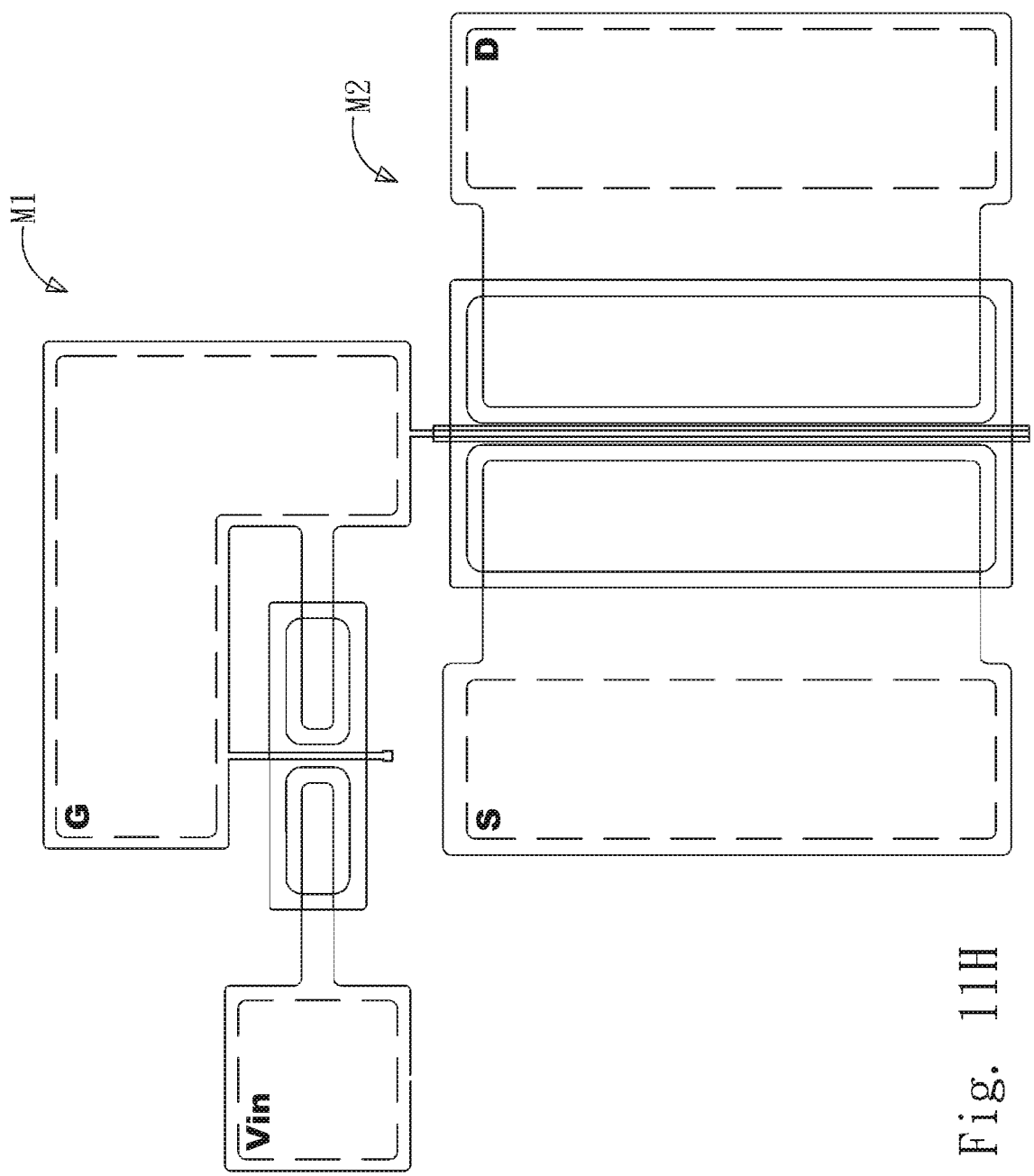
FIG. 11H shows a top view of the SEG p-GaN gate and self-aligned gate metal E-mode AlGaN/GaN HEMT using a D-mode AlGaN/GaN HEMT without gate dielectric layer as the gate protection device.
Figure 13:
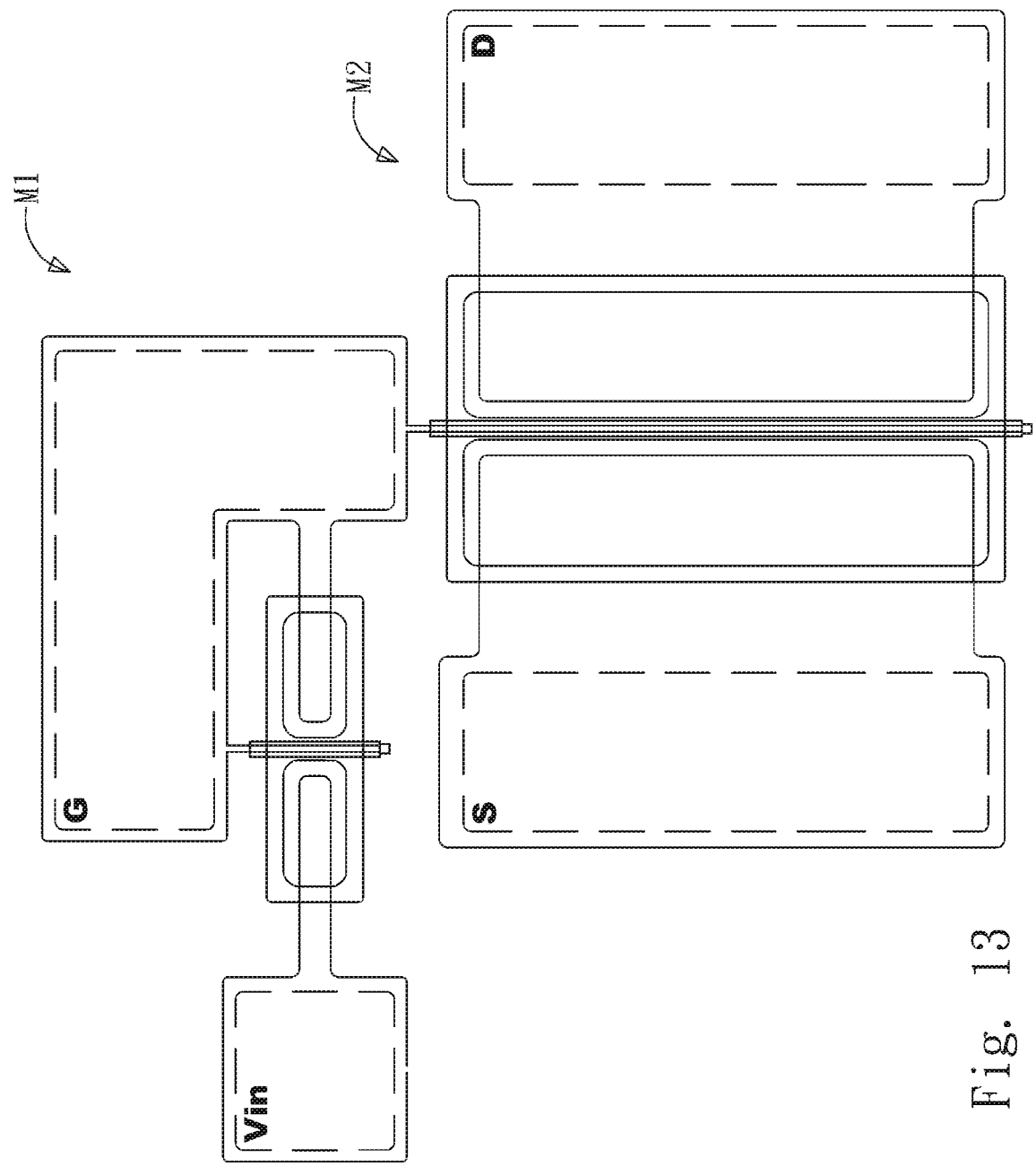
FIG. 13 shows a top view corresponding to FIG. 12A-1 and FIG. 12A-2.

Step S37: Pattern the passivation layer. A passivation layer 40 is grown by PECVD. Finally, the passivation layer 40 is patterned for exposing a portion of the metal layer 36, as shown in FIG. 11F-1 and FIG. 11F-2. For example, etching is adopted for exposing the bonding pad region for subsequent wire bonding.

Because p-GaN is an inverted trapezoidal gate structure 26, as shown in FIG. 18A-1 and FIG. 18A-2, a sloped capacitor will be formed in the filed plate region 264 at the dashed circle. This capacitor will induce the field plate effect having the main function of distributing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Step S38: Fabricate the gate field-plate metal. The metal vapor deposition and metal left-off methods are adopted to form the gate field-plate metal 62 for the D-mode HEMT, as shown in the final structures in FIG. 11G-1 and FIG. 11G-2. The gate field-plate metal 62 is adjacent to the gate field-plate dielectric layer 92.

The major difference between the SEG p-GaN gate and self-align gate metal E-mode AlGaN/GaN HEMT and the SEG p-GaN gate HEMT described in the previous embodiment is the contact area ratio of the gate metal to the SEG p-GaN gate. According to the principle of the previous embodiment, when Vgs is much greater than VF, the conduction current of the SBD between the gate G and the drain D is so large that holes cannot be confined and accumulated in the channel below the gate G. Massive holes will be injected into the channel layer and making the gate leakage current increase rapidly. Hence, the transistor can no longer operate in the desired condition. Accordingly, the limited value of Vgs is always the shortcoming of a p-GaN gate E-mode AlGaN/GaN HEMT. Fortunately, the contact area ratio of the SEG p-GaN gate and self-aligned gate metal E-mode AlGaN/GaN HEMT to the SEG p-GaN gate is much larger than the one according to the previous embodiment (completely covered p-GaN gate). Thereby, when Vgs is greater than VF, the injected holes by the gate is more uniform. The electric field distribution is more uniform as well. Accordingly, Vgs max (self-aligned gate metal) is greater than Vgs max.

The following Embodiment 4, Embodiment 5, and Embodiment 6 correspond to Embodiment 1, Embodiment 2, and Embodiment 3, respectively. The difference is that a D-mode AlGaN/GaN HEMT with gate dielectric layer is used as the gate protection device, as shown in the equivalent circuit in FIG. 4E-2. The difference between a D-mode HEMT without and with the gate dielectric layer 72 is that the pinch-off voltage Vp of a D-mode HEMT without the gate dielectric layer 72 will be smaller than that of one with the gate dielectric layer 72. The advantage of a higher pinch-off voltage Vp is that the voltage to enter the saturation region is larger. As shown in the equivalent circuit, in the saturation region, the device becomes a variable resistor with high resistance. Accordingly, the total accumulated resistance for a higher pinch-off voltage Vp is smaller, leading to lower power consumption.

Embodiment 4: An SEG p-GaN Gate E-Mode AlGaN/GaN HEMT Using a D-Mode AlGaN/GaN HEMT with Gate Dielectric Layer as the Gate Protection Device As shown in FIG. 12A-1 and FIG. 12A-2, the characteristics of the SEG p-GaN gate E-mode AlGaN/GaN HEMT using a D-mode AlGaN/GaN HEMT with gate dielectric layer as the gate protection device according to the present invention include the epitaxial structure of AlGaN/GaN designed according to the present invention and a p-GaN inverted trapezoidal gate structure 26 located on a first i-Al$_x$GaN layer. Although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted. FIG. 12A-1 and FIG. 12A-2 are schematic diagrams after device fabrication using different device isolation processes. In FIG. 12A-2, multiple-energy destructive ion implantation is adopted. In general, heavy atoms such as boron or oxygen atoms are used for isolating devices. In FIG. 12A-1, dry etching to the highly resistive i-GaN buffer layer (C-doped) can be adopted for isolating devices.

The SEG p-GaN gate E-mode AlGaN/GaN HEMT using a D-mode AlGaN/GaN HEMT with gate dielectric layer as the gate protection device according to the present invention comprises the epitaxial structure of AlGaN/GaN designed according to the present invention and is divided into a left region and a right region. In the left region, a D-mode AlGaN/GaN HEMT with gate dielectric layer M1 is formed. In the right region, an SEG p-GaN gate E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted.

The process steps as shown in FIG. 7A to FIG. 7F according to Embodiment 4 are identical to those according to Embodiment 1. The only difference is that between the steps of FIG. 7C and FIG. 7D, a step is added for fabricating the gate dielectric layer of the D-mode AlGaN/GaN HEMT with gate dielectric layer M1 in the left region.

Figures 1, 14A:
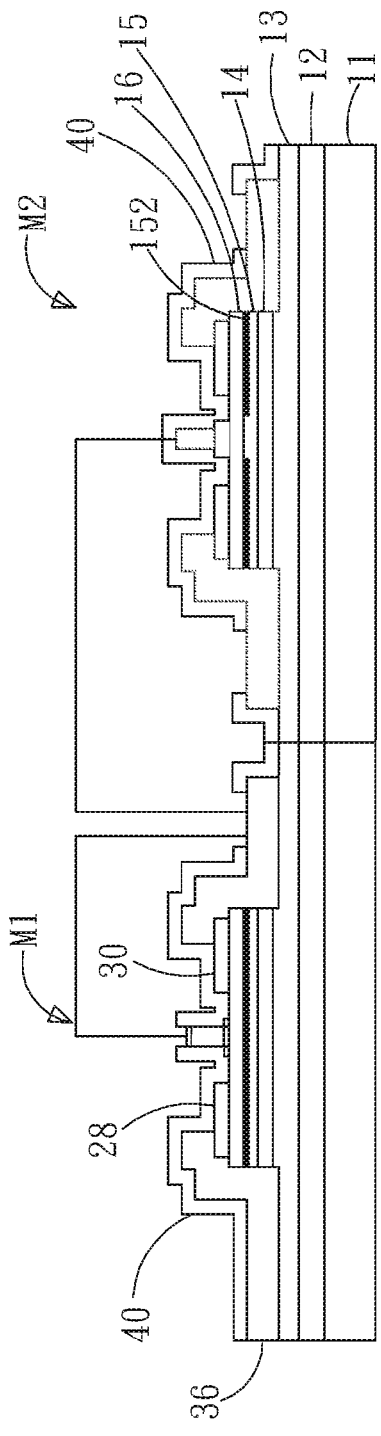
Figures 2, 14A:
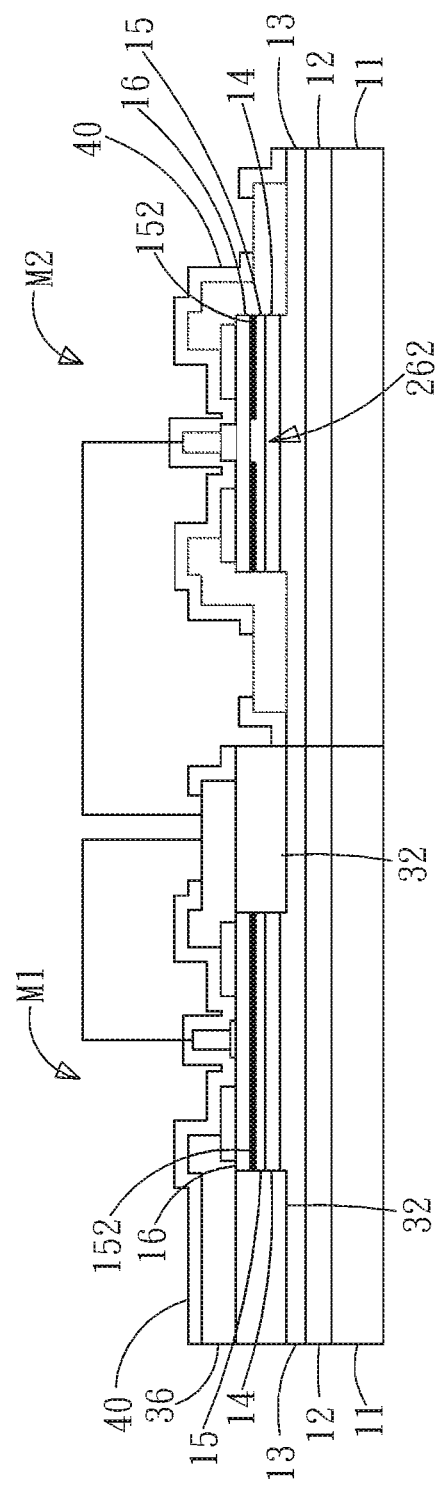
Figure 15:
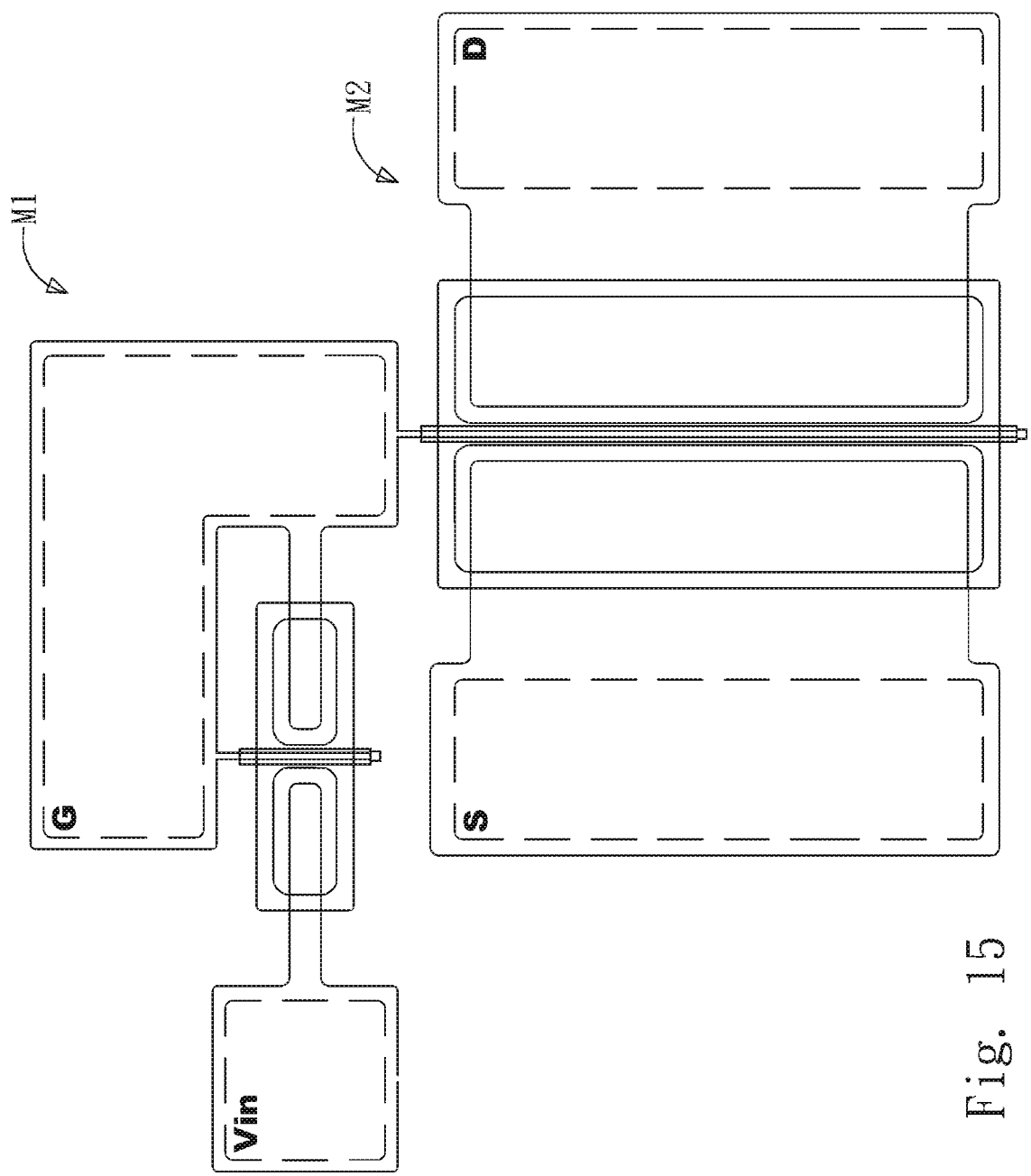
FIG. 15 shows a top view corresponding to FIG. 14A-1 and FIG. 14A-2.

Embodiment 5: An Etched p-GaN Gate E-Mode AlGaN/GaN HEMT Using a D-Mode AlGaN/GaN HEMT with Gate Dielectric Layer as the Gate Protection Device FIG. 14A-1 and FIG. 14A-2 are schematic diagrams after device fabrication using different device isolation processes. In FIG. 14A-2, multiple-energy destructive ion implantation is adopted. In general, heavy atoms such as boron or oxygen atoms are used for isolating devices. In FIG. 14A-1, dry etching to the highly resistive i-GaN buffer layer (C-doped) can be adopted for isolating devices.

As shown in FIG. 14A-1 and FIG. 14A-2, the SEG p-GaN gate E-mode AlGaN/GaN HEMT using a D-mode AlGaN/GaN HEMT with gate dielectric layer as the gate protection device according to the present invention comprises the epitaxial structure and is divided into a left region and a right region. In the left region, a D-mode AlGaN/GaN HEMT with gate dielectric layer M1 is formed. In the right region, an SEG p-GaN gate E-mode AlGaN/GaN HEMT M2 is formed. This SEG p-GaN gate E-mode AlGaN/GaN HEMT M2 includes an etched p-GaN gate structure 26A. In addition, although the 2DEG is formed at the junction i-Al$_x$GaN/i-GaN of the i-GaN channel layer 15, due to the existence of the etched p-GaN gate structure 26A, the 2DEG below the etched p-GaN gate structure 26A in the i-GaN channel layer 15 will be depleted, giving a depletion region 262 without 2DEG.

Step S51: Fabricate the etched p-GaN gate. First, as shown in FIG. 9A, a p-GaN layer is grown on the Ga-face AlGaN/GaN epitaxial structure according to the present invention using MOCVD. Next, define the p-GaN gate region by using photoresist 22 and exposure method. Finally, dry etching is adopted to etch the p-GaN outside the region to the AlGaN blocking layer of the Ga-face AlGaN/GaN epitaxial structure according to the present invention. Then, the photoresist 22 is stripped using stripper. Thereby, the etched p-GaN gate structure 26A is fabricated.

The process steps as shown in FIG. 9A to FIG. 9F according to Embodiment 5 are identical to those according to Embodiment 2. The only difference is that between the steps of FIG. 9C and FIG. 9D, a step is added for fabricating the gate dielectric layer 72 of the D-mode AlGaN/GaN HEMT with gate dielectric layer M1 in the left region.

Figures 1, 16A:
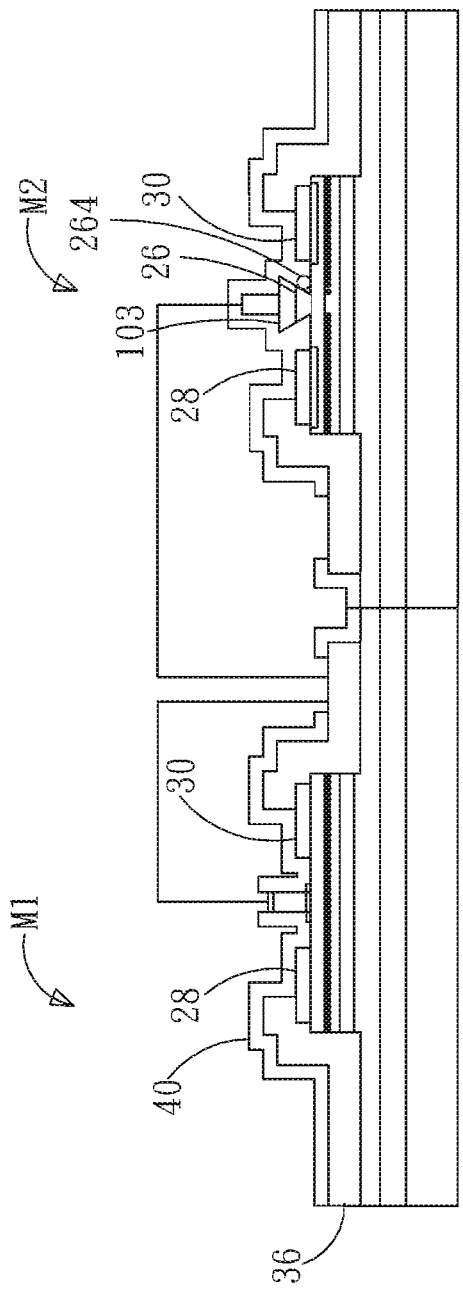
Figures 2, 16A:
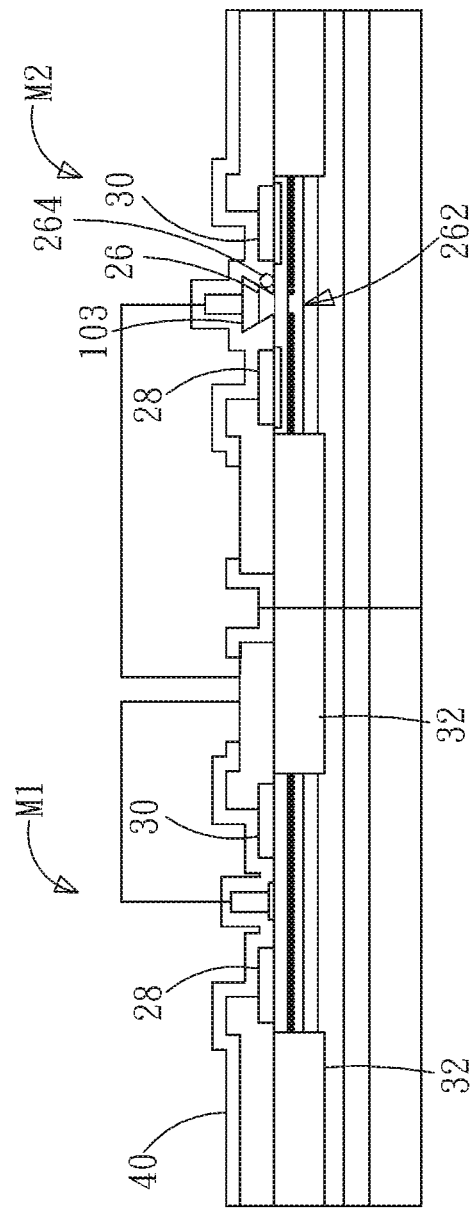
Figure 17:
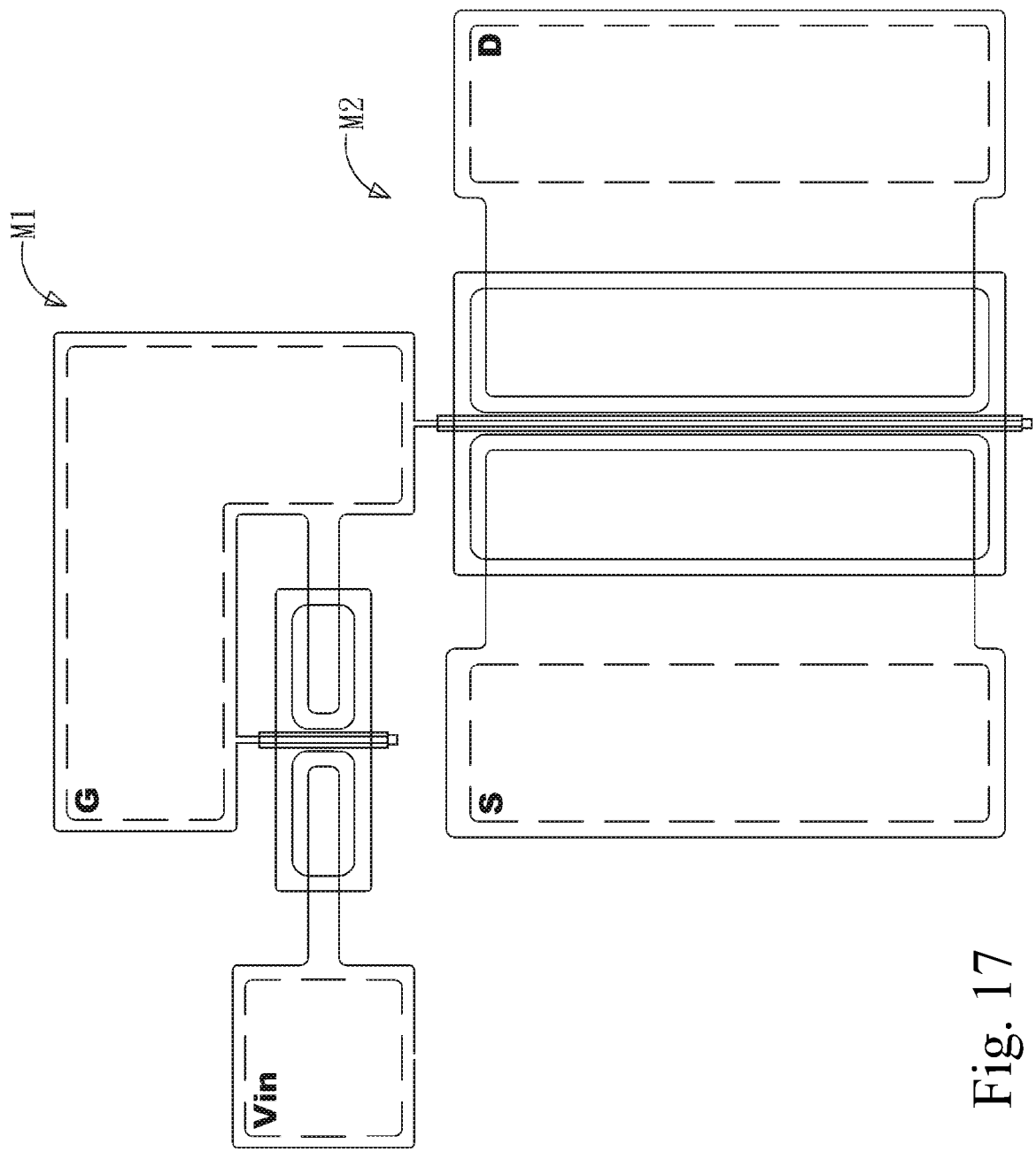
FIG. 17 shows a top view corresponding to FIG. 16A-1 and FIG. 16A-2.

Embodiment 6: An SEG p-GaN Gate and Self-Aligned Gate Metal E-Mode AlGaN/GaN HEMT Using a D-Mode AlGaN/GaN HEMT with Gate Dielectric Layer as the Gate Protection Device FIG. 16A-1 and FIG. 16A-2 are schematic diagrams after device fabrication using different device isolation processes. In FIG. 16A-2, multiple-energy destructive ion implantation is adopted. In general, heavy atoms such as boron or oxygen atoms are used for isolating devices. In FIG. 16A-1, dry etching to the highly resistive i-GaN buffer layer (C-doped) can be adopted for isolating devices.

As shown in FIG. 16A-1 and FIG. 16A-2, the SEG p-GaN gate and self-aligned gate metal E-mode AlGaN/GaN HEMT using a D-mode AlGaN/GaN HEMT with gate dielectric layer as the gate protection device according to the present invention comprises the epitaxial structure of AlGaN/GaN designed according to the present invention and is divided into a left region and a right region. In the left region, a D-mode AlGaN/GaN HEMT with gate dielectric layer M1 is formed. In the right region, an SEG p-GaN gate and self-aligned gate metal E-mode AlGaN/GaN HEMT M2 is formed. As shown in the FIG. 16A-1 and FIG. 16A-2, the transistor M2 according to the present embodiment comprises the epitaxial structure of AlGaN/GaN. A p-GaN inverted trapezoidal gate structure 26, a first source metal layer 28, and a first drain metal layer 30 are formed on the i-$Al_x$GaN layer of the epitaxial structure. In addition, although the 2DEG is formed at the junction i-$Al_x$GaN/i-GaN of the i-GaN channel layer, due to the existence of the p-GaN inverted trapezoidal gate structure 26, the 2DEG below the p-GaN inverted trapezoidal gate structure 26 in the i-GaN channel layer will be depleted. The i-$Al_x$GaN layer of the epitaxial structure includes a first source ion implantation region 101 and a first drain ion implantation region 102. Besides, the first source ion implantation region 101 is located below the first source metal layer 28, while the first drain ion implantation region 102 is located below the first drain metal layer 30. Moreover, a first gate metal layer 103 is disposed on the p-GaN inverted trapezoidal gate structure 26.

The process steps as shown in FIG. 11A to FIG. 11G according to Embodiment 6 are identical to those according to Embodiment 2. The only difference is that between the steps of FIG. 9D and FIG. 9E, a step is added for fabricating the gate dielectric layer 72 of the D-mode AlGaN/GaN HEMT with gate dielectric layer M1 in the left region.

As shown in FIG. 18-A and FIG. 18-B, which show equivalent circuits of the source of a D-mode AlGaN/GaN HEMT without gate dielectric layer connecting to a p-GaN gate E-mode AlGaN/GaN HEMT and cascoding to a D-mode AlGaN/GaN HEMT (1) without gate dielectric layer and (2) with the gate dielectric layer 72. The source and the gate of the D-mode AlGaN/GaN HEMT without gate dielectric layer M1 are connected electrically using a fabrication method. In other words, the gate and the source are shorted (Vgs=0V). Then the D-mode AlGaN/GaN HEMT M1 with Vgs=0V acts as the gate protection device for the p-GaN gate E-mode AlGaN/GaN HEMT M2. The drain of M2 and the source of M3 are connected electrically. M3 is a D-mode AlGaN/GaN HEMT (1) without gate dielectric layer or (2) with the gate dielectric layer 72. Besides, the gate of M3 and the source of M2 are connected electrically for enabling a greater off-state breakdown voltage at Vin=0V (off-state) for the hybrid device of M1+M2+M3. Since M3 is a D-mode AlGaN/GaN HEMT, the off-state breakdown voltage of M3 is greater than the off-state breakdown voltage of M2.

As shown in FIG. 18-C and FIG. 18-D, which show equivalent circuits of the source of a D-mode AlGaN/GaN HEMT with gate dielectric layer connecting to a p-GaN gate E-mode AlGaN/GaN HEMT and cascoding to a D-mode AlGaN/GaN HEMT (1) without gate dielectric layer and (2) with the gate dielectric layer 72. The source and the gate of the D-mode AlGaN/GaN HEMT without gate dielectric layer M1 are connected electrically using a fabrication method. In other words, the gate and the source are shorted (Vgs=0V). Then the D-mode AlGaN/GaN HEMT M1 with Vgs=0V acts as the gate protection device for the p-GaN gate E-mode AlGaN/GaN HEMT M2. The drain of M2 and the source of M3 are connected electrically. M3 is a D-mode AlGaN/GaN HEMT (1) without gate dielectric layer or (2) with the gate dielectric layer 72. Besides, the gate of M3 and the source of M2 are connected electrically.

Figures 1, 19A:
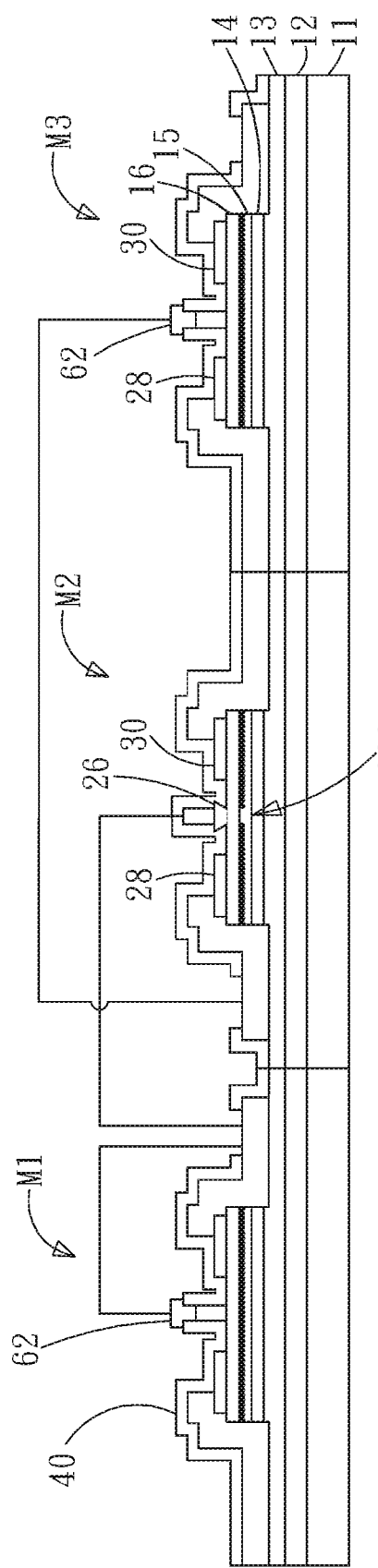
Figures 2, 19A:
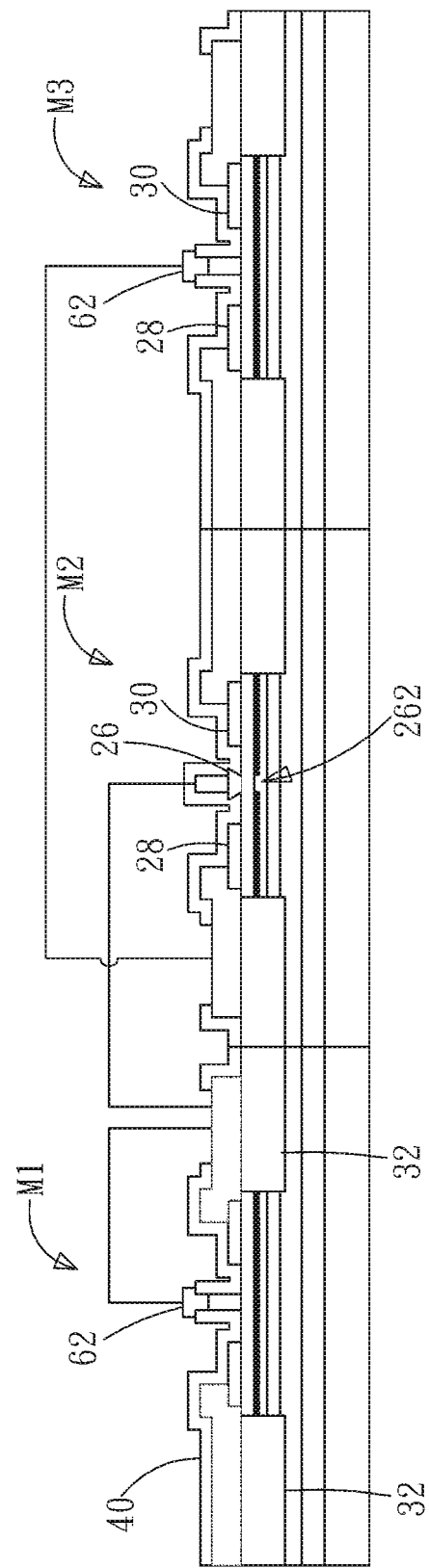

Embodiment 7: As Shown in FIG. 19A-1 and FIG. 19A-2, a Hybrid E-Mode AlGaN/GaN HEMT Formed by the SEG p-GaN Gate E-Mode AlGaN/GaN HEMT Using a D-Mode AlGaN/GaN HEMT without Gate Dielectric Layer as the Gate Protection Device Cascoding to a D-Mode AlGaN/GaN HEMT without Gate Dielectric Layer A p-GaN gate E-mode AlGaN/GaN HEMT usually exhibits slight Early effect, which means that the channel cannot be shut off completely and thus leading to increases of the current Ids as Vds increases when the device is operated in the saturation region with the gate voltage Vg fixed. The cascode D-mode AlGaN/GaN HEMT according to the present invention just can solve this problem.

As shown in FIG. 19A-1 and FIG. 19A-2, the hybrid E-mode AlGaN/GaN HEMT according to Embodiment 7 comprises the epitaxial structure of AlGaN/GaN designed according to the present invention and is divided into a left region, a middle region, and a right region. In the left region, a D-mode AlGaN/GaN HEMT without gate dielectric layer M1 is formed. In the middle region, an SEG p-GaN gate E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-$Al_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT without gate dielectric layer M3 is formed.

Figures 1, 20D:
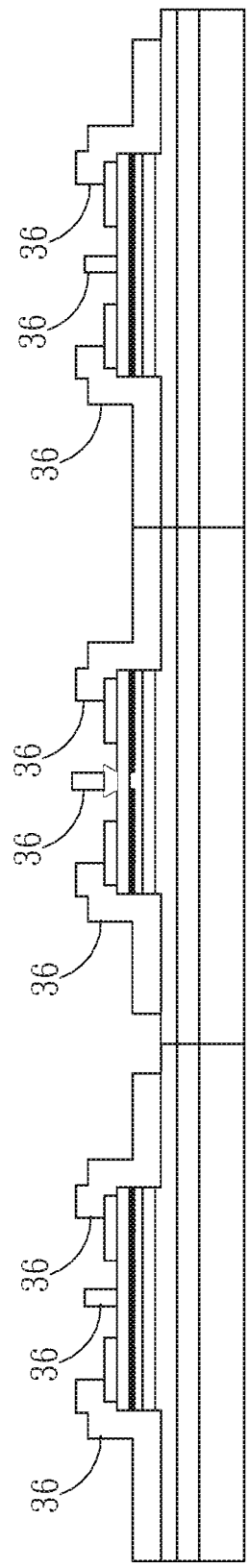
Figures 2, 20D:
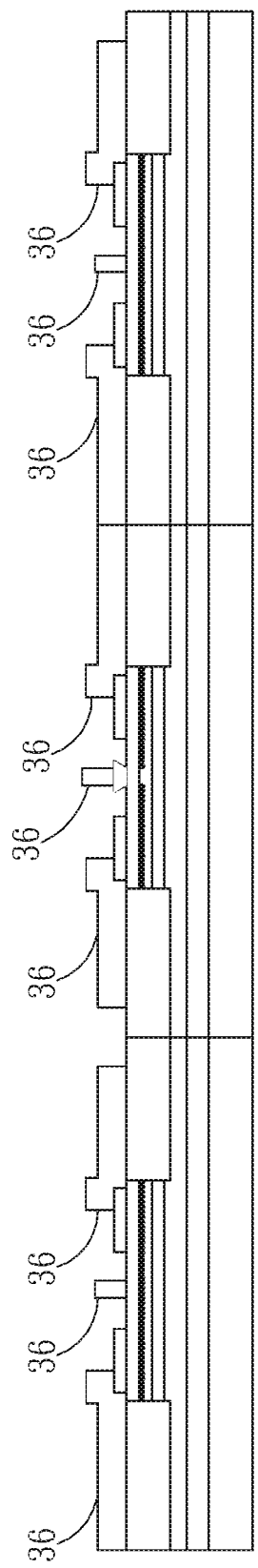
Figure 20G:
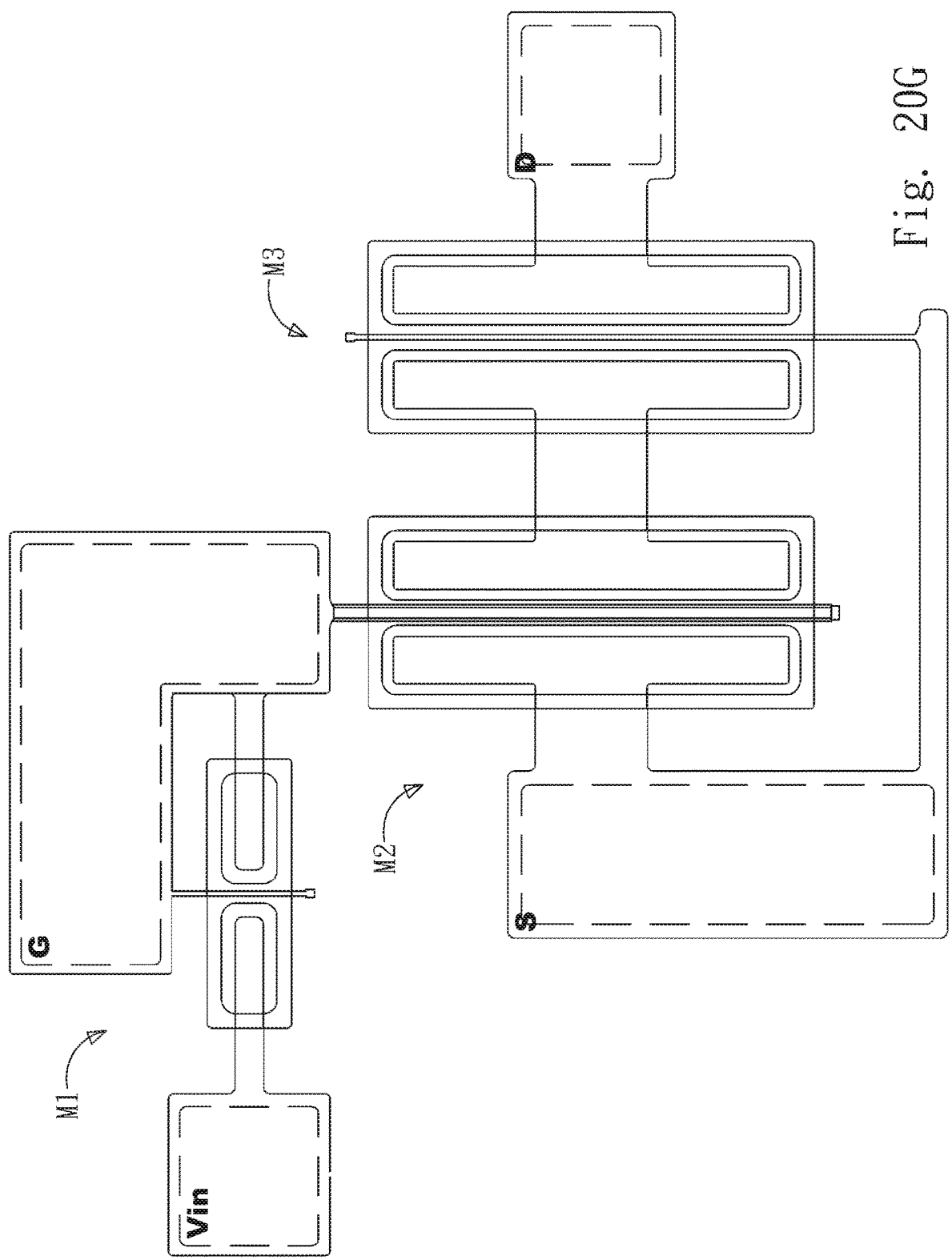
FIG. 20G shows a top view corresponding to FIG. 20A-1 and FIG. 20A-2.

The process for fabricating Embodiment 7 will be described as follows. First, as shown in FIG. 20A, an epitaxial structure of Ga-face AlGaN/GaN according to the present invention is provided. The left region is set to fabricate the D-mode AlGaN/GaN HEMT without gate dielectric layer. The middle region is set to fabricate the SEG p-GaN gate E-mode AlGaN/GaN HEMT. The right region is set to fabricate the D-mode AlGaN/GaN HEMT without gate dielectric layer. Next, as described in the previous fabrication method, form a patterned silicon dioxide mask layer 20 having an inverted-trapezoidal-structure opening 24 on the epitaxial structure of Ga-face AlGaN/GaN for defining the region for the SEG gate. The thickness of this silicon dioxide mask layer 20 is around 100 to 200 nm. Then, p-GaN is grown in the inverted-trapezoidal-structure opening 24 and forming a p-GaN inverted trapezoidal structure 26. Afterwards, the patterned silicon dioxide mask layer 20 is removed. Then, as described above, because the p-GaN SEG region occupies only a small portion of the whole epitaxy wafer, the p-type doping concentration in p-GaN will be equal to ⅓ to ¼ of the expected.

Then, use metal vapor deposition and metal lift-off methods to form the drain and source electrodes. Afterwards, a thermal treatment is performed at 700~900° C. for 30 seconds to make the drain and source electrodes become ohmic contacts 30, 28, as shown in FIG. 20B.

Next, use destructive ion implantation as shown in FIG. 20C-2 or the dry etching to the highly resistive i-GaN buffer layer (C-doped) as shown in FIG. 20C-1 to isolate devices.

Afterwards, use metal vapor deposition and metal lift-off methods to form the gate electrode, the bonding pad regions for the drain and source electrodes, and the interconnection metal layer 36. Alternatively, in this step, the gate bonding pad region connected electrically with the gate electrode can be formed concurrently, as the structures shown in FIG. 20D.

Figure 20E:
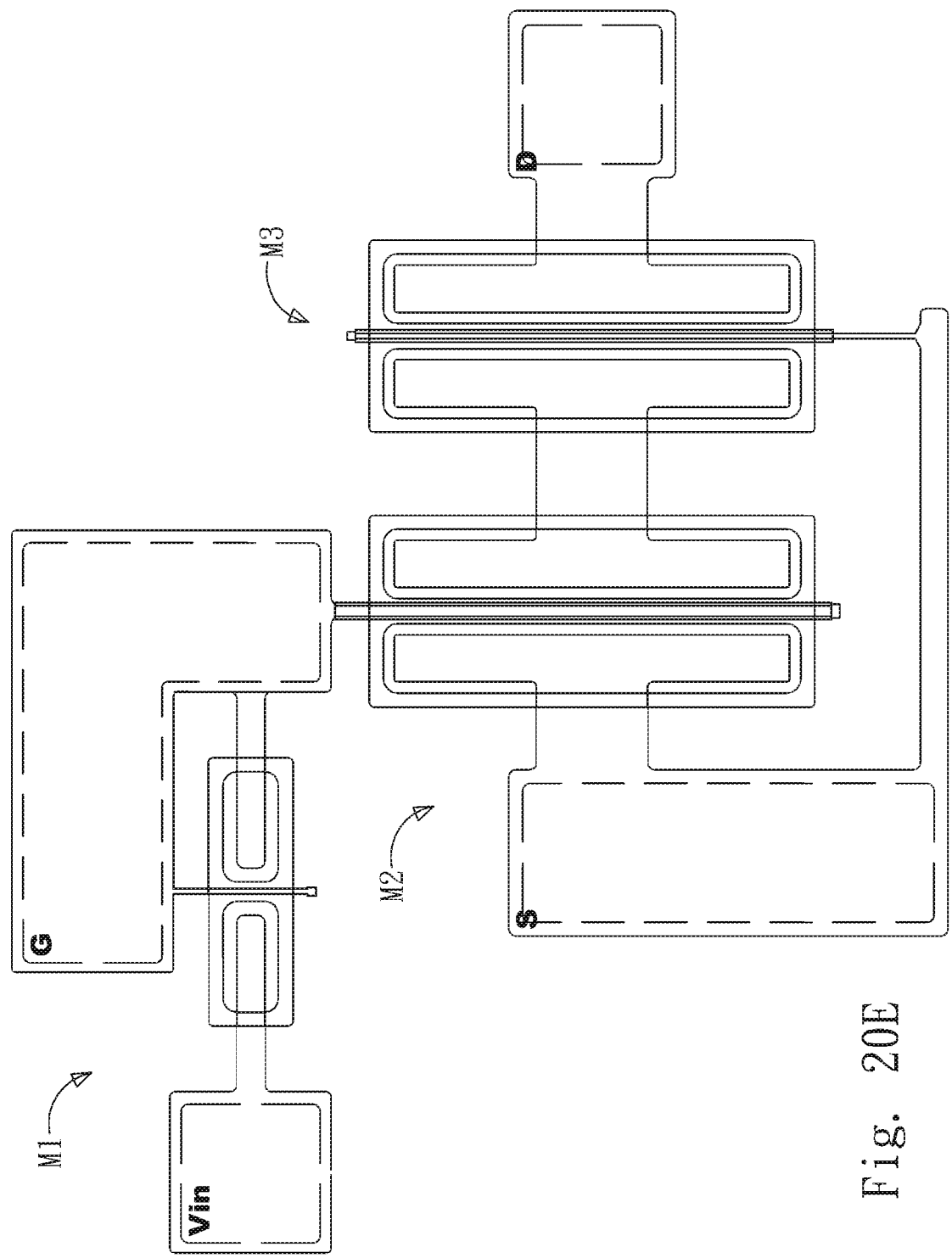

Then, a passivation layer 40 is grown by PECVD. The material is selected form the group consisting of $SiO_x$, $SiO_xN_y$, or $SiN_x$. Finally, the passivation layer 40 is patterned for exposing the bonding pad region and the region above the gate metal of the D-mode HEMT without gate dielectric layer, and thus forming the structures shown in FIG. 20E.

Likewise, because p-GaN gate is an inverted trapezoidal structure, a sloped capacitor will be formed in the filed plate region 264 at the dashed circle in the figures. This capacitor will induce the field plate effect having the main function of distributing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Finally, the metal vapor deposition and metal left-off methods are adopted to form the gate field-plate metal 62 of M1 in the left region and M3 in the right region, both M1, M3 are D-mode AlGaN/GaN HEMT without gate dielectric layer, as shown in the final structure in FIG. 20F. The field-plate metal 62 is adjacent to the gate field-plate dielectric layer 92.

Figures 1, 21A:
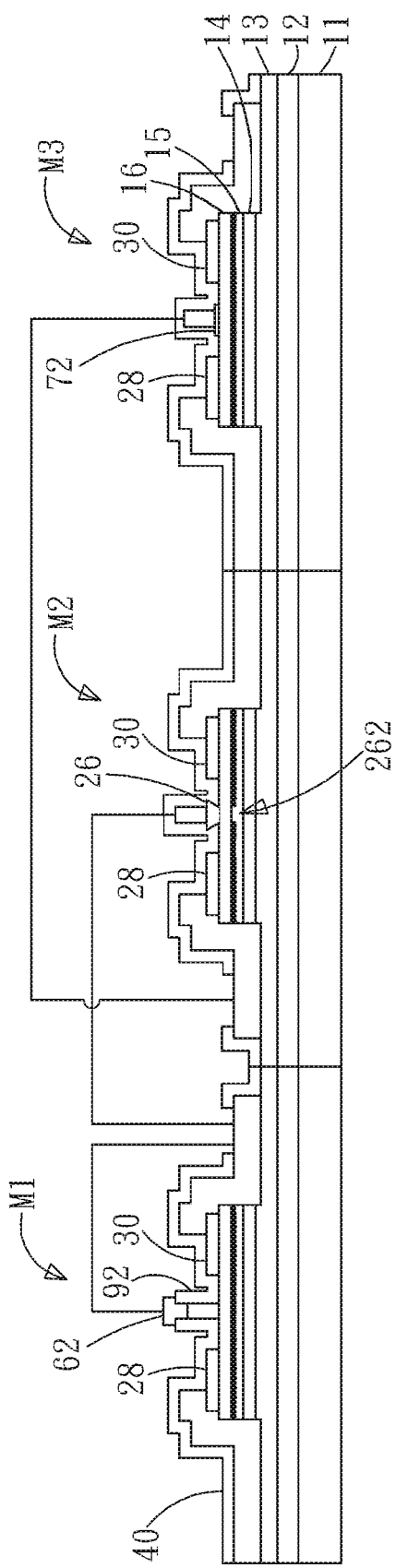
Figures 2, 21A:
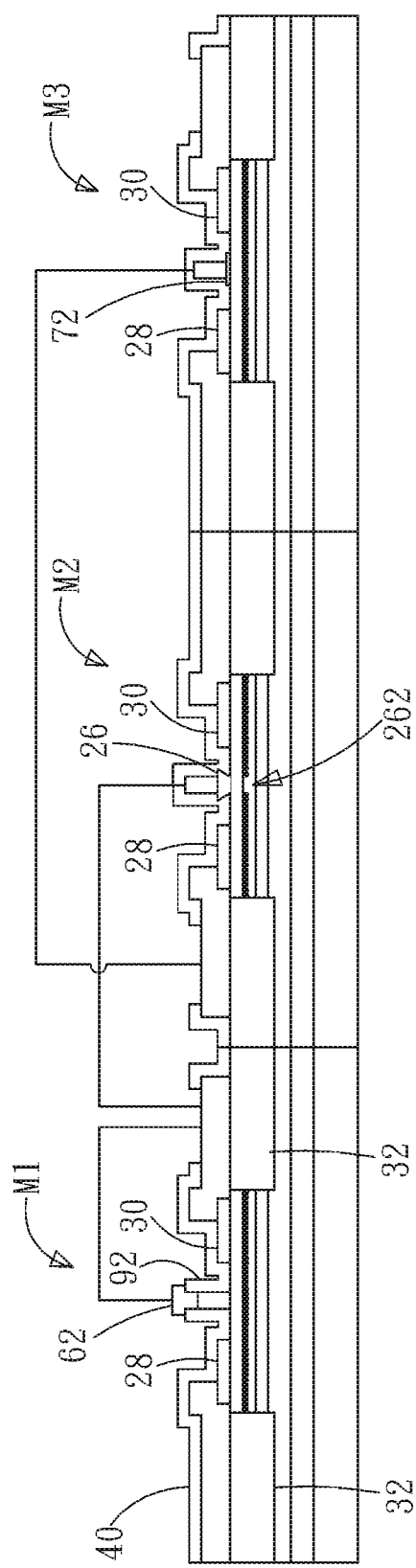

Embodiment 8: As Shown in FIG. 21A-1 and FIG. 21A-2, a Hybrid E-Mode AlGaN/GaN HEMT Formed by the SEG p-GaN Gate E-Mode AlGaN/GaN HEMT Using a D-Mode AlGaN/GaN HEMT without Gate Dielectric Layer as the Gate Protection Device Cascoding to a D-Mode AlGaN/GaN HEMT with Gate Dielectric Layer As shown in FIG. 21A-1 and FIG. 21A-2, the hybrid E-mode AlGaN/GaN HEMT according to Embodiment 8 comprises the epitaxial structure of AlGaN/GaN designed according to the present invention and is divided into a left region, a middle region, and a right region. In the left region, a D-mode AlGaN/GaN HEMT without gate dielectric layer M1 is formed. In the middle region, an SEG p-GaN gate E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-$Al_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT with gate dielectric layer M3 is formed.

The first process steps of Embodiment 8 are identical to those shown in FIG. 20A to FIG. 20C for Embodiment 7. Hence, the details will not be repeated.

Figures 1, 22B:
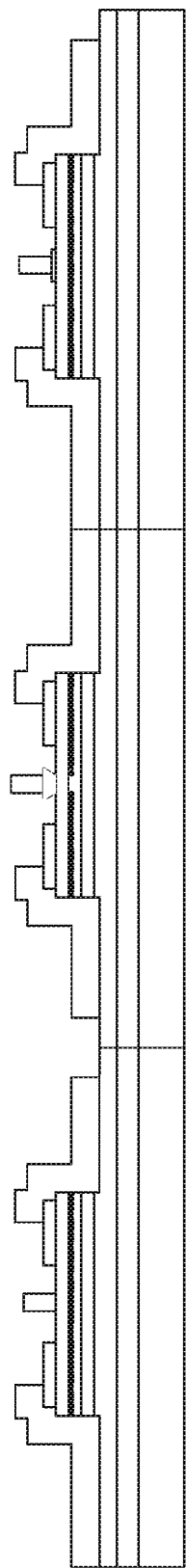
Figures 2, 22B:
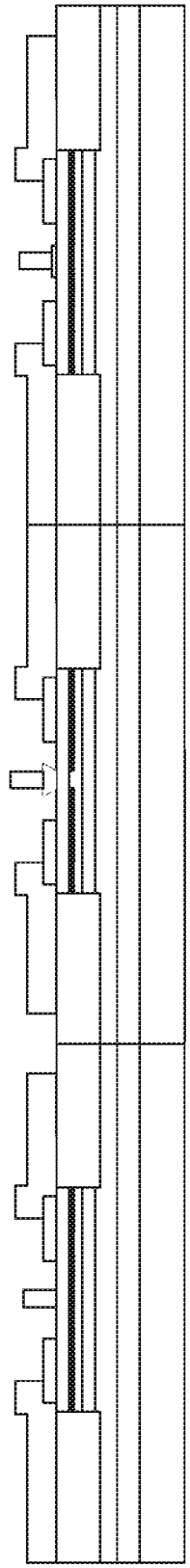

Step S84: The gate dielectric layer 72 for the D-mode AlGaN/GaN HEMT with gate dielectric layer M3 in the right region is fabricated. A dielectric layer is deposited by PECVD. The material is selected form the group consisting of $SiO_x$, $SiON_y$, or $SiN_x$; the thickness is 10 to 100 nm. Then, define the region of the gate dielectric layer 72 for the D-mode AlGaN/GaN HEMT by using photoresist and exposure method. Finally, the dielectric layer outside the region is etched by a wet etching method using BOE; the dielectric layer in the region of the gate dielectric layer 72 is reserved. Afterwards, the photoresist is stripped using stripper and forming the structure shown in FIG. 22A.

Step S85: Use metal vapor deposition (normally Ni/Au) and metal lift-off methods to form the gate electrode, the bonding pad regions for the drain and source electrodes, and the interconnection metal layer 36, as the structures shown in FIG. 22B. In addition, in this step, the metal wiring required for device operations can be formed concurrently. For example, the gate bonding pad region connected electrically with the gate electrode can be formed concurrently. Nonetheless, the present invention is not limited to the top views of the present invention.

Step S86: A passivation layer 40 is grown by PECVD. The material is selected form the group consisting of $SiO_x$, $SiON_y$, or $SiN_x$. Finally, the passivation layer 40 is patterned for etching and exposing the bonding pad region and the region above the gate metal of the D-mode AlGaN/GaN HEMT without gate dielectric layer in the left region, and thus forming the structure shown in FIG. 22C.

Step S87: Finally, the metal vapor deposition and metal left-off methods are adopted to form the gate field-plate metal 62 of the D-mode AlGaN/GaN HEMT without gate dielectric layer M1 in the left region, as shown in the final structure in FIG. 22D. The field-plate metal 62 is adjacent to the gate field-plate dielectric layer 92.

Figures 1, 23A:
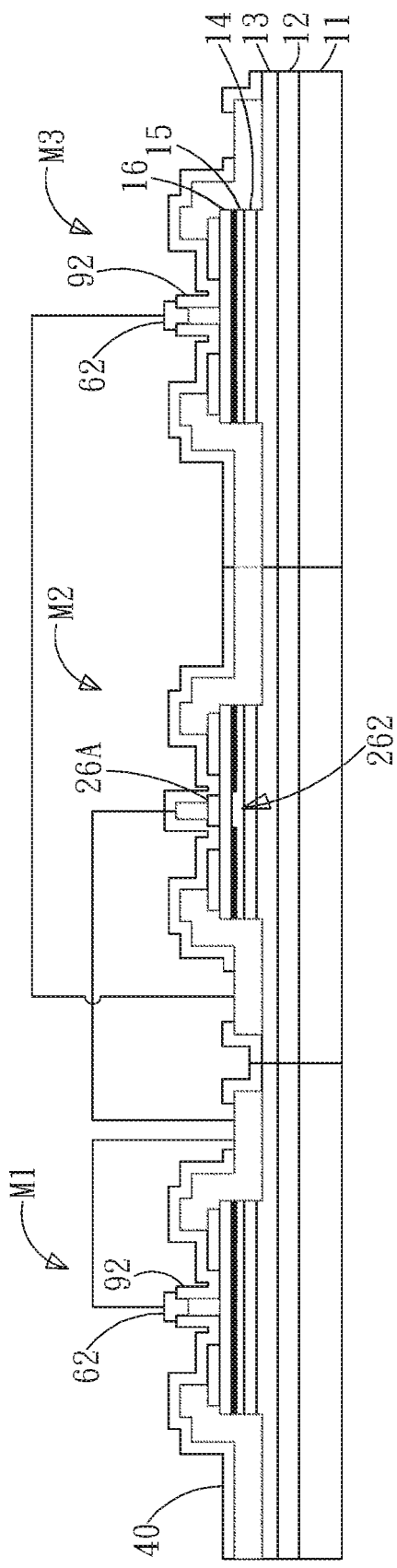
Figures 2, 23A:
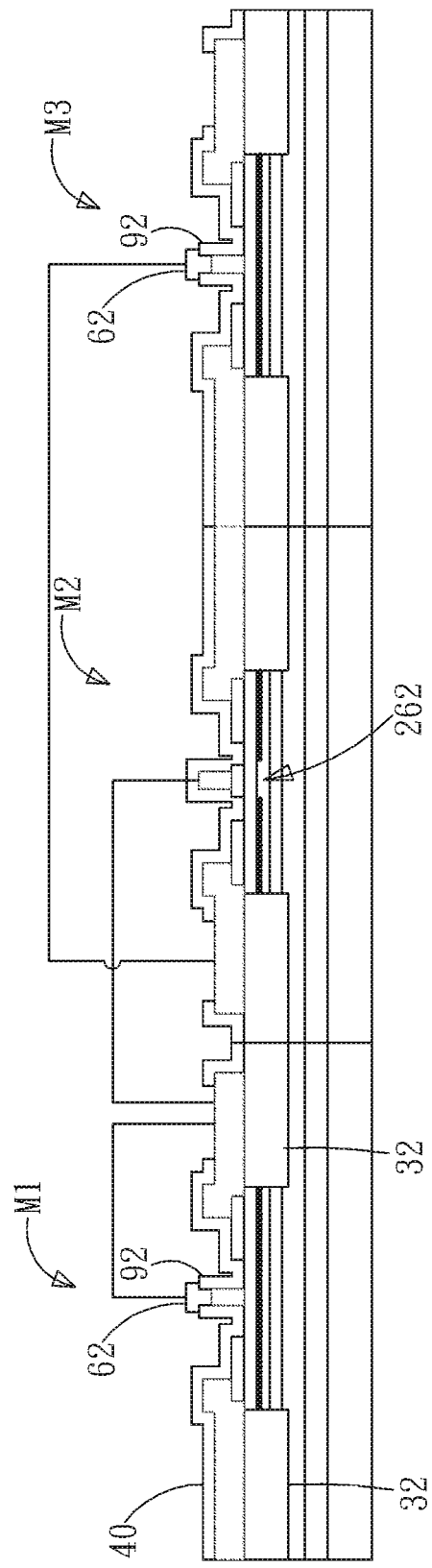

Embodiment 9: As Shown in FIG. 23A-1 and FIG. 23A-2, a Hybrid E-Mode AlGaN/GaN HEMT Formed by the Etched p-GaN Gate E-Mode AlGaN/GaN HEMT Using a D-Mode AlGaN/GaN HEMT without Gate Dielectric Layer as the Gate Protection Device Cascoding to a D-Mode AlGaN/GaN HEMT without Gate Dielectric Layer As shown in FIG. 23A-1 and FIG. 23A-2, the hybrid E-mode AlGaN/GaN HEMT according to Embodiment 9 comprises the epitaxial structure of AlGaN/GaN designed according to the present invention and is divided into a left region, a middle region, and a right region. In the left region, a D-mode AlGaN/GaN HEMT without gate dielectric layer M1 is formed. In the middle region, an SEG p-GaN gate E-mode AlGaN/GaN HEMT M2 is formed. This SEG p-GaN gate E-mode AlGaN/GaN HEMT M2 includes an etched p-GaN gate structure. In addition, although the 2DEG is formed at the junction i-Al$_x$GaN/i-GaN of the i-GaN channel layer 15, due to the existence of the etched p-GaN gate structure, the 2DEG below the etched p-GaN gate structure in the i-GaN channel layer 15 will be depleted, giving a depletion region 262 without 2DEG. In the right region, a D-mode AlGaN/GaN HEMT without gate dielectric layer M3 is formed.

Figures 1, 24A:
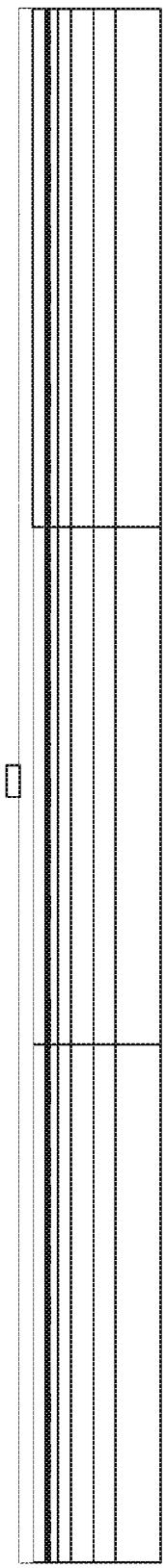
Figures 2, 24A:
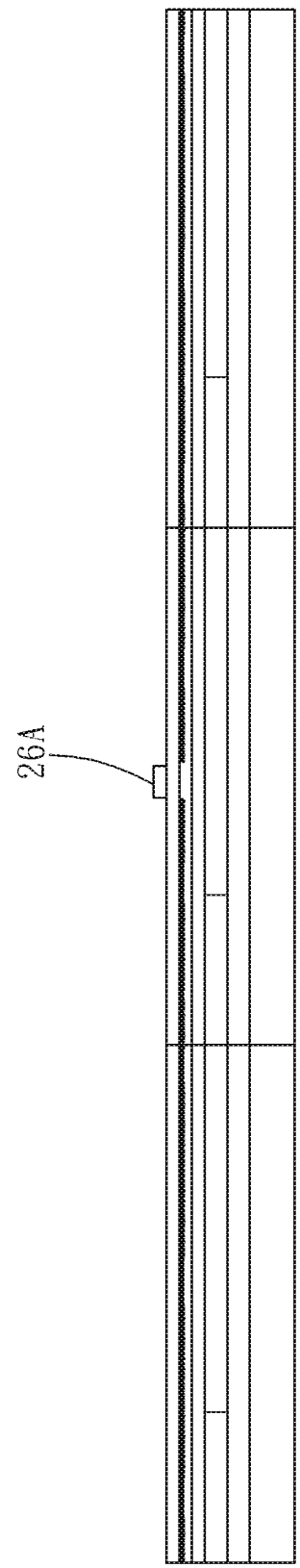

The process for fabricating Embodiment 9 will be described as follows. First, as shown in FIG. 24A, an epitaxial structure of Ga-face AlGaN/GaN according to the present invention is provided. The left region is set to fabricate the D-mode AlGaN/GaN HEMT without gate dielectric layer. The middle region is set to fabricate the etched p-GaN gate E-mode AlGaN/GaN HEMT. The right region is set to fabricate the D-mode AlGaN/GaN HEMT without gate dielectric layer.

Step S91: Fabricate the etched p-GaN gate. First, as shown in FIG. 24A, a p-GaN layer is grown on the Ga-face AlGaN/GaN epitaxial structure according to the present invention using MOCVD. Next, define the p-GaN gate region by using photoresist 22 and exposure method. Finally, dry etching is adopted to etch the p-GaN outside the region to the AlGaN blocking layer of the Ga-face AlGaN/GaN epitaxial structure according to the present invention. Then, the photoresist 22 is stripped using stripper. Thereby, the etched p-GaN gate is fabricated.

Figure 24B:
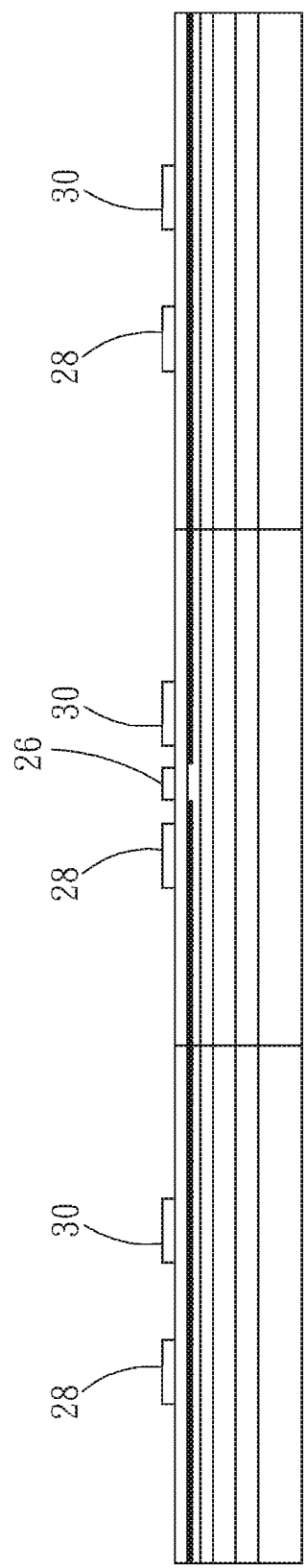
FIG. 24B shows a cross-sectional view after the drain and source metals corresponding to FIG. 24A-2 are fabricated.

Step S92: Use metal vapor deposition and metal lift-off methods to form the drain and source electrodes. Afterwards, a thermal treatment is performed at 700~900° C. for 30 seconds to make the drain and source electrodes become ohmic contacts 30, 28, as shown in FIG. 24B.

Step S93: Use destructive ion implantation as shown in FIG. 24C-2 or the dry etching to the highly resistive i-GaN buffer layer (C-doped) as shown in FIG. 20C-1 to isolate devices.

Figures 1, 24D:
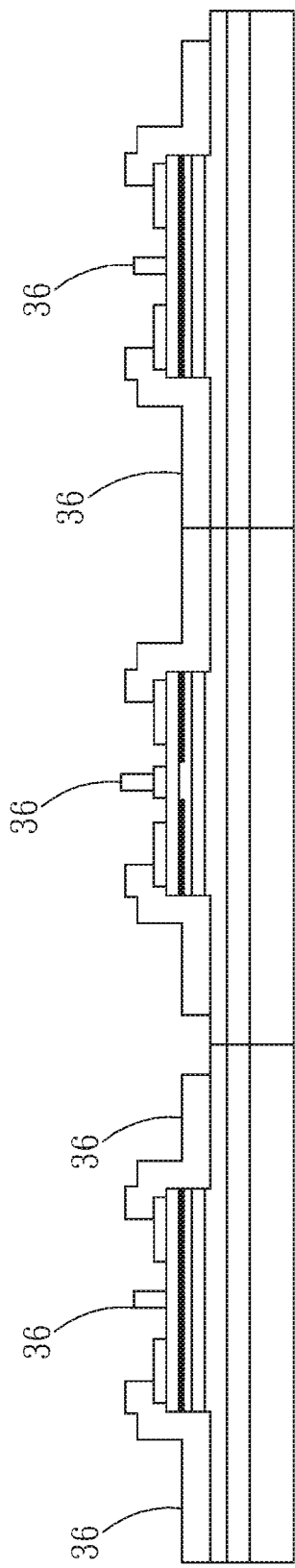
Figures 2, 24D:
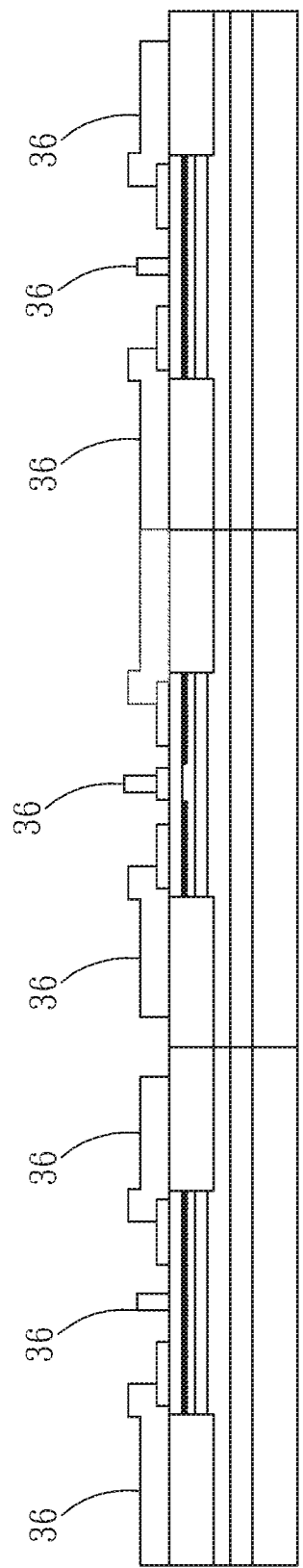

Step S94: Use metal vapor deposition and metal lift-off methods to form the gate electrode, the bonding pad regions for the drain and source electrodes, and the interconnection metal layer 36. Alternatively, in this step, the gate bonding pad region connected electrically with the gate electrode can be formed concurrently, as the structures shown in FIG. 24D.

Figures 1, 24E:
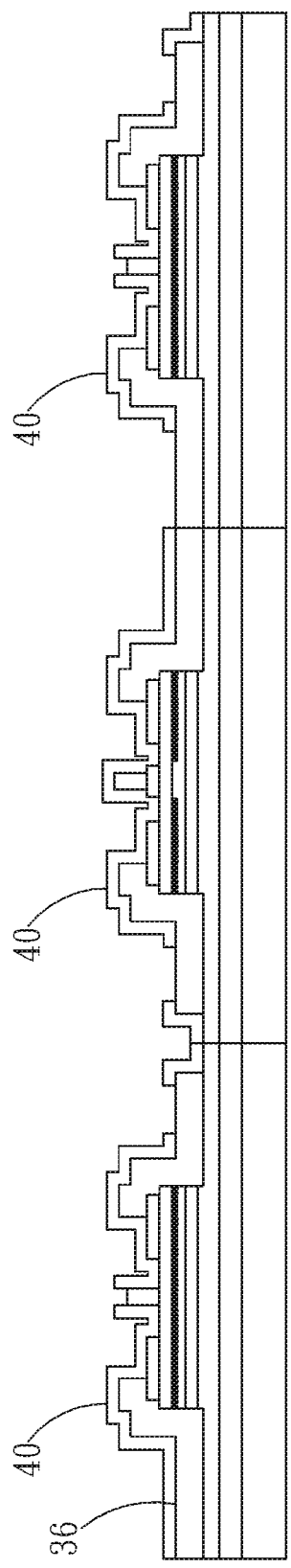
Figures 2, 24E:
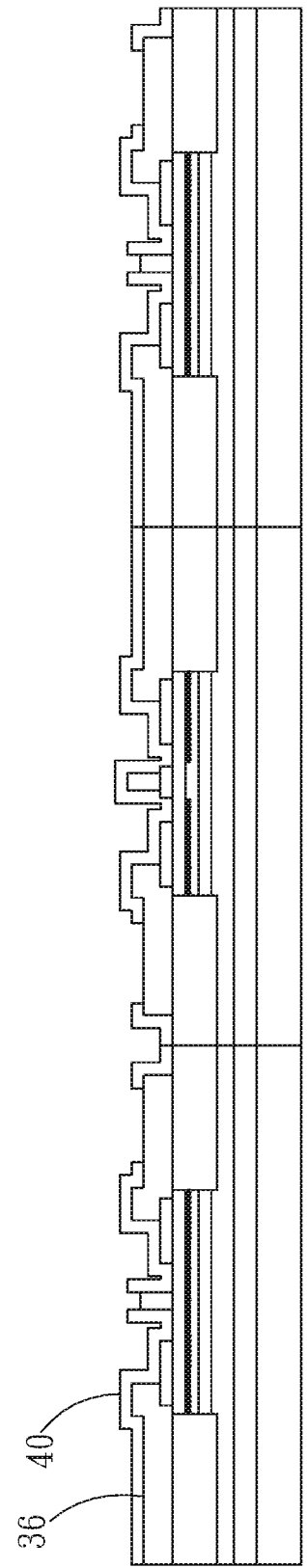
Figure 24G:
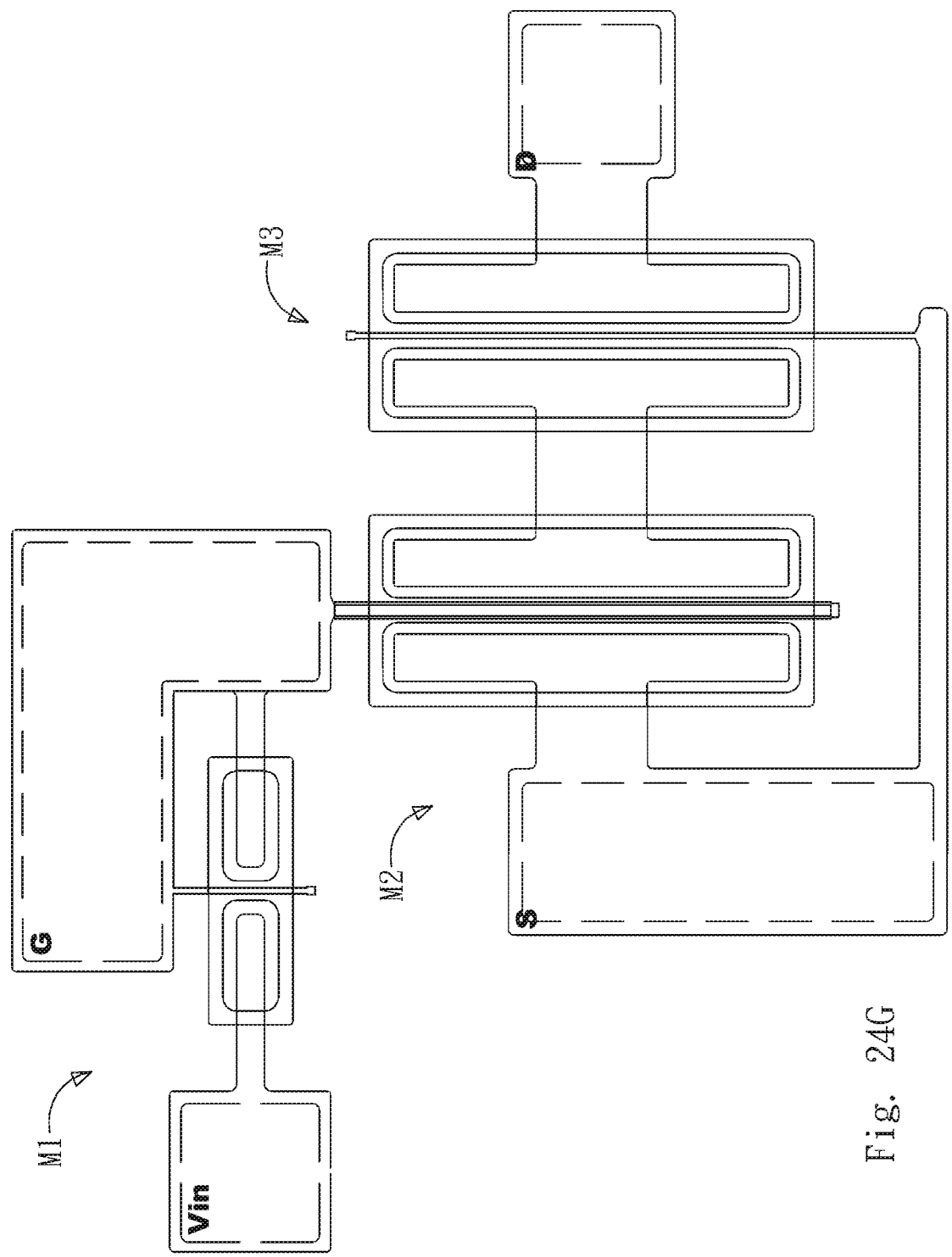
FIG. 24G shows a top view corresponding to FIG. 23A-1 and FIG. 23A-2.

A passivation layer 40 is grown by PECVD. The material is selected form the group consisting of SiO$_x$, SiO$_x$N$_y$, or SiN$_x$. Finally, the passivation layer 40 is patterned for exposing the bonding pad region and the region above the gate metal of the D-mode HEMT without gate dielectric layer, and thus forming the structures shown in FIG. 24E.

Step S95: Finally, the metal vapor deposition and metal left-off methods are adopted to form the gate field-plate metal 62 of the D-mode AlGaN/GaN HEMT without gate dielectric layer M1 in the left region, as shown in the final structure in FIG. 24F. The field-plate metal 62 is adjacent to the gate field-plate dielectric layer 92

Embodiment 10: As Shown in FIG. 25A-1 and FIG. 25A-2, a Hybrid E-Mode AlGaN/GaN HEMT Formed by the Etched p-GaN Gate E-Mode AlGaN/GaN HEMT Using a D-Mode AlGaN/GaN HEMT without Gate Dielectric Layer as the Gate Protection Device Cascoding to a D-Mode AlGaN/GaN HEMT with Gate Dielectric Layer As shown in FIG. 25A-1 and FIG. 25A-2, the hybrid E-mode AlGaN/GaN HEMT according to Embodiment 10 comprises the epitaxial structure of AlGaN/GaN designed according to the present invention and is divided into a left region, a middle region, and a right region. In the left region, a D-mode AlGaN/GaN HEMT without gate dielectric layer M1 is formed. In the middle region, an SEG p-GaN gate E-mode AlGaN/GaN HEMT M2 is formed. This SEG p-GaN gate E-mode AlGaN/GaN HEMT M2 includes an etched p-GaN gate structure. In addition, although the 2DEG is formed at the junction i-Al$_x$GaN/i-GaN of the i-GaN channel layer 15, due to the existence of the etched p-GaN gate structure, the 2DEG below the etched p-GaN gate structure in the i-GaN channel layer 15 will be depleted. In the right region, a D-mode AlGaN/GaN HEMT with gate dielectric layer M3 is formed.

The first process steps of Embodiment 10 are identical to those shown in FIG. 24A to FIG. 24C for Embodiment 9. Hence, the details will not be repeated.

Figures 1, 26D:
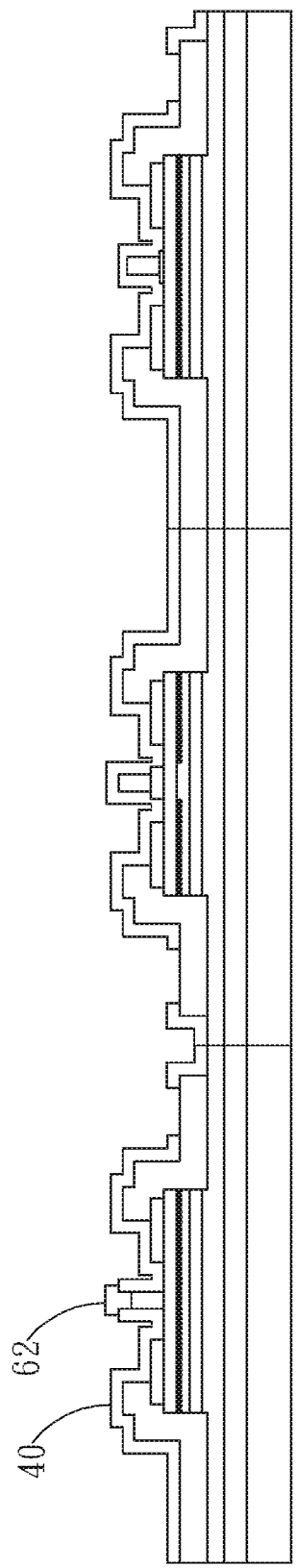
Figures 2, 26D:
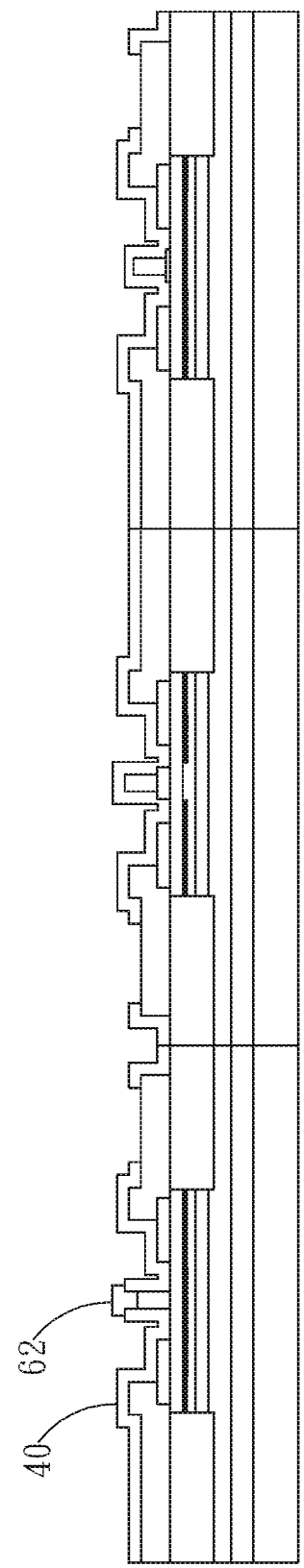
Figure 26E:
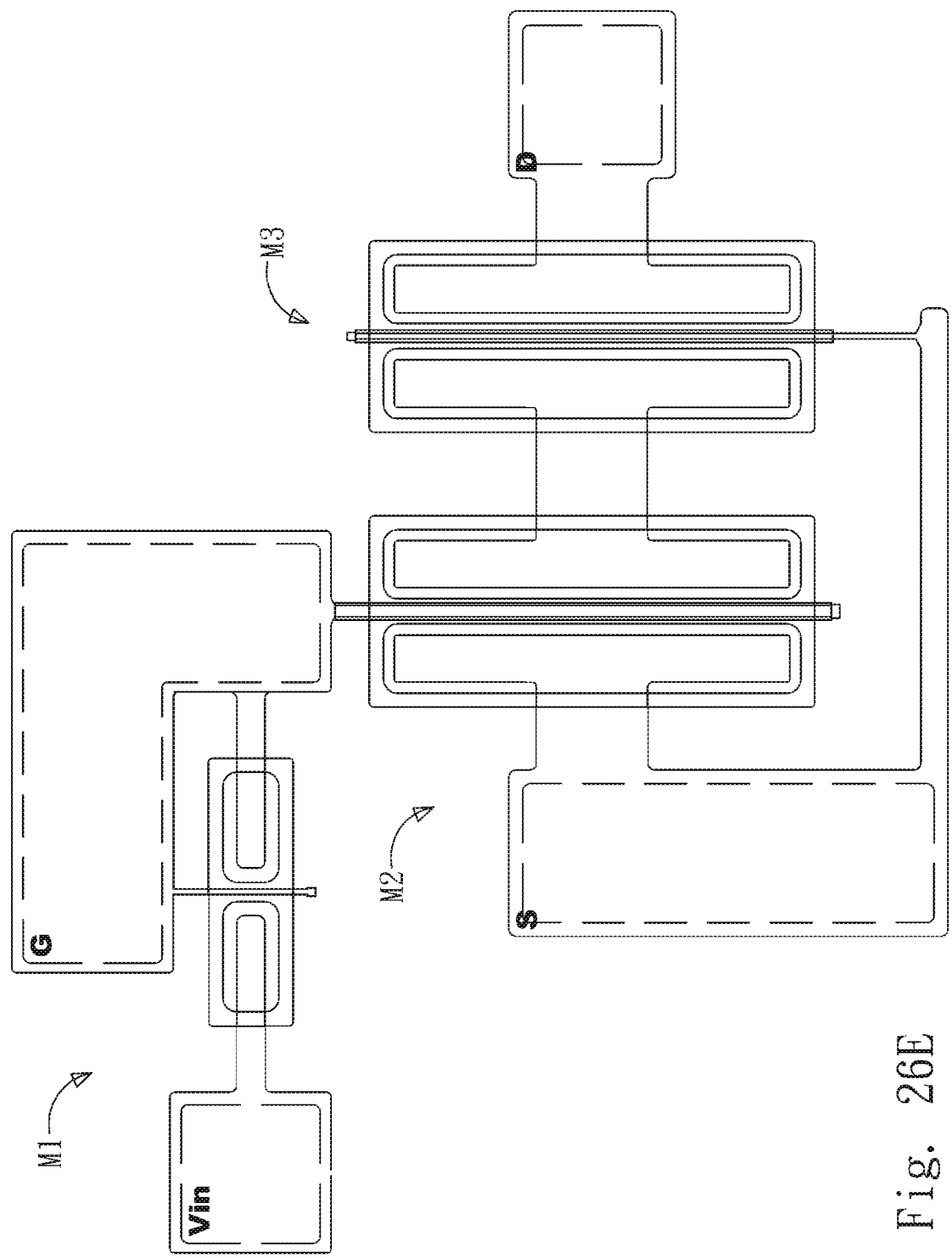
FIG. 26E shows a top view corresponding to FIG. 25A-1 and FIG. 25A-2.

Step S104: The gate dielectric layer 72 for the D-mode AlGaN/GaN HEMT with gate dielectric layer in the right region is fabricated. A dielectric layer is deposited by PECVD. The material is selected form the group consisting of SiO$_x$, SiON$_y$, or SiN$_x$; the thickness is 10 to 100 nm. Then, define the region of the gate dielectric layer 72 for the D-mode AlGaN/GaN HEMT by using photoresist and exposure method. Finally, the dielectric layer outside the region is etched by a wet etching method using BOE; the dielectric layer in the region of the gate dielectric layer 72 is reserved. Afterwards, the photoresist is stripped using stripper and forming the structure shown in FIG. 26A.

Step S105: Use metal vapor deposition (normally Ni/Au) and metal lift-off methods to form the gate electrode, the bonding pad regions for the drain and source electrodes, and the interconnection metal layer 36, as the structures shown in FIG. 22B. In addition, in this step, the metal wiring required for device operations can be formed concurrently. For example, the gate bonding pad region connected electrically with the gate electrode can be formed concurrently. Nonetheless, the present invention is not limited to the top views of the present invention.

Step S106: A passivation layer 40 is grown by PECVD. The material is selected form the group consisting of SiO$_x$, SiO$_x$N$_y$, or SiN$_x$. Finally, the passivation layer 40 is patterned for etching and exposing the bonding pad region and the region above the gate metal of the D-mode AlGaN/GaN HEMT without gate dielectric layer in the left region, and thus forming the structure shown in FIG. 26C.

S107: Finally, the metal vapor deposition and metal left-off methods are adopted to form the gate field-plate metal 62 of the D-mode AlGaN/GaN HEMT without gate dielectric layer M1 in the left region, as shown in the final structure in FIG. 26D. The field-plate metal 62 is adjacent to the gate field-plate dielectric layer 92.

Figures 1, 27A:
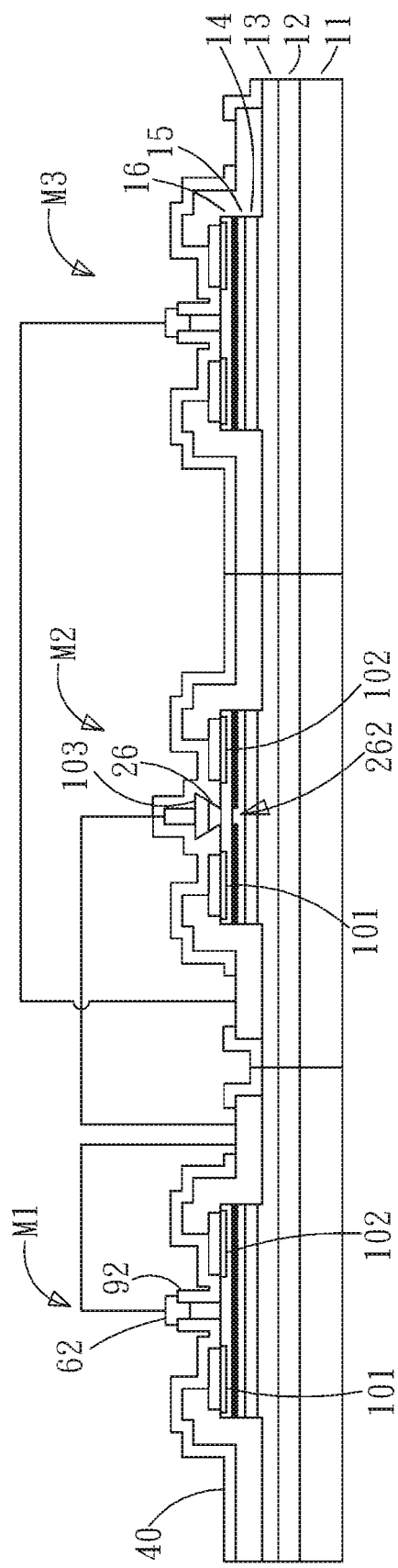
Figures 2, 27A:
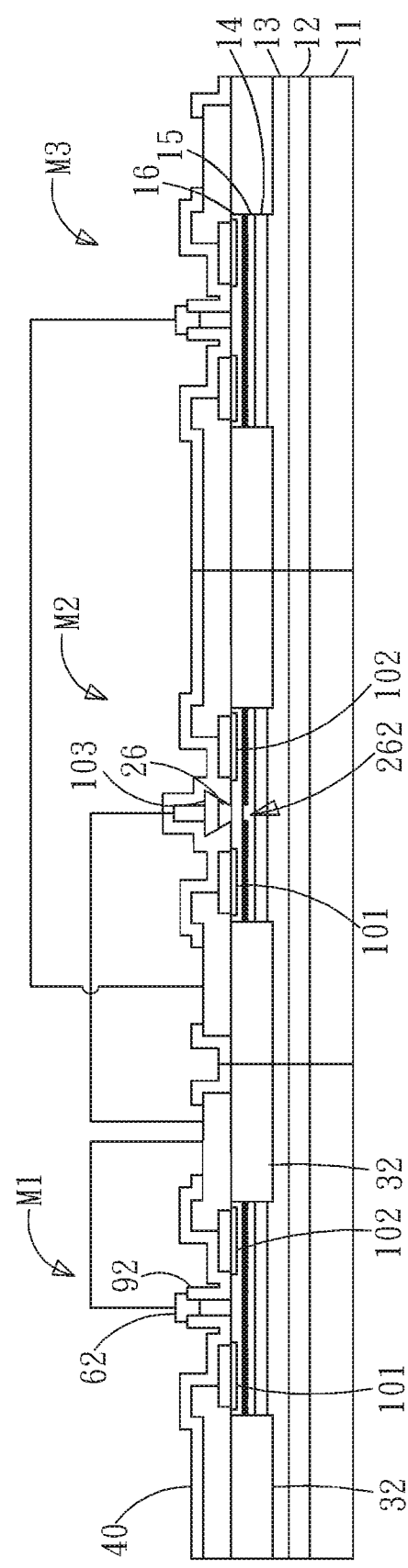

Embodiment 11: As Shown in FIG. 27A-1 and FIG. 27A-2, a Hybrid E-Mode AlGaN/GaN HEMT Formed by the SEG p-GaN Gate and Self-Aligned Gate Metal E-Mode AlGaN/GaN HEMT Using a D-Mode AlGaN/GaN HEMT without Gate Dielectric Layer as the Gate Protection Device Cascoding to a D-Mode AlGaN/GaN HEMT without Gate Dielectric Layer As shown in FIG. 27A-1 and FIG. 27A-2, the hybrid E-mode AlGaN/GaN HEMT according to Embodiment 11 comprises the epitaxial structure of AlGaN/GaN designed according to the present invention and is divided into a left region, a middle region, and a right region. In the left region, a D-mode AlGaN/GaN HEMT without gate dielectric layer M1 is formed. In the middle region, an SEG p-GaN gate and self-aligned gate metal E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT without gate dielectric layer M3 is formed.

The process for fabricating Embodiment 7 will be described as follows. First, as shown in FIG. 20A, an epitaxial structure of Ga-face AlGaN/GaN according to the present invention is provided. The left region is set to fabricate the D-mode AlGaN/GaN HEMT without gate dielectric layer M1. The middle region is set to fabricate the SEG p-GaN gate and self-aligned gate metal E-mode AlGaN/GaN HEMT M2. The right region is set to fabricate the D-mode AlGaN/GaN HEMT without gate dielectric layer M3. The transistor M2 according to the present embodiment comprises the epitaxial structure of AlGaN/GaN. A p-GaN inverted trapezoidal gate structure 26, a first source metal layer 28, and a first drain metal layer 30 are formed on the i-Al$_x$GaN layer of the epitaxial structure. In addition, although the 2DEG is formed at the junction i-Al$_x$GaN/i-GaN of the i-GaN channel layer, due to the existence of the p-GaN inverted trapezoidal gate structure 26, the 2DEG below the p-GaN inverted trapezoidal gate structure 26 in the i-GaN channel layer will be depleted. The i-Al$_x$GaN layer of the epitaxial structure includes a first source ion implantation region 101 and a first drain ion implantation region 102. Besides, the first source ion implantation region 101 is located below the first source metal layer 28, while the first drain ion implantation region 102 is located below the first drain metal layer 30. Moreover, a first gate metal layer 103 is disposed on the p-GaN inverted trapezoidal gate structure 26.

A thermal treatment at 700□~900□ is required for the drain and source electrodes to form ohmic contacts with i-Al$_x$GaN. In a general HEMT fabrication process, the gate metal is fabricated after the thermal treatment for the drain and source electrodes. Thereby, the Schottky contact between the gate metal and the i-Al$_x$GaN will not be damaged due to this high-temperature thermal treatment. Nonetheless, for the SEG p-GaN gate and self-aligned gate metal HEMT, the gate metal is fabricated prior to the drain and source electrodes. In order to prevent damages on the characteristics of the Schottky contact formed by the gate and the i-Al$_x$GaN by the thermal treatment, multiple ion implantation is adopted to implant n-type silicon dopants below the drain and source electrodes. Thereby, the drain and source can form ohmic contacts with the i-Al$_x$GaN without the 700□~900□ thermal treatment.

Figures 1, 28A:
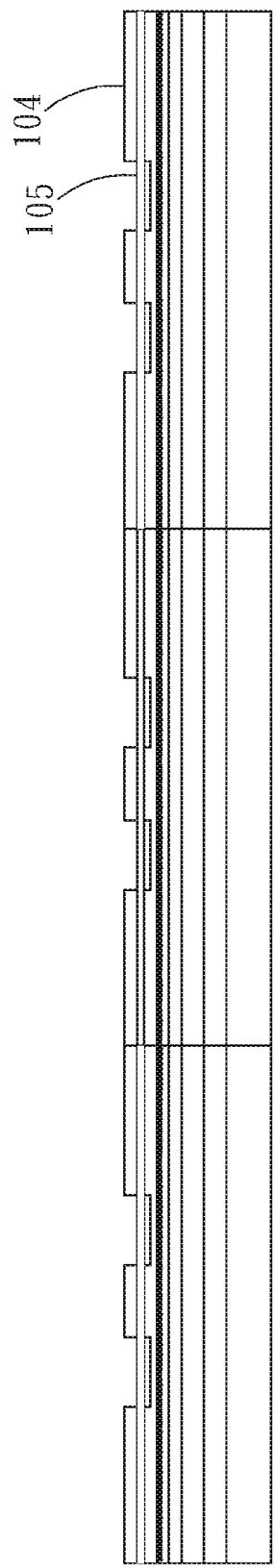
Figures 2, 28A:
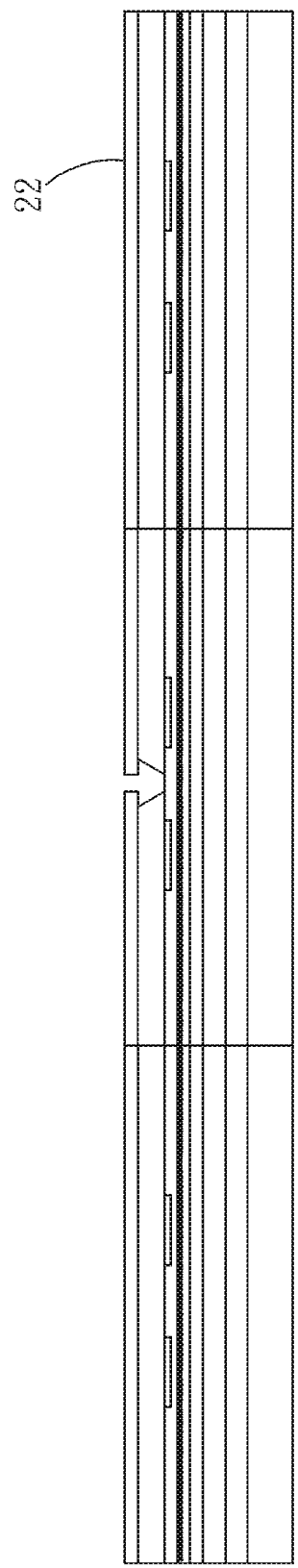

Step 111: As shown in FIG. 28A-1, use the multiple ion implantation to implant n-type silicon dopants below the drain and source electrodes and activate by thermal treatment to form a first source ion implantation region 101 and a first drain ion implantation region 102. The ion implantation is shallow and concentration distribution of ions implanted into the i-Al$_x$GaN is Gaussian. We expect the peak value of the Gaussian distribution is as close to the surface of the i-Al$_x$GaN as possible, as shown in FIG. 19A. First, use PECVD to deposit a layer of SiO$_2$ mask 105 as a buffer layer. Thereby, in ion implantation, the peak value of the Gaussian distribution is close to the surface of the i-Al$_x$GaN. Next, use photolithography to form a patterned photoresist layer 104 and define the ion implantation regions below the drain and source electrodes. Then, the multiple ion implantation is adopted to implant n-type silicon dopants below the drain and source electrodes. Afterwards, remove the patterned photoresist layer 104 and the SiO$_2$ mask 105.

Afterwards, a thermal treatment at a temperature greater than 600□ is performed for activating the n-type silicon dopants and forming the first source ion implantation region 101 and the first drain ion implantation region 102. This thermal treatment can be performed after the step S71. In other words, after the steps of ion implantation and removal of the patterned photoresist layer 104 and the SiO$_2$ mask 105, thermal treatment at a temperature greater than 600□ is performed for activation. Alternatively, in the subsequent SEG p-GaN gate using MOCVD, the high temperature for growth can be used for activation.

Step S112: As shown in FIG. 28A-2. Define the SEG p-GaN gate and self-aligned gate metal region. Deposit a silicon dioxide mask layer 20 using PECVD with a thickness greater than 2500 nm. Next, define the gate SEG region by using photoresist and exposure method. Finally, the silicon dioxide mask layer 20 in the region is etched by a wet etching method using BOE to expose the surface of the epitaxy. Then, the photoresist is stripped using stripper. Because the wet etching is isotropic, in addition to etching downward, lateral etching will occur concurrently. Thereby, the opening of the silicon dioxide mask layer 20 will form an inverted-trapezoidal-structure opening 24.

Step S113: As shown in FIG. 28B-1, form the SEG p-GaN gate and self-aligned gate metal. First, p-GaN SEG is performed using MOCVD and only the exposed surface of the epitaxy can grow p-GaN. Because the growth of p-GaN in MOCVD is also isotropic, in addition to growing upward, lateral growth will occur concurrently and thus forming an inverted trapezoidal structure of p-GaN, which is just the p-GaN inverted trapezoidal structure 26. Afterwards, gate electrode is coated using metal coating. Finally, the silicon dioxide mask layer is etched by a wet etching method and the metal outside the gate electrode region is lift off, forming the self-aligned gate metal 102 on the p-GaN inverted trapezoidal structure 26, as the structure shown in FIG. 28B-1.

Step S114: Use metal vapor deposition and lift-off methods to form drain and source electrodes 28, 30, as shown in FIG. 28B-2.

Step S115: Perform device isolation process. As shown in FIG. 28C-1 and FIG. 28C-2, multiple-energy destructive ion implantation is adopted. Alternatively, dry etching to the highly resistive i-GaN buffer layer (C-doped) can be adopted for isolating devices.

Figures 1, 28D:
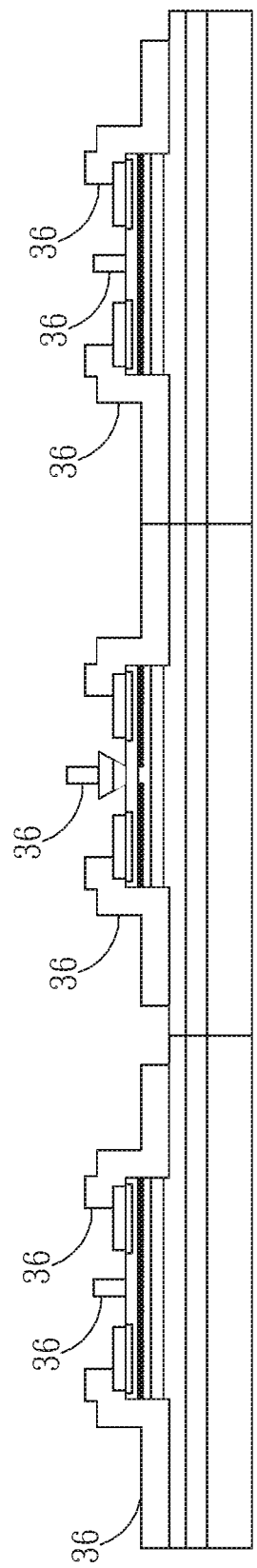
Figures 2, 28D:
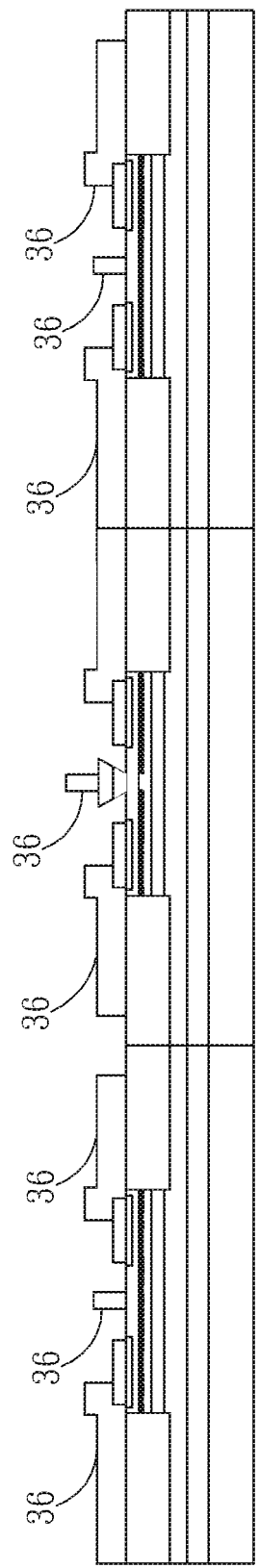

Step S116: Perform the metal wiring process. Metal vapor deposition and lift-off methods are used for forming the metal layer 36 and forming bonding pads for the drain, and source electrodes as well as the metal interconnection, as shown in FIG. 28D-1 or FIG. 28D-2.

Step S117: Pattern the passivation layer. A passivation layer 40 is grown by PECVD. Finally, the passivation layer 40 is patterned for exposing a portion of the metal layer 36, as shown in FIG. 28E-1 and FIG. 28E-2. For example, etching is adopted for exposing the bonding pad regions 42, 43 for subsequent wire bonding.

Because p-GaN is an inverted trapezoidal gate structure 26, as shown in FIG. 27A-1 and FIG. 27A-2, a sloped capacitor will be formed in the filed plate region 264 at the dashed circle. This capacitor will induce the field plate effect having the main function of distributing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Figure 28G:
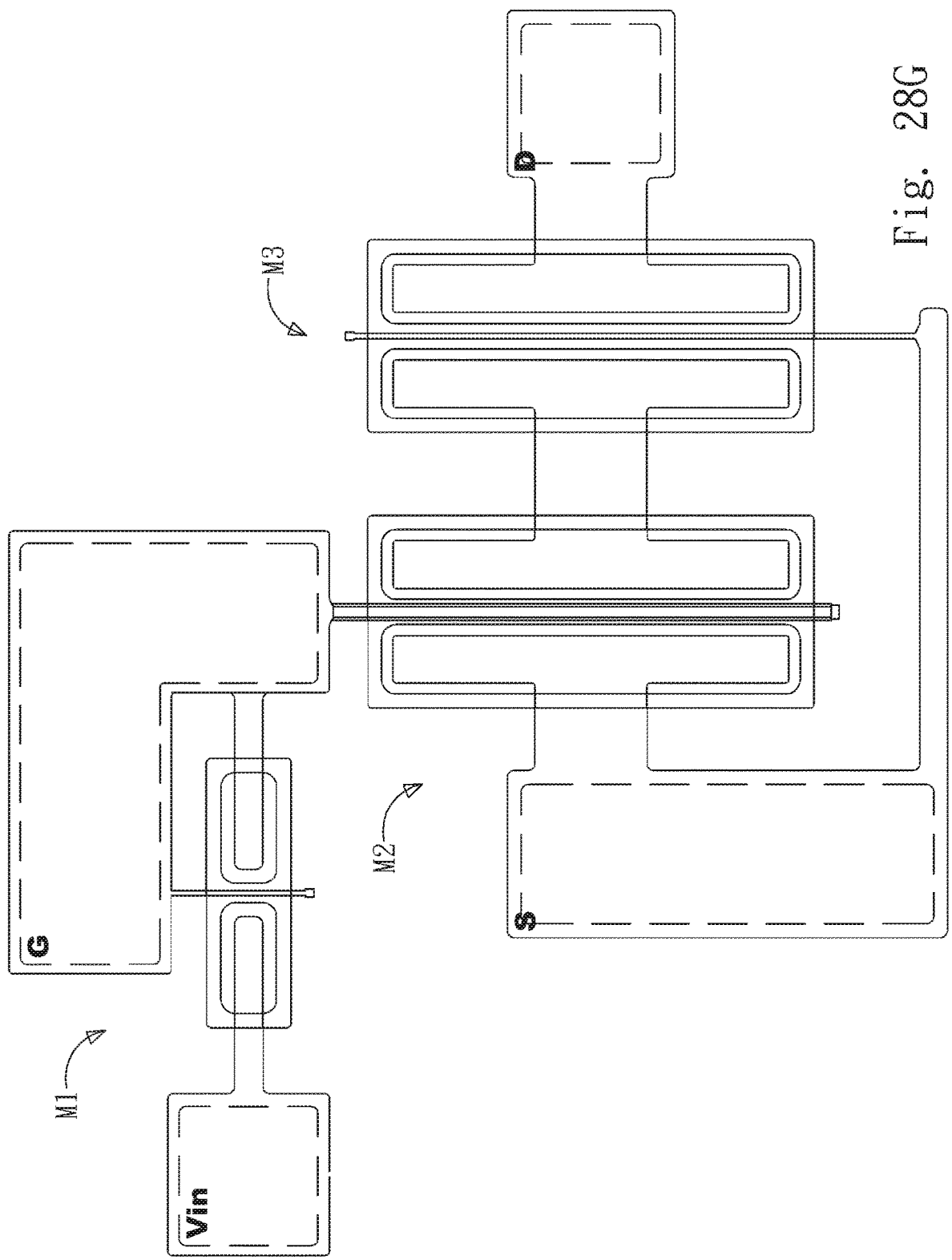
FIG. 28G shows a top view corresponding to FIG. 27A-1 and FIG. 27A-2.

Step S118: As shown in FIG. 28F-1 and FIG. 28F-2, fabricate the gate field-plate metal. The metal vapor deposition and metal left-off methods are adopted to form the gate field-plate metal 62 for the D-mode HEMT. The gate field-plate metal 62 is adjacent to the gate field-plate dielectric layer 92. As shown in the top view of the final structures in FIG. 28G, the source S of the transistor M1 is connected to the gate G of the transistor M2; the source S of the transistor M2 is connected to the gate G of the transistor M3.

Figures 1, 29A:
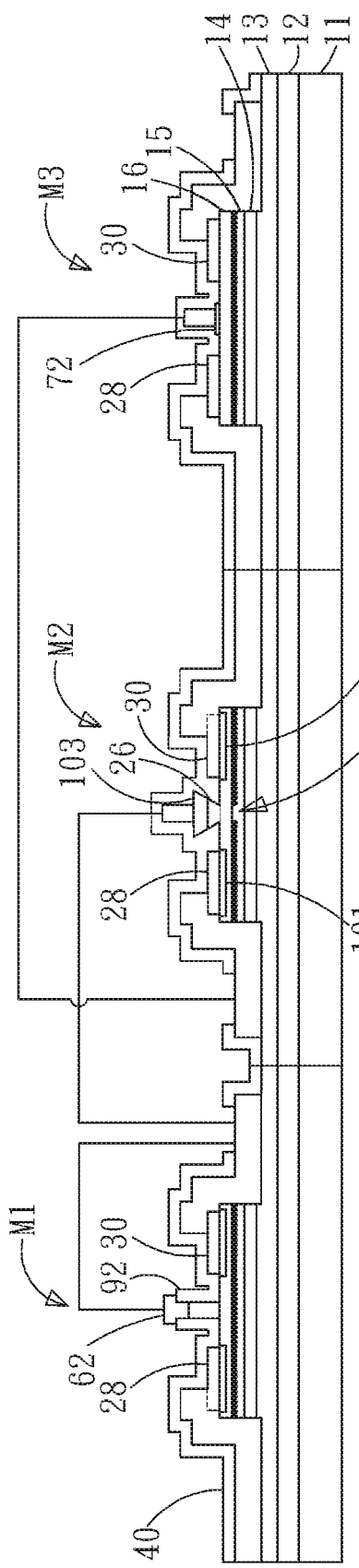
Figures 2, 29A:
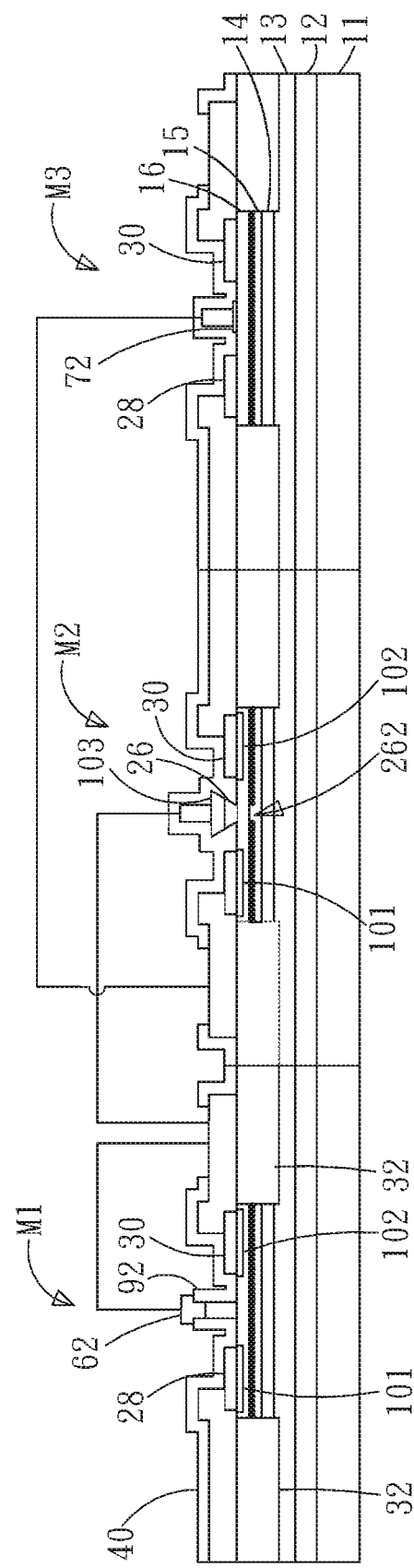

Embodiment 12: As Shown in FIG. 29A-1 and FIG. 29A-2, a Hybrid E-Mode AlGaN/GaN HEMT Formed by the SEG p-GaN Gate and Self-Aligned Gate Metal E-Mode AlGaN/GaN HEMT Using a D-Mode AlGaN/GaN HEMT without Gate Dielectric Layer as the Gate Protection Device Cascoding to a D-Mode AlGaN/GaN HEMT with Gate Dielectric Layer As shown in FIG. 29A-1 and FIG. 29A-2, the hybrid E-mode AlGaN/GaN HEMT according to Embodiment 12 comprises the epitaxial structure of AlGaN/GaN designed according to the present invention and is divided into a left region, a middle region, and a right region. In the left region, a D-mode AlGaN/GaN HEMT without gate dielectric layer M1 is formed. In the middle region, an SEG p-GaN gate and self-aligned gate metal E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT with gate dielectric layer M3 is formed.

The first process steps of Embodiment 12 are identical to those shown in FIG. 28A to FIG. 28C for Embodiment 11. Hence, the details will not be repeated.

Figures 1, 30B:
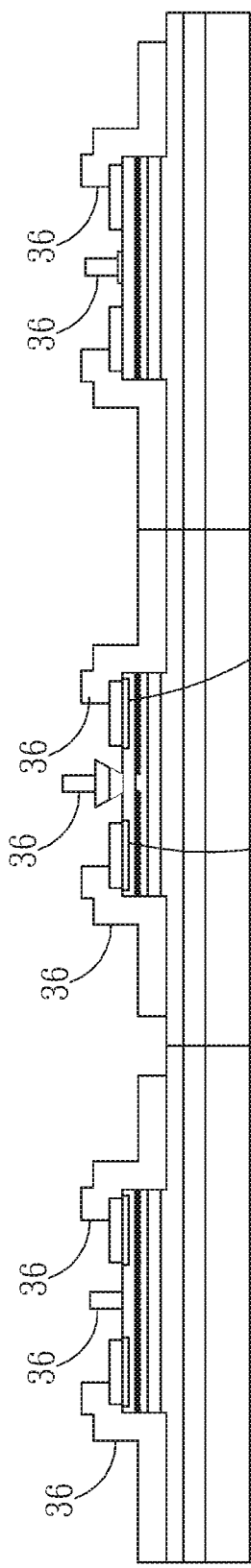
Figures 2, 30B:
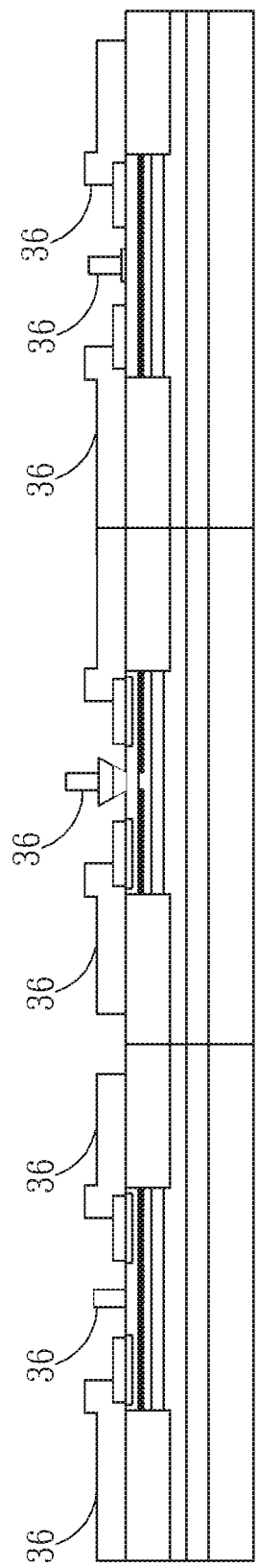

Step S124: The gate dielectric layer 72 for the D-mode AlGaN/GaN HEMT with gate dielectric layer in the right region is fabricated. A dielectric layer is deposited by PECVD. The material is selected form the group consisting of SiO$_x$, SiO$_x$N$_y$, or SiN$_x$; the thickness is 10 to 100 nm. Then, define the region of the gate dielectric layer 72 for the D-mode AlGaN/GaN HEMT by using photoresist and exposure method. Finally, the dielectric layer outside the region is etched by a wet etching method using BOE; the dielectric layer in the region of the gate dielectric layer 72 is reserved. Afterwards, the photoresist is stripped using stripper and forming the structure shown in FIG. 30A.

Step S125: Use metal vapor deposition (normally Ni/Au) and metal lift-off methods to form the gate electrode, the bonding pad regions for the drain and source electrodes, and the interconnection metal layer 36, as the structures shown in FIG. 30B. In addition, in this step, the metal wiring required for device operations can be formed concurrently. For example, the gate bonding pad region connected electrically with the gate electrode can be formed concurrently. Nonetheless, the present invention is not limited to the top views of the present invention.

Figures 1, 30C:
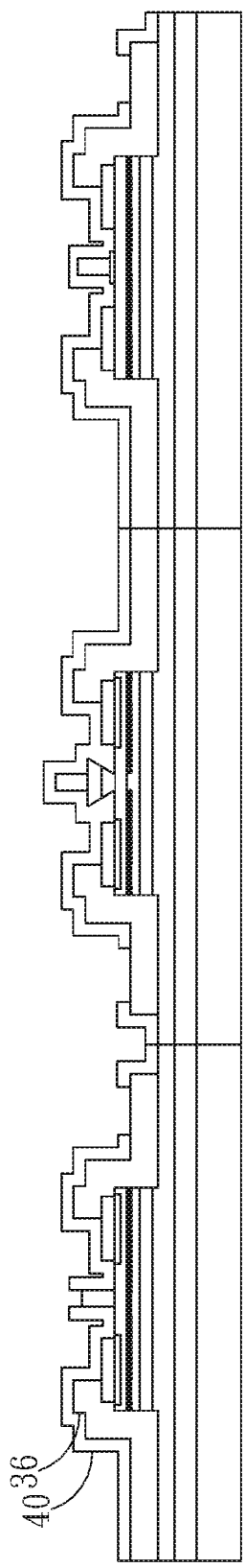
Figures 2, 30C:
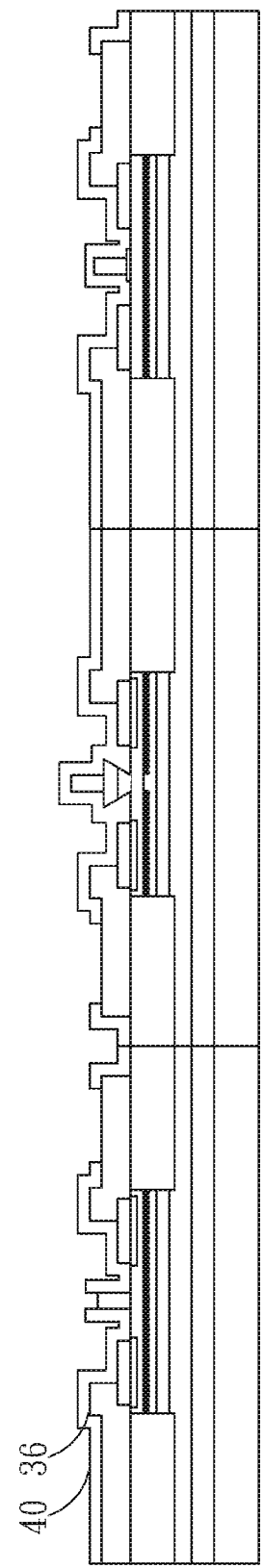
Figure 30E:
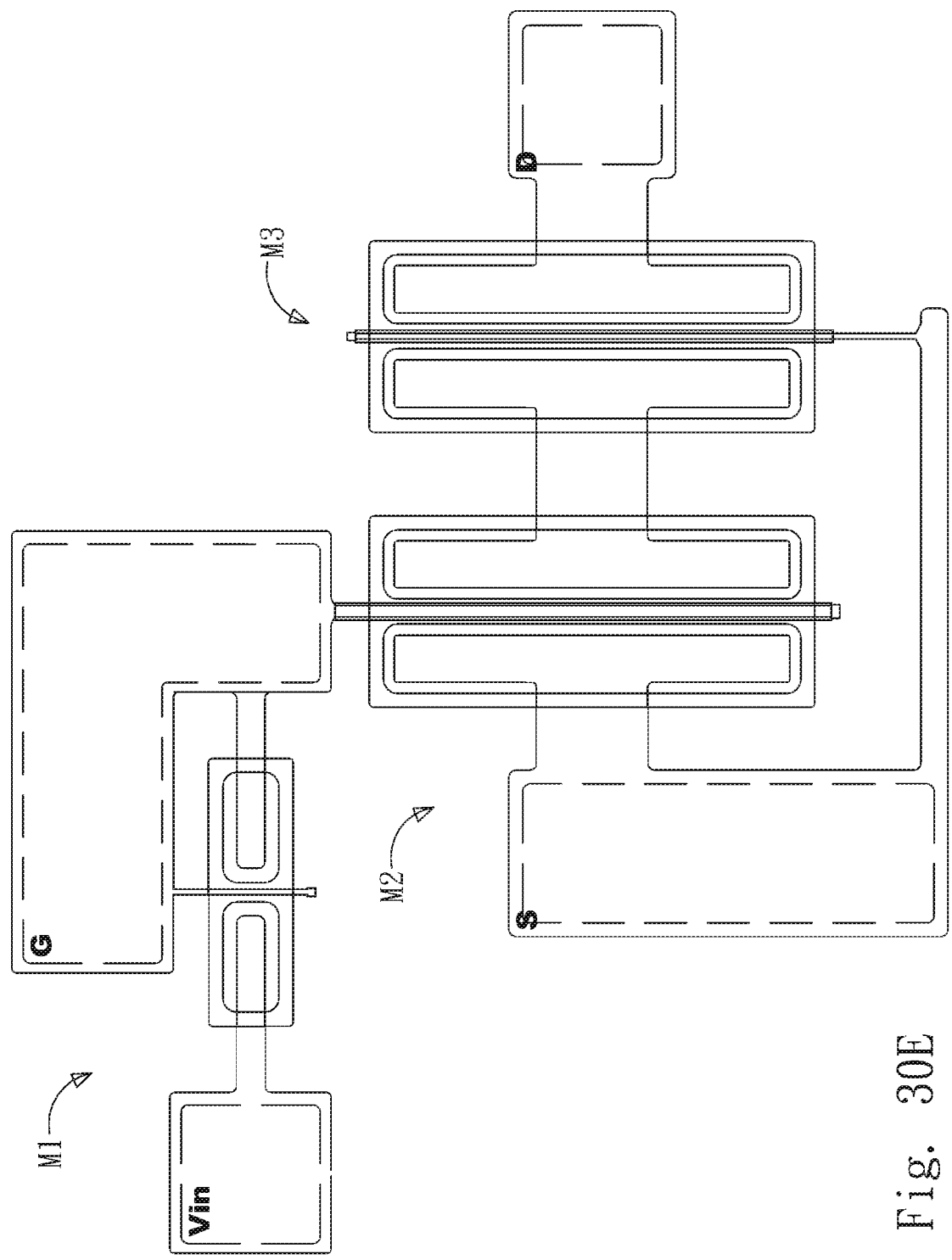
FIG. 30E shows a top view corresponding to FIG. 29A-1 and FIG. 29A-2.

Step S126: A passivation layer 40 is grown by PECVD. The material is selected form the group consisting of SiO$_x$, SiON$_y$, or SiN$_x$. Finally, the passivation layer 40 is patterned for etching and exposing the bonding pad region and the region above the gate metal of the D-mode AlGaN/GaN HEMT without gate dielectric layer in the left region, and thus forming the structure shown in FIG. 30C.

S127: Finally, the metal vapor deposition and metal left-off methods are adopted to form the gate field-plate metal 62 of the D-mode AlGaN/GaN HEMT without gate dielectric layer M1 in the left region, as shown in the final structure in FIG. 30D. The field-plate metal 62 is adjacent to the gate field-plate dielectric layer 92.

As shown in FIG. 18-C and FIG. 18-D, which show equivalent circuits of the source of a D-mode AlGaN/GaN HEMT with gate dielectric layer connecting to a p-GaN gate E-mode AlGaN/GaN HEMT and cascoding to a D-mode AlGaN/GaN HEMT (1) without gate dielectric layer and (2) with the gate dielectric layer 72. The source and the gate of the D-mode AlGaN/GaN HEMT without gate dielectric layer M1 are connected electrically using a fabrication method. In other words, the gate and the source are shorted (Vgs=0V). Then the D-mode AlGaN/GaN HEMT M1 with Vgs=0V acts as the gate protection device for the p-GaN gate E-mode AlGaN/GaN HEMT M2. The drain of M2 and the source of M3 are connected electrically. M3 is a D-mode AlGaN/GaN HEMT (1) without gate dielectric layer or (2) with the gate dielectric layer 72. Besides, the gate of M3 and the source of M2 are connected electrically.

Figures 1, 31A:
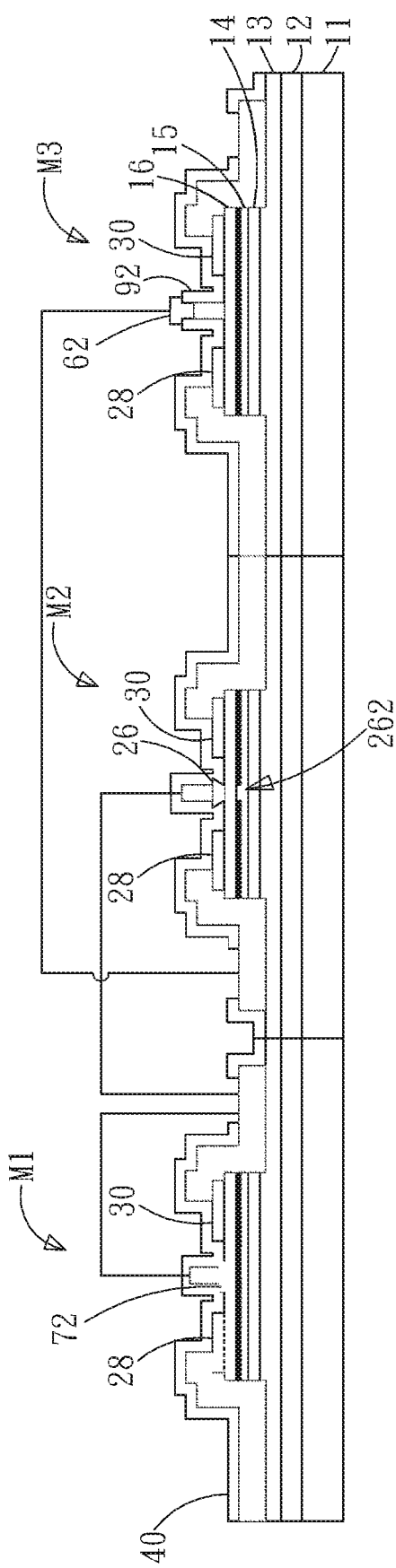
Figures 2, 31A:
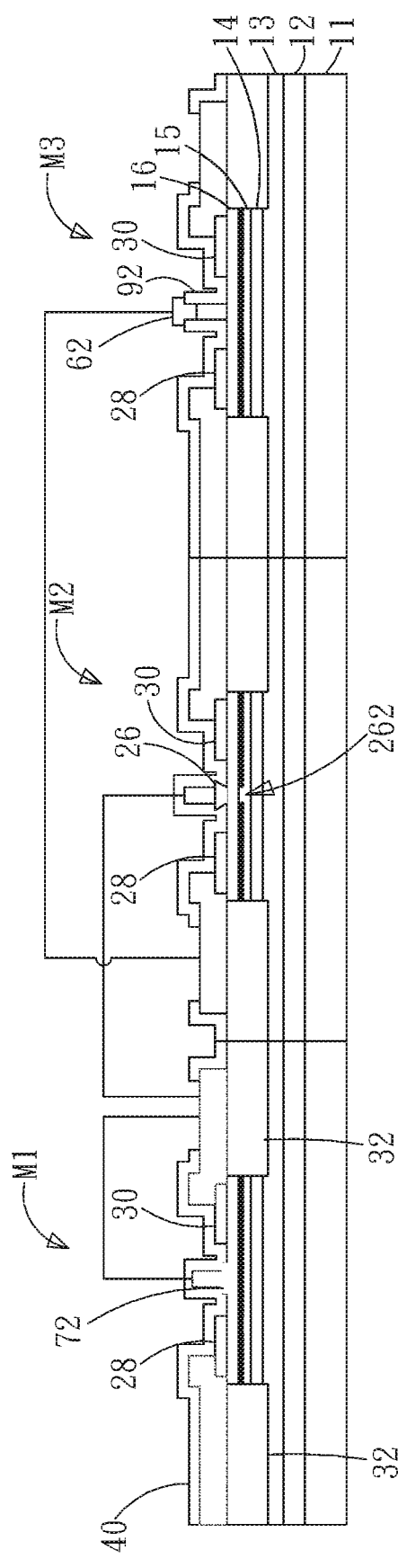
Figure 32:
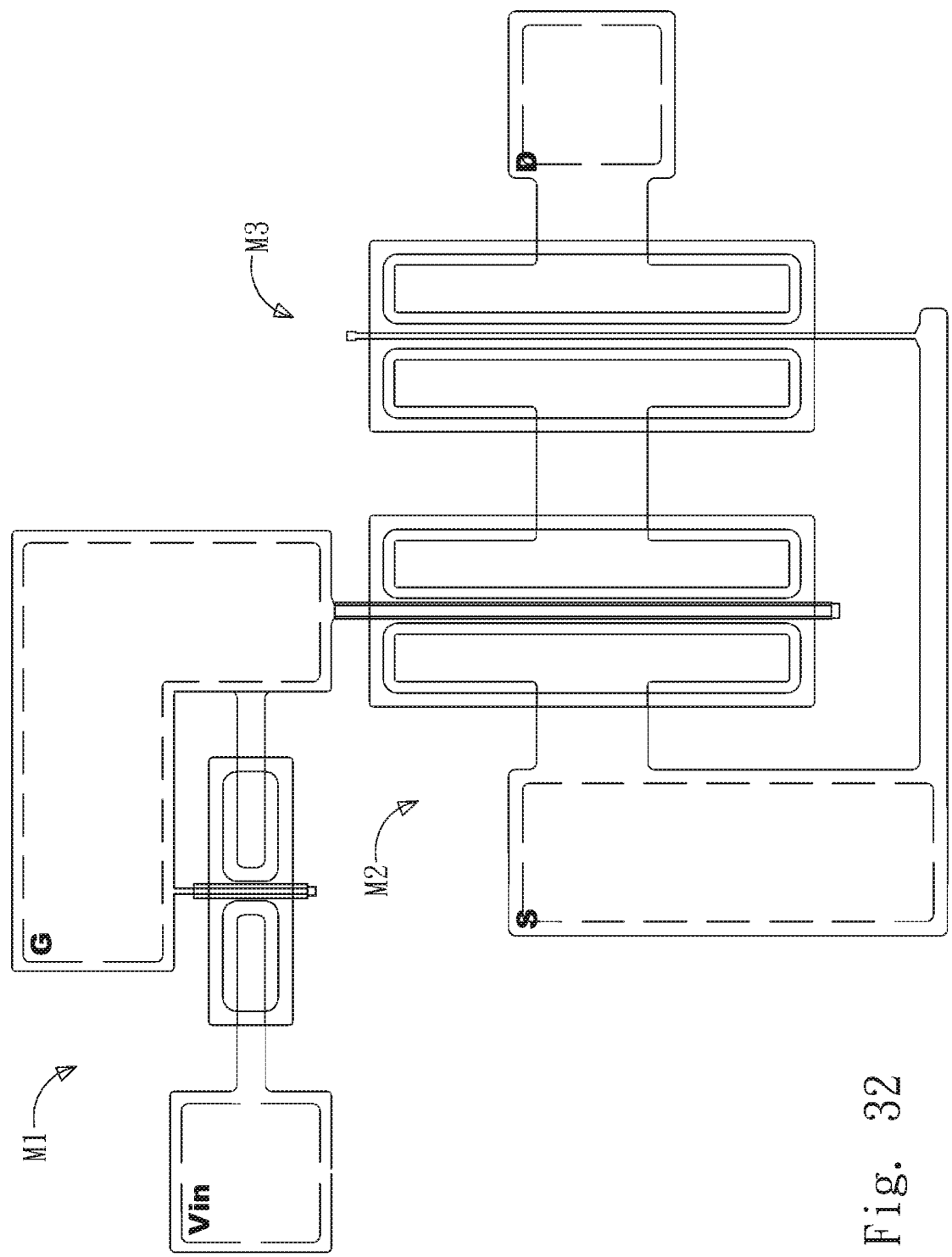
FIG. 32 shows a top view corresponding to FIG. 31A-1 and FIG. 31A-2.

Embodiment 13: As Shown in FIG. 31A-1 and FIG. 31A-2, a Hybrid E-Mode AlGaN/GaN HEMT Formed by the SEG p-GaN Gate E-Mode AlGaN/GaN HEMT Using a D-Mode AlGaN/GaN HEMT with Gate Dielectric Layer as the Gate Protection Device Cascoding to a D-Mode AlGaN/GaN HEMT without Gate Dielectric Layer As shown in FIG. 31A-1 and FIG. 31A-2, the hybrid E-mode AlGaN/GaN HEMT according to Embodiment 13 comprises the epitaxial structure of AlGaN/GaN designed according to the present invention and is divided into a left region, a middle region, and a right region. In the left region, a D-mode AlGaN/GaN HEMT with gate dielectric layer M1 is formed. In the middle region, an SEG p-GaN gate E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/ GaN HEMT without gate dielectric layer M3 is formed.

The process steps as shown in FIG. 20A to FIG. 20F according to Embodiment 13 are identical to those according to Embodiment 7. The only difference is that between the steps of FIG. 20C and FIG. 20D, a step is added for fabricating the gate dielectric layer of the D-mode AlGaN/ GaN HEMT with gate dielectric layer M1 in the left region.

Figures 1, 33A:
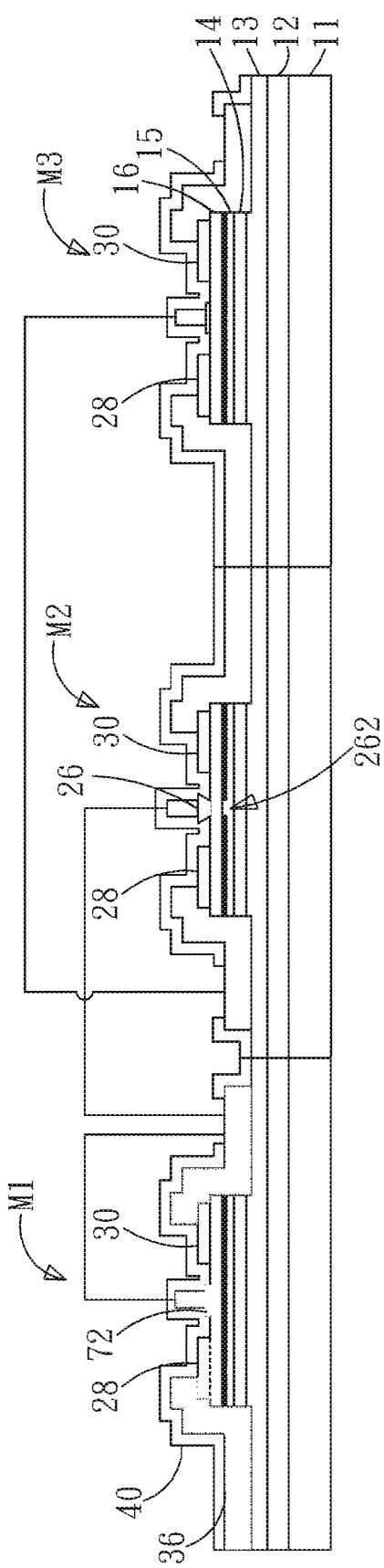
Figures 2, 33A:
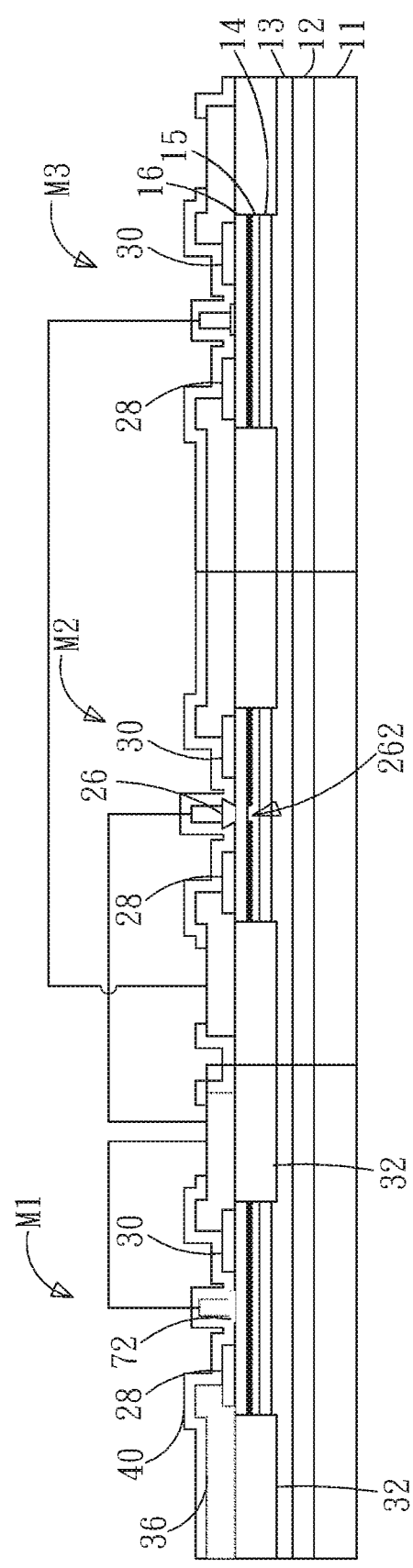
Figure 34:
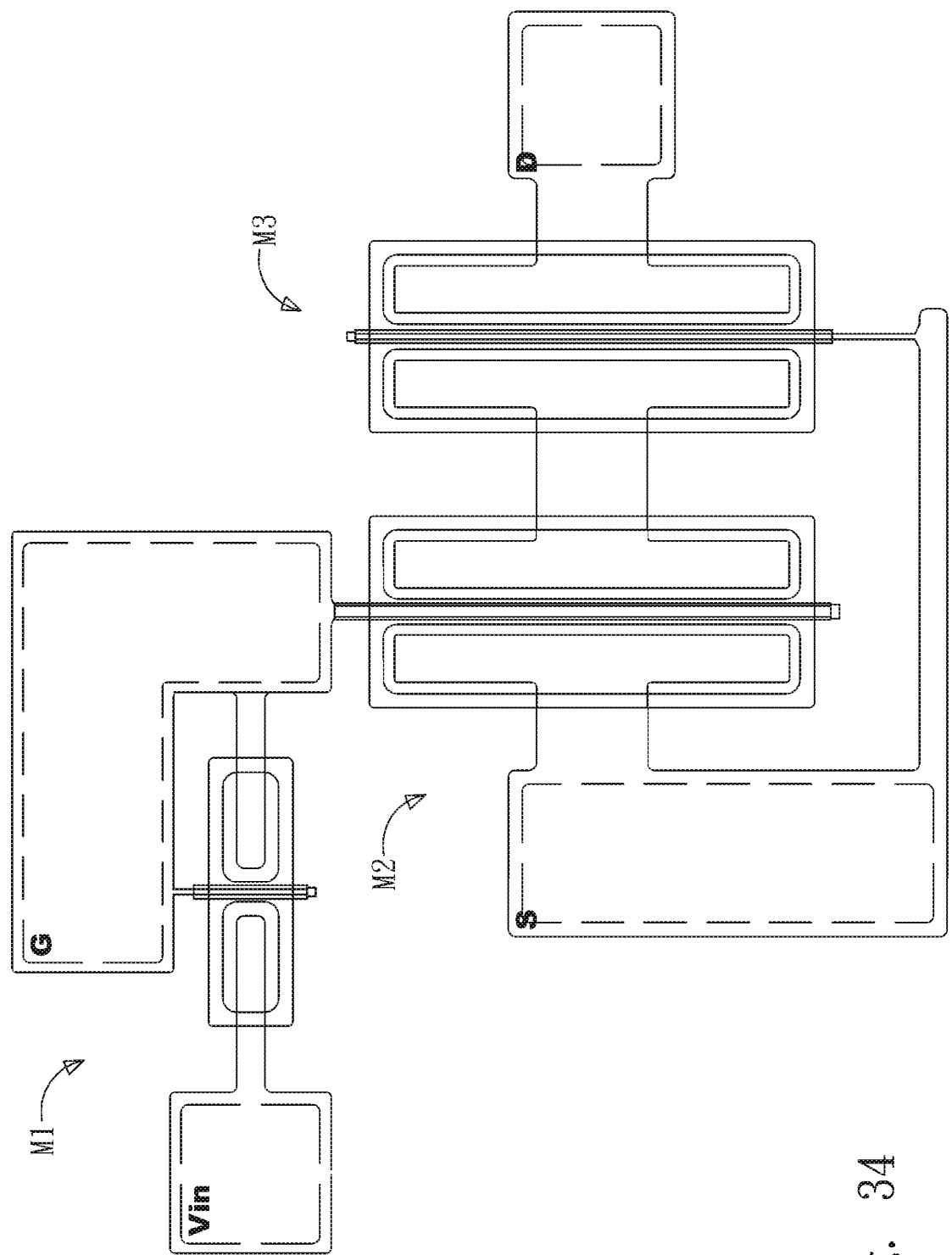
FIG. 34 shows a top view corresponding to FIG. 33A-1 and FIG. 33A-2.

Embodiment 14: As Shown in FIG. 33A-1 and
FIG. 33A-2, a Hybrid E-Mode AlGaN/GaN HEMT
Formed by the SEG p-GaN Gate E-Mode
AlGaN/GaN HEMT Using a D-Mode AlGaN/GaN
HEMT with Gate Dielectric Layer as the Gate
Protection Device Cascoding to a D-Mode
AlGaN/GaN HEMT with Gate Dielectric Layer As shown in FIG. 33A-1 and FIG. 33A-2, the hybrid E-mode AlGaN/GaN HEMT according to Embodiment 14 comprises the epitaxial structure of AlGaN/GaN designed according to the present invention and is divided into a left region, a middle region, and a right region. In the left region, a D-mode AlGaN/GaN HEMT with gate dielectric layer M1 is formed. In the middle region, an SEG p-GaN gate E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT with gate dielectric layer M3 is formed.

The process steps as shown in FIG. 20A to FIG. 20F according to Embodiment 14 are identical to those according to Embodiment 7. The only difference is that between the steps of FIG. 20C and FIG. 20D, a step is added for fabricating the gate dielectric layer of the D-mode AlGaN/GaN HEMT with gate dielectric layer M1 in the left region and the gate dielectric layer of the D-mode AlGaN/GaN HEMT with gate dielectric layer M3 in the right region.

Figures 1, 35A:
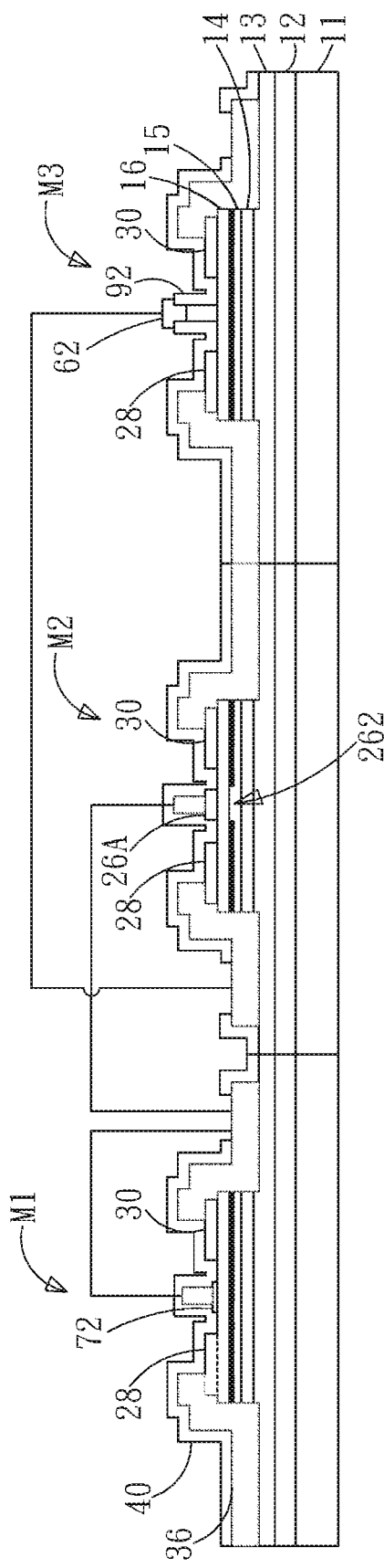
Figures 2, 35A:
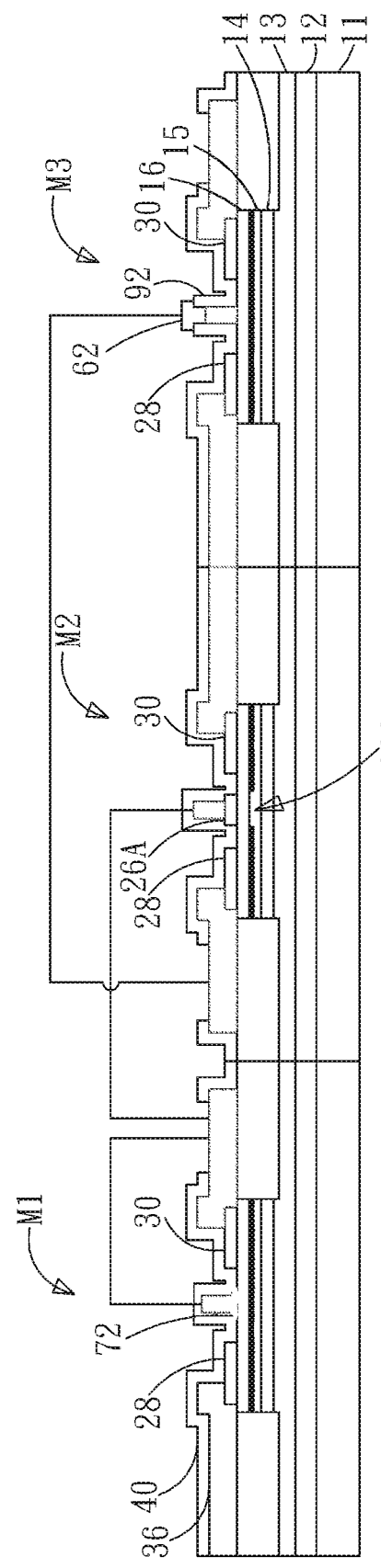
Figure 36:
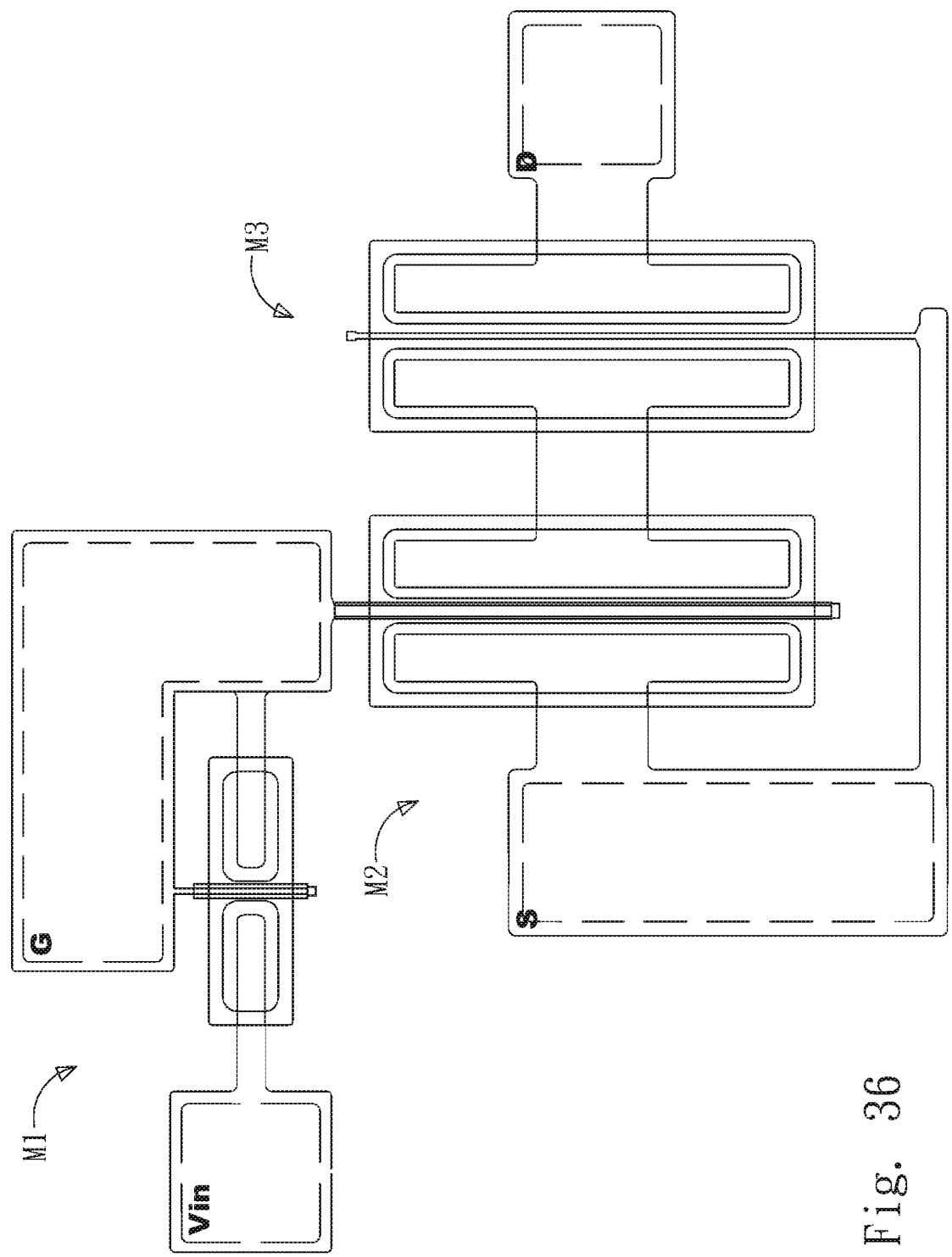
FIG. 36 shows a top view corresponding to FIG. 35A-1 and FIG. 35A-2.

Embodiment 15: As Shown in FIG. 35A-1 and
FIG. 35A-2, a Hybrid E-Mode AlGaN/GaN HEMT
Formed by the Etched p-GaN Gate E-Mode
AlGaN/GaN HEMT Using a D-Mode AlGaN/GaN
HEMT with Gate Dielectric Layer as the Gate
Protection Device Cascoding to a D-Mode
AlGaN/GaN HEMT without Gate Dielectric Layer As shown in FIG. 35A-1 and FIG. 35A-2, the hybrid E-mode AlGaN/GaN HEMT according to Embodiment 15 comprises the epitaxial structure of AlGaN/GaN designed according to the present invention and is divided into a left region, a middle region, and a right region. In the left region, a D-mode AlGaN/GaN HEMT with gate dielectric layer M1 is formed. In the middle region, an SEG p-GaN gate E-mode AlGaN/GaN HEMT M2 is formed. This SEG p-GaN gate E-mode AlGaN/GaN HEMT M2 includes an etched p-GaN gate structure. In addition, although the 2DEG is formed at the junction i-Al$_x$GaN/i-GaN of the i-GaN channel layer 15, due to the existence of the etched p-GaN gate structure, the 2DEG below the etched p-GaN gate structure 26A in the i-GaN channel layer 15 will be depleted, giving a depletion region 262 without 2DEG. In the right region, a D-mode AlGaN/GaN HEMT without gate dielectric layer M3 is formed.

The process steps as shown in FIG. 24A to FIG. 24F according to Embodiment 15 are identical to those according to Embodiment 9. The only difference is that between the steps of FIG. 24C and FIG. 24D, a step is added for fabricating the gate dielectric layer of the D-mode AlGaN/GaN HEMT with gate dielectric layer M1 in the left region.

Figures 1, 37A:
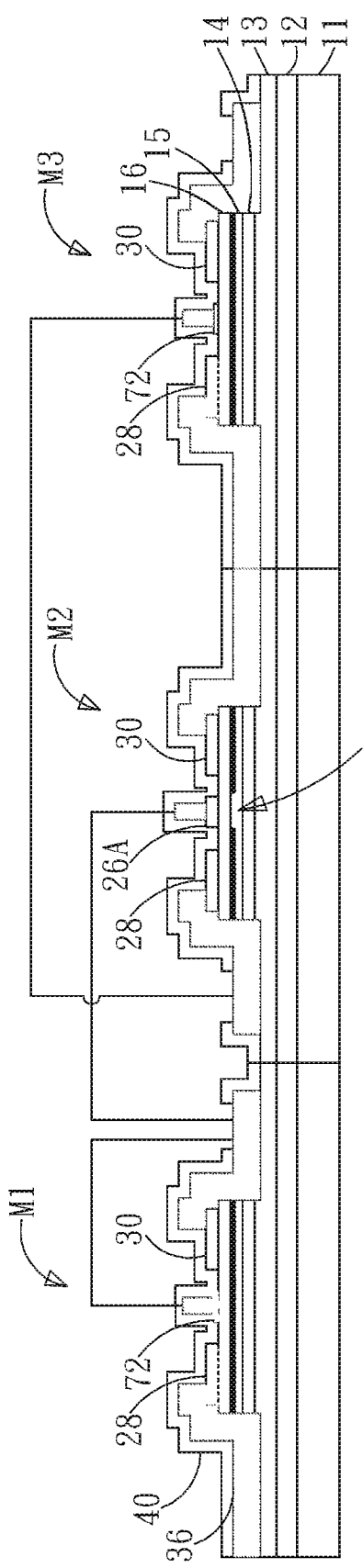
Figures 2, 37A:
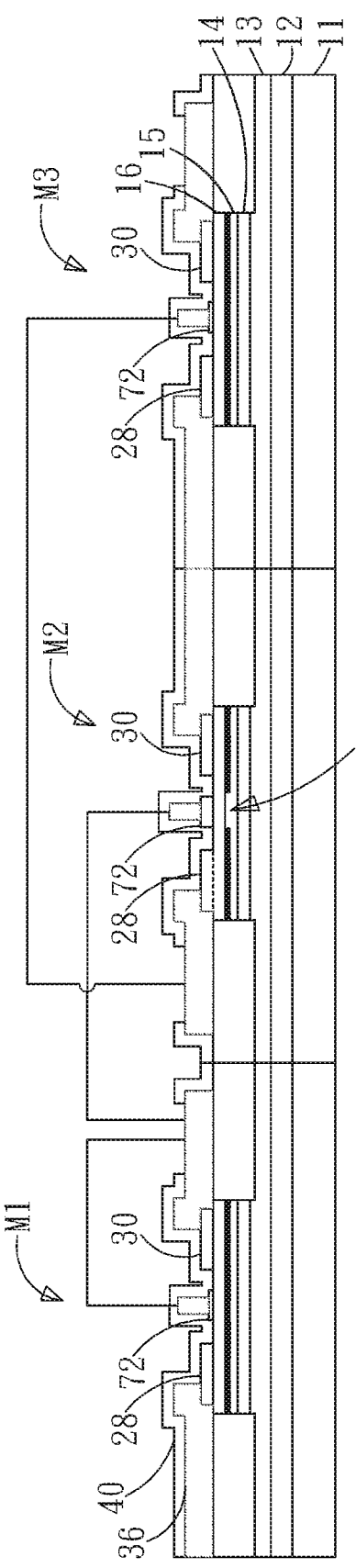
Figure 38:
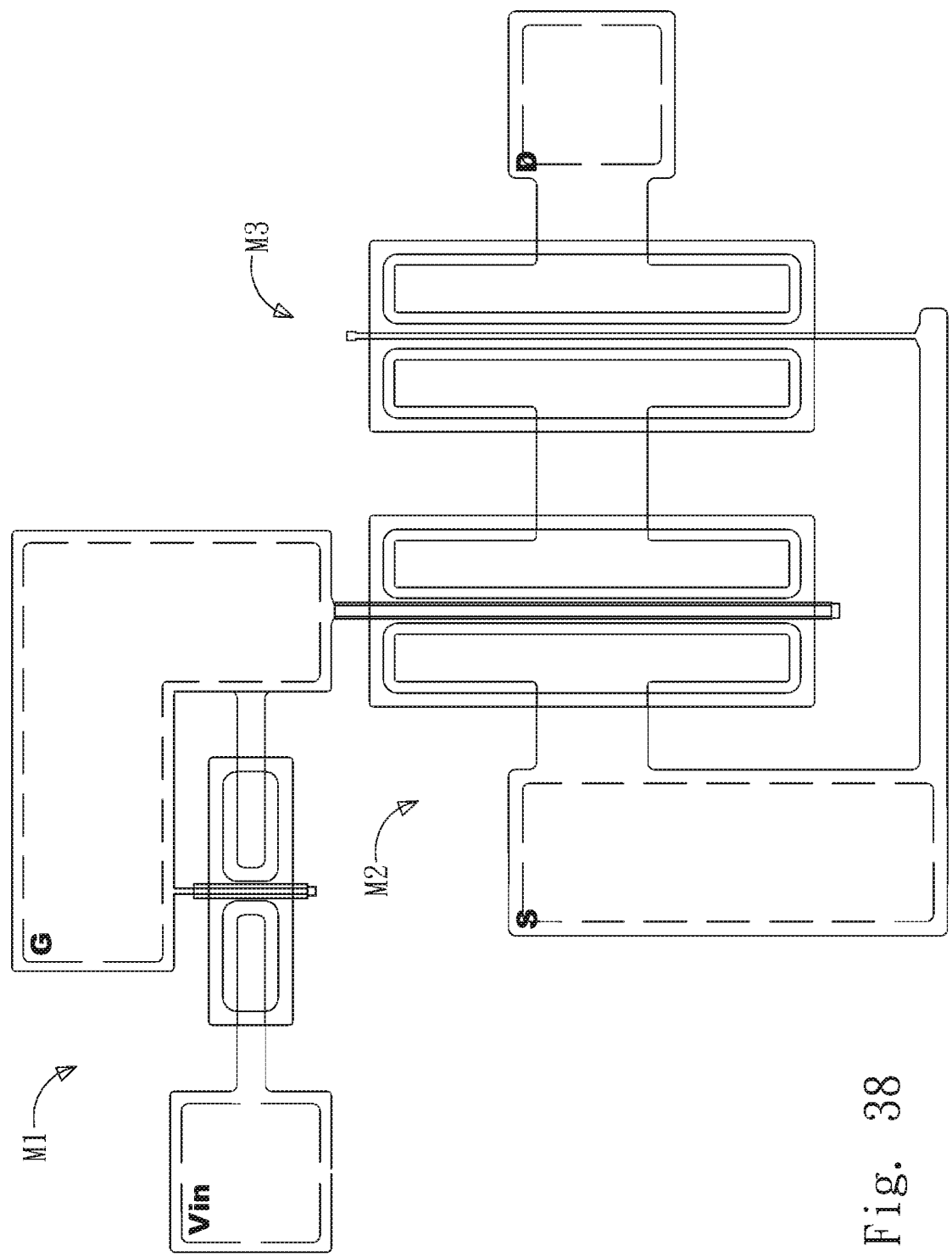
FIG. 38 shows a top view corresponding to FIG. 37A-1 and FIG. 37A-2.

Embodiment 16: As Shown in FIG. 37A-1 and
FIG. 37A-2, a Hybrid E-Mode AlGaN/GaN HEMT
Formed by the Etched p-GaN Gate E-Mode
AlGaN/GaN HEMT Using a D-Mode AlGaN/GaN
HEMT with Gate Dielectric Layer as the Gate
Protection Device Cascoding to a D-Mode
AlGaN/GaN HEMT with Gate Dielectric Layer As shown in FIG. 37A-1 and FIG. 37A-2, the hybrid E-mode AlGaN/GaN HEMT according to Embodiment 16 comprises the epitaxial structure of AlGaN/GaN designed according to the present invention and is divided into a left region, a middle region, and a right region. In the left region, a D-mode AlGaN/GaN HEMT with gate dielectric layer M1 is formed. In the middle region, an SEG p-GaN gate E-mode AlGaN/GaN HEMT M2 is formed. This SEG p-GaN gate E-mode AlGaN/GaN HEMT M2 includes an etched p-GaN gate structure. In addition, although the 2DEG is formed at the junction i-Al$_x$GaN/i-GaN of the i-GaN channel layer 15, due to the existence of the etched p-GaN gate structure, the 2DEG below the etched p-GaN gate structure 26A in the i-GaN channel layer 15 will be depleted, giving a depletion region 262 without 2DEG. In the right region, a D-mode AlGaN/GaN HEMT with gate dielectric layer M3 is formed.

The process steps as shown in FIG. 24A to FIG. 24F according to Embodiment 16 are identical to those according to Embodiment 9. The only difference is that between the steps of FIG. 24C and FIG. 24D, a step is added for fabricating the gate dielectric layer of the D-mode AlGaN/GaN HEMT with gate dielectric layer M1 in the left region and the gate dielectric layer of the D-mode AlGaN/GaN HEMT with gate dielectric layer M3 in the right region.

Figures 1, 39A:
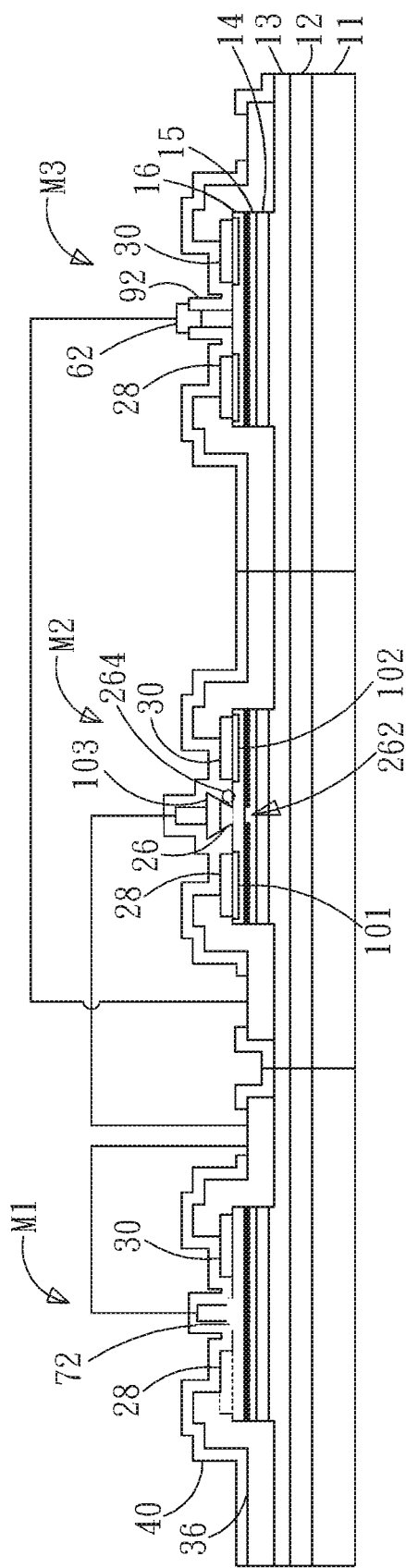
Figures 2, 39A:
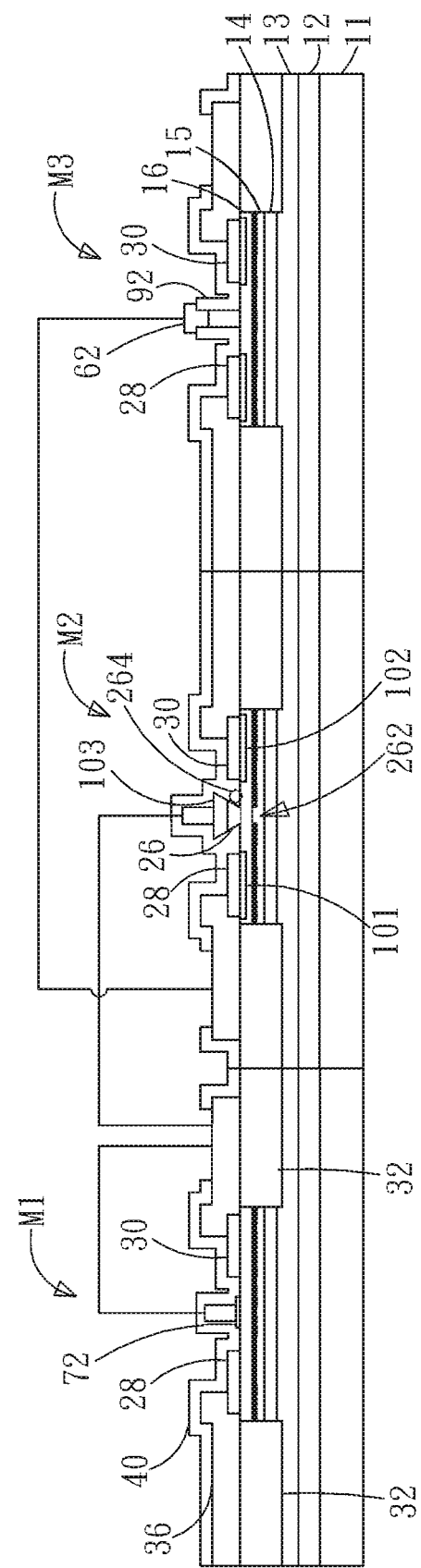
Figure 40:
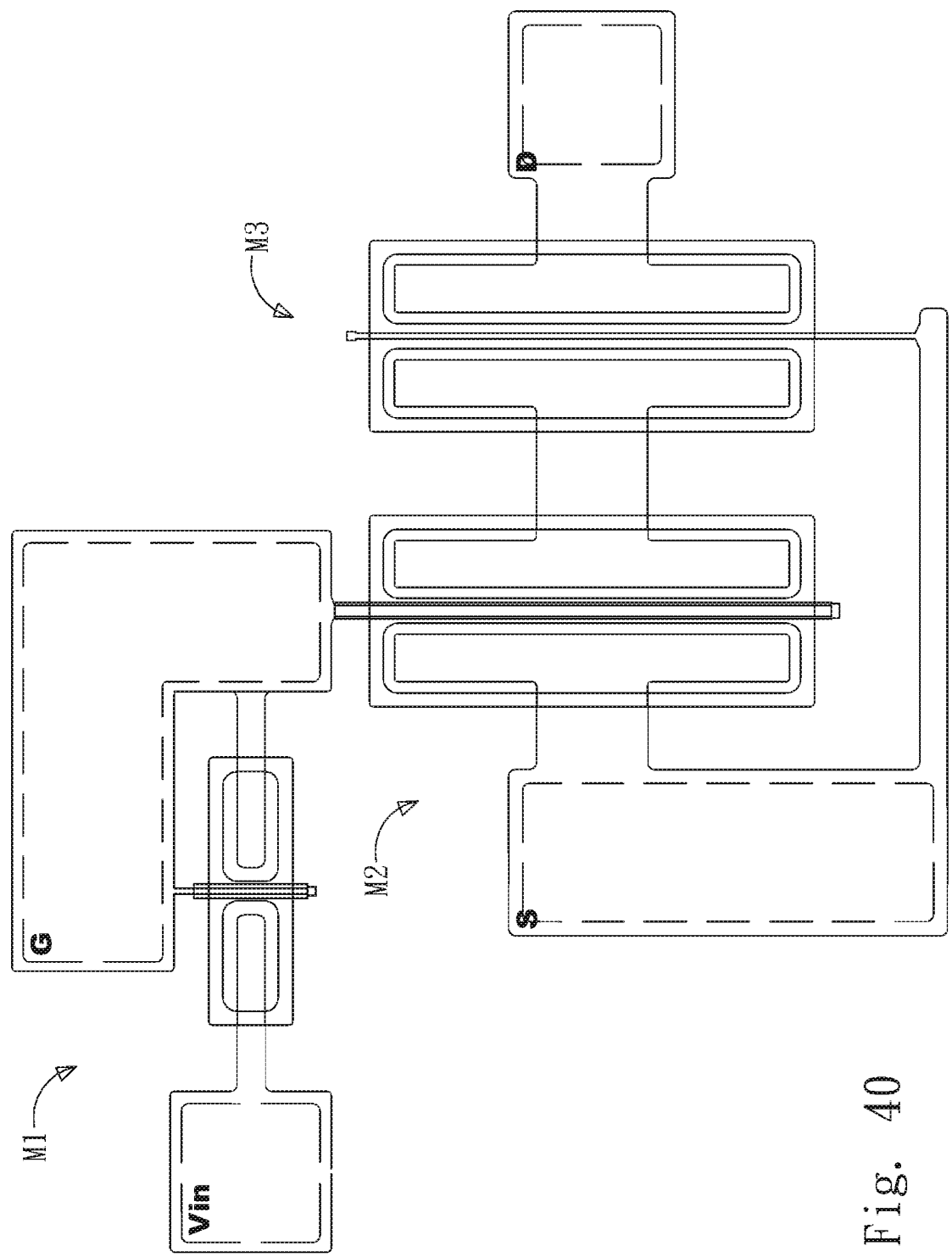
FIG. 40 shows a top view corresponding to FIG. 39A-1 and FIG. 39A-2.
Figure 42:
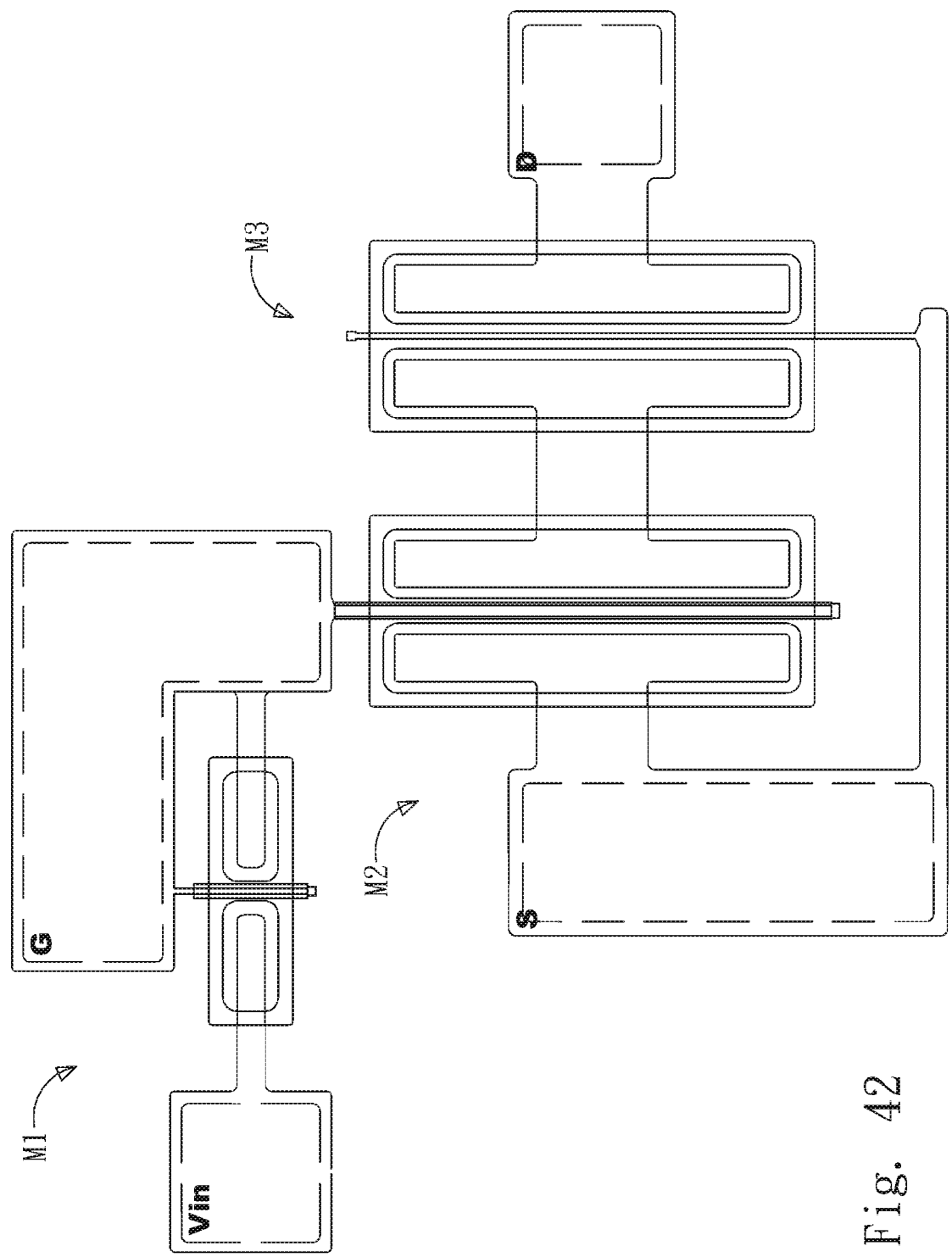
FIG. 42 shows a top view corresponding to FIG. 41A-1 and FIG. 41A-2.

Embodiment 17: As Shown in FIG. 39A-1 and
FIG. 39A-2, a Hybrid E-Mode AlGaN/GaN HEMT
Formed by the SEG p-GaN Gate and Self-Aligned
Gate Metal E-Mode AlGaN/GaN HEMT Using a
D-Mode AlGaN/GaN HEMT with Gate Dielectric
Layer as the Gate Protection Device Cascoding to a
D-Mode AlGaN/GaN HEMT without Gate
Dielectric Layer As shown in FIG. 39A-1 and FIG. 39A-2, the hybrid E-mode AlGaN/GaN HEMT according to Embodiment 17 comprises the epitaxial structure of AlGaN/GaN designed according to the present invention and is divided into a left region, a middle region, and a right region. In the left region, a D-mode AlGaN/GaN HEMT with gate dielectric layer M1 is formed. In the middle region, an SEG p-GaN gate and self-aligned gate metal E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-Al$_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT without gate dielectric layer M3 is formed.

The process steps as shown in FIG. 28A to FIG. 28F according to Embodiment 17 are identical to those according to Embodiment 9. The only difference is that between the steps of FIG. 28C and FIG. 28D, a step is added for fabricating the gate dielectric layer of the D-mode AlGaN/GaN HEMT with gate dielectric layer M1 in the left region.

Embodiment 18: As Shown in FIG. 41A-1 and FIG. 41A-2, a Hybrid E-Mode AlGaN/GaN HEMT Formed by the SEG p-GaN Gate and Self-Aligned Gate Metal E-Mode AlGaN/GaN HEMT Using a D-Mode AlGaN/GaN HEMT with Gate Dielectric Layer as the Gate Protection Device Cascoding to a D-Mode AlGaN/GaN HEMT with Gate Dielectric Layer As shown in FIG. 41A-1 and FIG. 41A-2, the hybrid E-mode AlGaN/GaN HEMT according to Embodiment 18 comprises the epitaxial structure of AlGaN/GaN designed according to the present invention and is divided into a left region, a middle region, and a right region. In the left region, a D-mode AlGaN/GaN HEMT with gate dielectric layer M1 is formed. In the middle region, an SEG p-GaN gate and self-aligned gate metal E-mode AlGaN/GaN HEMT M2 is formed. This SEG p-GaN gate E-mode AlGaN/GaN HEMT M2 includes a p-GaN inverted trapezoidal gate structure 26. In addition, although the 2DEG is formed at the junction i-$Al_x$GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer 15 will be depleted, giving a depletion region 262 without 2DEG. In the right region, a D-mode AlGaN/GaN HEMT with gate dielectric layer M3 is formed.

The process steps as shown in FIG. 28A-1 to FIG. 28F-1 according to Embodiment 18 are identical to those according to Embodiment 9. The only difference is that between the steps of FIGS. 28C-1, 28C-2, 28D-1, and 28D-2, a step is added for fabricating the gate dielectric layer of the D-mode AlGaN/GaN HEMT with gate dielectric layer M1 in the left region and the gate dielectric layer of the D-mode AlGaN/GaN HEMT with gate dielectric layer M3 in the right region.

The invention claimed is:
1. An epitaxial structure of hybrid E-mode AlGaN/GaN HEMT, comprising:
    an epitaxial structure of Ga-face AlGaN/GaN, divided into a first region and a second region;
    a first depletion-mode (D-mode) AlGaN/GaN HEMT, located in said first region; and
    a p-GaN E-mode AlGaN/GaN HEMT, located in said second region, including a p-GaN inverted trapezoidal gate structure, the 2DEG below said p-GaN inverted trapezoidal gate structure being depleted, said p-GaN inverted trapezoidal gate structure connected electrically to a source and a gate of said first D-mode AlGaN/GaN HEMT, a saturation current corresponding to a Vgs of said first D-mode AlGaN/GaN HEMT decided by a gate width of said first D-mode AlGaN/GaN HEMT;
where said epitaxial structure of Ga-face AlGaN/GaN includes:
    a silicon substrate;
    a buffer layer (C-doped), located on the silicon substrate;
    an i-GaN (C-doped) layer, located on the buffer layer (C-doped);
    an i-$Al_y$GaN buffer layer, located on the i-GaN (C-doped) layer;
    an i-GaN channel layer, located on the i-$Al_y$GaN buffer layer, said 2DEG formed in said i-GaN channel layer; and
    an i-$Al_x$GaN layer, located on the i-GaN channel layer, where x=0.1~0.3 and y=0.05~0.75.

2. The epitaxial structure of hybrid E-mode AlGaN/GaN HEMT of claim 1, wherein an i-$Al_z$GaN grading buffer layer is added between said i-GaN (C-doped) layer and said i-$Al_y$GaN buffer layer, where z=0.01~0.75.

3. The epitaxial structure of hybrid E-mode AlGaN/GaN HEMT of claim 1, wherein said first D-mode AlGaN/GaN HEMT further includes a gate dielectric layer disposed below the gate of said first D-mode AlGaN/GaN HEMT.

4. The epitaxial structure of hybrid E-mode AlGaN/GaN HEMT of claim 1, and further comprising a gate metal layer disposed on said p-GaN inverted trapezoidal gate structure.

5. The epitaxial structure of hybrid E-mode AlGaN/GaN HEMT of claim 1, wherein said first D-mode AlGaN/GaN HEMT further includes a gate field-plate dielectric layer.

6. The epitaxial structure of hybrid E-mode AlGaN/GaN HEMT of claim 1, wherein said first D-mode AlGaN/GaN HEMT further includes:
    a first source metal layer and a first drain metal layer, located on said i-$Al_x$GaN layer; and
    a first source ion implantation region and a first drain ion implantation region, located in said i-$Al_x$GaN layer, said first source ion implantation region located below said first source metal layer, and said first drain ion implantation region located below said first drain metal layer.

7. The epitaxial structure of hybrid E-mode AlGaN/GaN HEMT of claim 1, wherein said p-GaN E-mode AlGaN/GaN HEMT further includes:
    a second source metal layer and a second drain metal layer, located on said i-$Al_x$GaN layer; and
    a second source ion implantation region and a second drain ion implantation region, located in said i-$Al_x$GaN layer, said second source ion implantation region located below said second source metal layer, and said second drain ion implantation region located below said second drain metal layer.

8. The epitaxial structure of hybrid E-mode AlGaN/GaN HEMT of claim 1, and further comprising a second D-mode AlGaN/GaN HEMT, located in a third region of said epitaxial structure of Ga-face AlGaN/GaN, a source of said second D-mode AlGaN/GaN HEMT connected electrically to a drain of said p-GaN E-mode AlGaN/GaN HEMT, and a source of said p-GaN E-mode AlGaN/GaN HEMT connected electrically to a gate of said second D-mode AlGaN/GaN HEMT.

9. The epitaxial structure of hybrid E-mode AlGaN/GaN HEMT of claim 8, wherein a gate dielectric layer is further disposed below the gate of said second D-mode AlGaN/GaN HEMT.

10. The epitaxial structure of hybrid E-mode AlGaN/GaN HEMT of claim 8, wherein a gate field-plate dielectric layer is further disposed on the gate of said second D-mode AlGaN/GaN HEMT.

11. The epitaxial structure of hybrid E-mode AlGaN/GaN HEMT of claim 8, wherein said second D-mode AlGaN/GaN HEMT further includes:
    a third source metal layer and a third drain metal layer, located on said i-$Al_x$GaN layer; and
    a third source ion implantation region and a third drain ion implantation region, located in said i-$Al_x$GaN layer, said third source ion implantation region located below said third source metal layer, and said third drain ion implantation region located below said third drain metal layer.

12. An epitaxial structure of hybrid E-mode AlGaN/GaN HEMT, comprising:
- an epitaxial structure of Ga-face AlGaN/GaN, divided into a first region and a second region;
- a first depletion-mode (D-mode) AlGaN/GaN HEMT, located in said first region; and
- a p-GaN E-mode AlGaN/GaN HEMT, located in said second region, including an etched p-GaN gate structure, a 2DEG below said etched p-GaN gate structure being depleted, said etched p-GaN gate structure connected electrically to a source and a gate of said first D-mode AlGaN/GaN HEMT a saturation current corresponding to a Vgs of said first D-mode AlGaN/GaN HEMT decided by a gate width of said first D-mode AlGaN/GaN HEMT;

where said epitaxial structure of Ga-face AlGaN/GaN includes:
- a silicon substrate;
- a buffer layer (C-doped), located on the silicon substrate;
- an i-GaN (C-doped) layer, located on the buffer layer (C-doped);
- an i-Al$_y$GaN buffer layer, located on the i-GaN (C-doped) layer;
- an i-GaN channel layer, located on the i-Al$_y$GaN buffer layer, said 2DEG formed in said i-GaN channel layer; and
- an i-Al$_x$GaN layer, located on the i-GaN channel layer, where x=0.1~0.3 and y=0.05~0.75.

13. The epitaxial structure of hybrid E-mode AlGaN/GaN HEMT of claim 12, wherein an i-Al$_z$GaN grading buffer layer is added between said i-GaN (C-doped) layer and said i-Al$_y$GaN buffer layer, where z=0.01~0.75.

14. The epitaxial structure of hybrid E-mode AlGaN/GaN HEMT of claim 12, wherein said first D-mode AlGaN/GaN HEMT further includes a gate field-plate dielectric layer.

15. The epitaxial structure of hybrid E-mode AlGaN/GaN HEMT of claim 12, wherein said first D-mode AlGaN/GaN HEMT further includes a gate dielectric layer disposed below the gate of said first D-mode AlGaN/GaN HEMT.

16. The epitaxial structure of hybrid E-mode AlGaN/GaN HEMT of claim 12, and further comprising a second D-mode AlGaN/GaN HEMT, located in a third region of said epitaxial structure of Ga-face AlGaN/GaN, a source of said second D-mode AlGaN/GaN HEMT connected electrically to a drain of said p-GaN E-mode AlGaN/GaN HEMT, and a source of said p-GaN E-mode AlGaN/GaN HEMT connected electrically to the gate of said second D-mode AlGaN/GaN HEMT.

17. The epitaxial structure of hybrid E-mode AlGaN/GaN HEMT of claim 16, wherein a gate dielectric layer is further disposed below the gate of said second D-mode AlGaN/GaN HEMT.

18. The epitaxial structure of hybrid E-mode AlGaN/GaN HEMT of claim 16, wherein a gate field-plate dielectric layer is further disposed on the gate of said second D-mode AlGaN/GaN HEMT.

* * * * *